(12) United States Patent
Li

(10) Patent No.: US 7,894,269 B2
(45) Date of Patent: *Feb. 22, 2011

(54) NONVOLATILE MEMORY AND METHOD FOR COMPENSATING DURING PROGRAMMING FOR PERTURBING CHARGES OF NEIGHBORING CELLS

(75) Inventor: Yan Li, Milpitas, CA (US)

(73) Assignee: SanDisk Corporation, Milpitas, CA (US)

( * ) Notice: Subject to any disclaimer, the term of this patent is extended or adjusted under 35 U.S.C. 154(b) by 560 days.

This patent is subject to a terminal disclaimer.

(21) Appl. No.: 11/856,625

(22) Filed: Sep. 17, 2007

(65) Prior Publication Data

US 2008/0019188 A1 Jan. 24, 2008

Related U.S. Application Data

(63) Continuation-in-part of application No. 11/459,001, filed on Jul. 20, 2006.

(51) Int. Cl.
G11C 11/34 (2006.01)
(52) U.S. Cl. .......................... 365/185.22; 365/185.09; 365/185.17
(58) Field of Classification Search ............ 365/185.22, 365/185.11, 185.12, 185.21, 185.09, 185.17, 365/185.23
See application file for complete search history.

(56) References Cited

U.S. PATENT DOCUMENTS

| | | | |
|---|---|---|---|
| 5,386,422 A | 1/1995 | Endoh et al. | |
| 5,513,193 A | 4/1996 | Hashimoto | |
| 5,570,315 A | 10/1996 | Tanaka et al. | |
| 5,774,397 A | 6/1998 | Endoh et al. | |
| 5,867,429 A | 2/1999 | Chen et al. | |
| 5,930,167 A | 7/1999 | Lee et al. | |
| 6,046,935 A | 4/2000 | Takeuchi et al. | |

(Continued)

FOREIGN PATENT DOCUMENTS

WO  WO 2005/096316 A1  10/2005

(Continued)

OTHER PUBLICATIONS

EPO/ISA, "Invitation to Pay Additional Fees," corresponding International Patent Application No. PCT/US2008/075034, mailed on Dec. 8, 2008, 7 pages.

(Continued)

*Primary Examiner*—Richard Elms
*Assistant Examiner*—Hien N Nguyen
(74) *Attorney, Agent, or Firm*—Davis Wright Tremaine LLP

(57) ABSTRACT

Shifts in the apparent charge stored on a charge storing element of a non-volatile memory cell can occur because of the coupling of an electric field based on the charge stored in adjacent charge storing elements. To compensate for this coupling, the programming process for a given memory cell can take into account the target programmed state of one or more adjacent memory cell. The amount of programming is verified after each programming pulse and the standard verify level for the programming cell is dependent on the target state. The verify level is further offset lower dependent on the amount of perturbation from neighboring cells, determinable by their target states. The verify level is preferably virtually offset by biasing adjacent word lines instead of actually offsetting the standard verify level. For soft-programming erased cells, neighboring cells on both adjacent word lines are taken into account.

18 Claims, 32 Drawing Sheets

U.S. PATENT DOCUMENTS

| | | | |
|---|---|---|---|
| 6,061,280 | A | 5/2000 | Aritome |
| 6,222,762 | B1 | 4/2001 | Guterman et al. |
| 6,456,528 | B1 | 9/2002 | Chen |
| 6,522,580 | B2 | 2/2003 | Chen et al. |
| 6,781,877 | B2 | 8/2004 | Cernea et al. |
| 6,859,397 | B2 | 2/2005 | Lutze et al. |
| 6,888,758 | B1 | 5/2005 | Hemink et al. |
| 6,917,545 | B2 | 7/2005 | Gallo et al. |
| 6,922,364 | B2 | 7/2005 | Kojima |
| 7,023,736 | B2 | 4/2006 | Cernea et al. |
| 7,046,568 | B2 | 5/2006 | Cernea |
| 7,120,051 | B2 | 10/2006 | Gorobets et al. |
| 7,173,863 | B2 | 2/2007 | Conley et al. |
| 7,187,585 | B2 | 3/2007 | Li et al. |
| 7,196,928 | B2 | 3/2007 | Chen |
| 7,196,931 | B2 | 3/2007 | Cernea et al. |
| 7,237,074 | B2 | 6/2007 | Guterman et al. |
| 7,280,427 | B2 | 10/2007 | Shin |
| 7,286,398 | B2 | 10/2007 | Yano et al. |
| 7,400,535 | B2 | 7/2008 | Li |
| 7,443,729 | B2 | 10/2008 | Li et al. |
| 7,495,953 | B2 | 2/2009 | Li |
| 7,506,113 | B2 | 3/2009 | Li |
| 7,652,929 | B2 * | 1/2010 | Li ........................ 365/185.24 |
| 2005/0057965 | A1 | 3/2005 | Cernea et al. |
| 2005/0169057 | A1 | 8/2005 | Shibata et al. |
| 2005/0254309 | A1 | 11/2005 | Kwon et al. |
| 2005/0276101 | A1 | 12/2005 | Chen et al. |
| 2005/0286299 | A1 | 12/2005 | Tomita et al. |
| 2006/0140007 | A1 | 6/2006 | Cernea et al. |
| 2006/0158947 | A1 | 7/2006 | Chan |
| 2007/0061502 | A1 | 3/2007 | Lasser et al. |
| 2007/0189073 | A1 | 8/2007 | Aritome et al. |
| 2007/0206426 | A1 | 9/2007 | Mokhlesi |
| 2007/0291556 | A1 | 12/2007 | Kamei |
| 2008/0019185 | A1 | 1/2008 | Li |
| 2008/0019193 | A1 | 1/2008 | Li et al. |
| 2008/0158949 | A1 | 7/2008 | Mui et al. |
| 2008/0180996 | A1 | 7/2008 | Lasser |
| 2008/0181000 | A1 | 7/2008 | Lasser |
| 2009/0073771 | A1 | 3/2009 | Li |

FOREIGN PATENT DOCUMENTS

| | | |
|---|---|---|
| WO | WO 2008/083132 A2 | 7/2008 |
| WO | WO 2008/083132 A3 | 7/2008 |

OTHER PUBLICATIONS

USPTO, "Notice of Allowance and Fee(s) Due," mailed in related U.S. Appl. No. 11/836,157 on Sep. 23, 2009, 48 pages.

Brown et al., "Nonvolatile Semiconductor Memory Technology," IEEE Press, Section 1.2, 1998, pp. 9-25.

Chan et al., "A True Single-Transistor Oxide-Nitride-Oxide EEPROM Device," IEEE Electron Device Letters, vol. EDL-8, No. 3, Mar. 1987, pp. 93-95.

Eitan et al., "NROM: A Novel Localized Trapping, 2-Bit Nonvolatile Memory Cell," IEEE Electron Device Letters, vol. 21, No. 11, Nov. 2000, pp. 543-545.

Nozaki et al., "A 1-Mb EEPROM With MONOS Memory Cell for Semiconductor Disk Application," IEEE Journal of Solid-State Circuits, vol. 26, No. 4, Apr. 1991, pp. 497-501.

USPTO, "Notice of Allowance and Fee(s) Due," mailed in related U.S. Appl. No. 11/836,158 on Oct. 6, 2009, 15 pages.

USPTO, "Notice of Allowance and Fee(s) Due," corresponding in related U.S. Appl. No. 11/856,639 on Aug. 20, 2009, 12 pages.

EPO/ISA, "Notification of Transmittal of the International Search Report and the Written Opinion of the International Searching Authority, or the Declaration," corresponding International Patent Application No. PCT/US2008/075034, mailed on May 15, 2009, 17 pages.

EPO, "Examiner's Substantive Report," corresponding European Patent Application No. 08 831 318.4, mailed on Sep. 28, 2010, 2 pages.

* cited by examiner

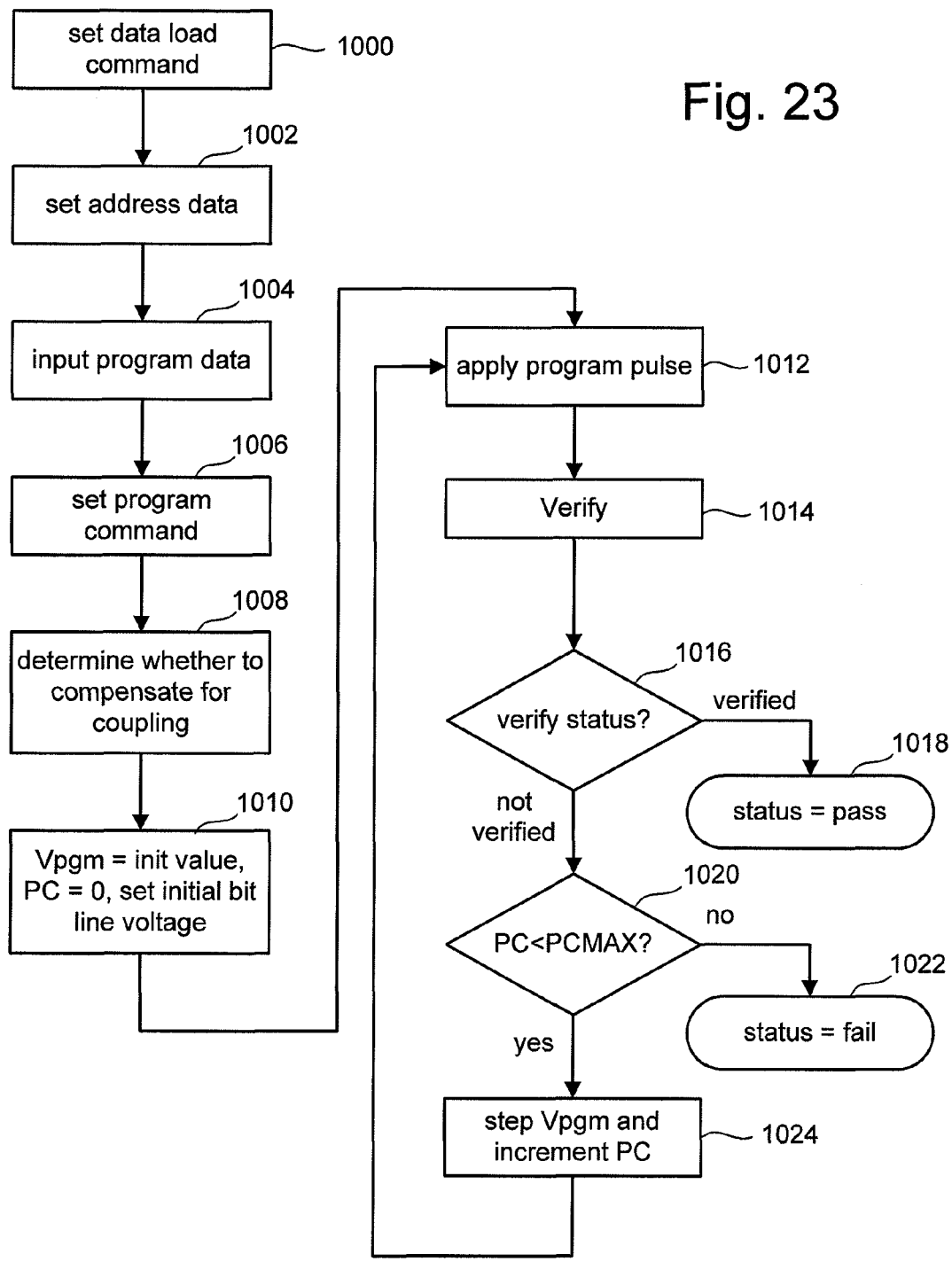

1-Pass Programming with data-dependent verify level

Verify Voltage applied to WLn (1 bit correction)

1-Pass Programming with real offset verify level

Apparent Threshold Levels Shifted Higher

Bias Voltage applied to WLn+1 in the virtual offset verify level scheme (1 bit correction)

1-Pass Programming with data-dependent, virtual verify level

Logical Page Programming Sequence to Minimize WL-WL Yupin Effect

Uncompensated Erase Verify

Soft Program with Double-sided Correction

Soft Programming of Erased Cell with Virtual Verify Level

NONVOLATILE MEMORY AND METHOD FOR COMPENSATING DURING PROGRAMMING FOR PERTURBING CHARGES OF NEIGHBORING CELLS

CROSS-REFERENCE TO RELATED APPLICATIONS

This application is a continuation-in-part of U.S. application Ser. No. 11/459,001 filed on Jul. 20, 2006. This application is also related to the following U.S. patent applications which are incorporated by reference herein in their entirety:

"Non-Volatile Memory And Method For Biasing Adjacent Word Line For Verify During Programming," by Yan Li, U.S. application Ser. No. 11/856,639, filed on Sep. 17, 2007, now U.S. Pat. No. 7,652,929.

"Compensating For Coupling Based On Sensing A Neighbor Using Coupling," by Yan Li and Yupin Fong, U.S. application Ser. No. 11/458,997 filed on Jul. 20, 2006, now U.S. Pat. No. 7,522,454;

"System That Compensates For Coupling Based On Sensing A Neighbor Using Coupling," by Yan Li and Yupin Fong, U.S. application Ser. No. 11/459,000 filed on Jul. 20, 2006, now U.S. Pat. No. 7,443,729;

"System That Compensates For Coupling During Programming," by Yan Li, U.S. application Ser. No. 11/459,002 filed on Jul. 20, 2006, now U.S. Pat. No. 7,400,535;

"Method For Configuring Compensation," by Yan Li, U.S. application Ser. No. 11/458,996 filed on Jul. 20, 2006, now U.S. Pat. No. 7,506,113;

"System For Configuring Compensation," by Yan Li, U.S. application Ser. No. 11/458,995 filed on Jul. 20, 2006, now U.S. Pat. No. 7,495,953.

BACKGROUND OF THE INVENTION

1. Field of the Invention

The present invention relates to technology for non-volatile memory.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self-Boosting Technique For Non-Volatile Memory," and U.S. Pat. No. 6,917,545, titled "Detecting Over Programmed Memory," both of which are incorporated herein by reference in their entirety.

Some EEPROM and flash memory devices have a floating gate that is used to store two ranges of charges and, therefore, the memory cell can be programmed/erased between two states (an erased state and a programmed state). Such a flash memory device is sometimes referred to as a binary flash memory device.

A multi-state flash memory device is implemented by identifying multiple distinct allowed/valid programmed threshold voltage ranges separated by forbidden ranges. Each distinct threshold voltage range corresponds to a predetermined value for the set of data bits encoded in the memory device.

Shifts in the apparent charge stored on a floating gate can occur because of the coupling of an electric field based on the charge stored in adjacent floating gates. This floating gate to floating gate coupling phenomena is described in U.S. Pat. No. 5,867,429, which is incorporated herein by reference in its entirety. One example of an adjacent floating gate to a target floating gate includes a floating gate that is connected to the same word line and connected to an adjacent bit line.

The effect of the floating gate to floating gate coupling is of greater concern for multi-state devices because in multi-state devices the allowed threshold voltage ranges and the forbidden ranges are narrower than in binary devices. Therefore, the floating gate to floating gate coupling can result in memory cells being shifted from an allowed threshold voltage range to a forbidden range.

The floating gate to floating gate coupling can occur between sets of adjacent memory cells that have been programmed at different times. For example, a first memory cell is programmed to add a level of charge to its floating gate that corresponds to one set of data. Subsequently, one or more adjacent memory cells are programmed to add a level of charge to their floating gates that correspond to a second set of data. After the one or more of the adjacent memory cells are programmed, the charge level read from the first memory cell appears to be different than programmed because of the effect of the charge on the adjacent memory cells being coupled to the first memory cell. The coupling from adjacent memory cells can shift the apparent charge level being read a sufficient amount to lead to an erroneous reading of the data stored.

The floating gate to floating gate coupling can also occur between sets of adjacent memory cells that have been programmed concurrently. For example, two adjacent multi-state memory cells may be programmed to different target levels such that a first memory cell is programmed to a state corresponding to a lower threshold voltage and a second memory cell is programmed to a state corresponding to a higher threshold voltage. The memory cell being programmed to the state corresponding to the lower threshold voltage is likely to reach that state and be locked out from further programming before the second memory cell reaches the state corresponding to the higher threshold voltage. After the second memory cell reaches the state corresponding to the higher threshold voltage, it will couple to the first memory cell and cause the first memory cell to have a higher apparent threshold voltage than programmed.

As memory cells continue to shrink in size, the natural programming and erase distributions of threshold voltages are expected to increase due to short channel effects, greater oxide thickness/coupling ratio variations and more channel dopant fluctuations, thereby reducing the available separation between adjacent states. This effect is much more significant for multi-state memories than memories using only two states (binary memories). Furthermore, the reduction of the space between word lines and of the space between bit lines will also increase the coupling between adjacent floating gates.

Thus, there is a need to reduce the effects of coupling between adjacent floating gates.

SUMMARY OF THE INVENTION

Verify Level Dependent On Both the Target Memory State and the Predetermined States of the Neighboring Cells According to a general aspect of the invention, perturbations due to charges on neighboring memory cells (Yupin Effect) are compensated for during programming of a cell to a given target state by adjusting the verify level accordingly so that the correct target state will be read from the cell in spite of the perturbing charges that are subsequently programmed into neighboring memory cells.

This is accomplished by predetermining the memory states of the neighboring memory cells and adjusting the verify level as a function of the target state of the memory cell being programmed and the memory states of the neighboring memory cells. The scheme also has the advantage that programming will be completed in a single pass.

Predetermined Offset Verify Level Applied to the Current Word Line WLn

In one embodiment, the verifying is performed by sensing with a predetermined offset verify voltage level applied to the word line associated with the memory cell to be program-verified. For example, referring to FIG. 33, if the memory cell 1460 is being program-verified, the predetermined verify voltage level is applied to WLn.

By adjusting the verify level as a function of the target state and the predetermined target memory states of the neighboring memory cells during programming, Yupin effect due to existing or anticipated charges on neighboring cells is compensated for essentially in one programming pass. In practice, the programming may preferably employ more than one phase (e.g., coarse/fine phases) to increase performance, but there is no need to perform two separate passes at completely different times in order to mitigate the Yupin effect. Single-pass programming will allow for maximum programming performance and simpler programming sequence from word line to word line.

Virtual Offset of Verify Level by Biasing Adjacent Word Line

According to another aspect of the invention, the adjusting of the verify level is effected virtually by biasing an adjacent word line accordingly so that when program-verified with the adjusted verify level, the correct target state will be read from the cell in spite of the perturbing charges that are subsequently programmed into neighboring memory cells. This has the advantage of avoiding using a real offset on the verify level of the cell being programmed, thereby avoiding the problem of possibly having the verify level shifted too low to require negative voltage sensing when verifying the lowest memory state.

Compensating for Perturbation Due to Charges in Neighboring Cells for Erased Memory State According to another aspect of the invention, erased memory cells are preferably "soft-programmed" after they have been erased. The "soft programmed" refers to programming the erased cells to a predetermined range of threshold levels relative to a predetermined threshold for demarcating between erased and programmed states. This is accomplished by alternately programming and verifying the erased cells relative to the predetermined threshold. Perturbations due to charges on neighboring memory cells are compensated for during the soft programming by adjusting the verify level accordingly so that the correct erased state will be read from the cell in spite of the perturbing charges that are subsequently programmed into neighboring memory cells.

This is accomplished by predetermining the memory states of the neighboring memory cells, including those on adjacent word lines on both sides of the word line of the cell being programmed, and adjusting the verify level by reducing the demarcation level with an offset, the offset being a function of the memory states of the neighboring memory cells.

In a preferred embodiment, the offset to the verify level is implemented virtually by biasing of one or more of the adjacent word lines. This is particularly advantageous for verifying erased states since the already low verify voltage level need not be actually offset even lower.

BRIEF DESCRIPTION OF THE DRAWINGS

FIG. 23 is a flow chart describing one embodiment of a programming process.

DETAILED DESCRIPTION

Figure 1:
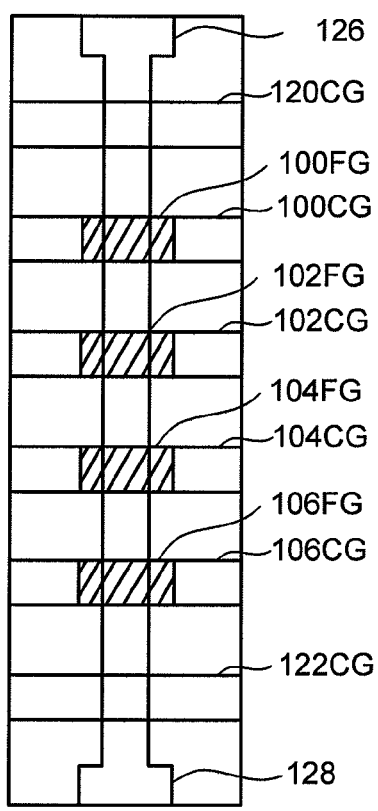
FIG. 1 is a top view of a NAND string.
Figure 2:
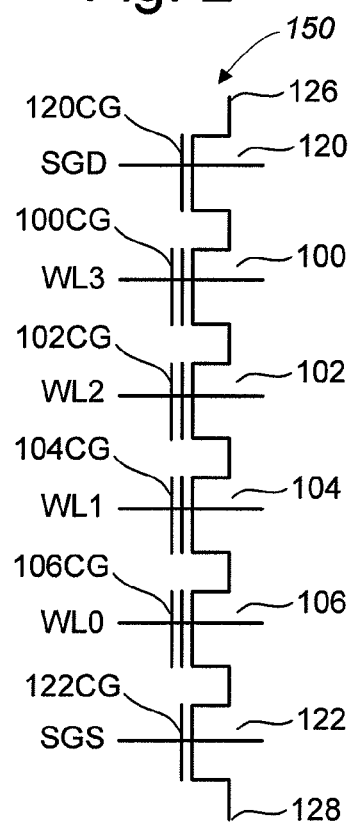
FIG. 2 is an equivalent circuit diagram of the NAND string.

One example of a memory system suitable for implementing the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted in FIGS. 1 and 2. Select gate 120 is connected to select line SGD. Select gate 122 is connected to select line SGS.

Figure 3:
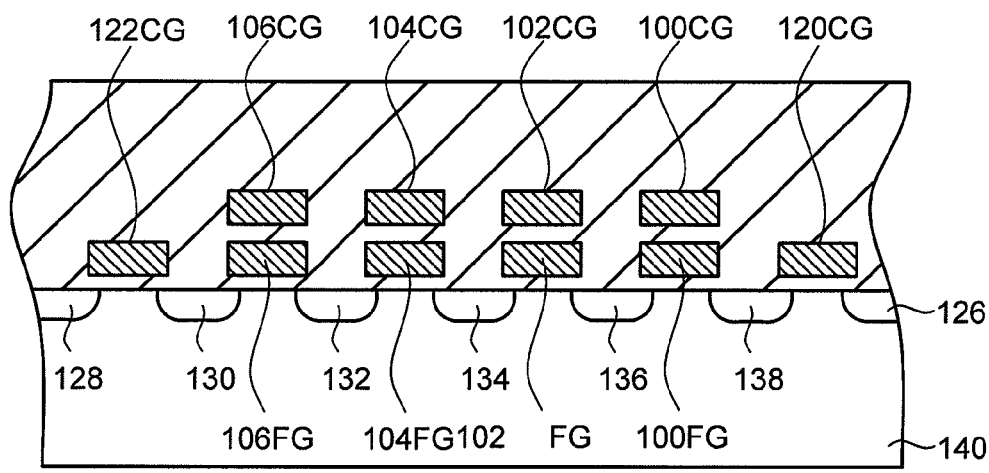
FIG. 3 is a cross-sectional view of the NAND string.

FIG. 3 provides a cross-sectional view of the NAND string described above. As depicted in FIG. 3, the transistors of the NAND string are formed in p-well region 140. Each transistor includes a stacked gate structure that consists of a control gate (100CG, 102CG, 104CG and 106CG) and a floating gate (100FG, 102FG, 104FG and 106FG). The control gates and the floating gates are typically formed by depositing polysilicon layers. The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped diffusion regions 130, 132, 134, 136 and 138 are shared between neighboring cells, through which the cells are connected to one another in series to form a NAND string. These N+ doped regions form the source and drain of each of the cells. For example, N+ doped region 130 serves as the drain of transistor 122 and the source for transistor 106, N+ doped region 132 serves as the drain for transistor 106 and the source for transistor 104, N+ doped region 134 serves as the drain for transistor 104 and the source for transistor 102, N+ doped region 136 serves as the drain for transistor 102 and the source for transistor 100, and N+ doped region 138 serves as the drain for transistor 100 and the source for transistor 120. N+ doped region 126 connects to the bit line for the NAND string, while N+ doped region 128 connects to a common source line for multiple NAND strings.

Note that although FIGS. 1-3 show four memory cells in the NAND string, the use of four transistors is provided only as an example. A NAND string used with the technology described herein can have less than four memory cells or more than four memory cells. For example, some NAND strings will include 8 memory cells, 16 memory cells, 32 memory cells, 64 memory cells, etc. The discussion herein is not limited to any particular number of memory cells in a NAND string.

Each memory cell can store data represented in analog or digital form. When storing one bit of digital data, the range of possible threshold voltages of the memory cell is divided into two ranges, which are assigned logical data "1" and "0." In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored. A memory cell storing one bit of digital data is referred to as a binary memory cell.

A memory cell can also store multiple bits of digital data. Such a memory cell is referred to as a multi-state memory cell. The threshold voltage window for a multi-state memory cell is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00."

Relevant examples of NAND-type flash memories and their operation are provided in the following U.S. Patents/Patent Applications, all of which are incorporated herein by reference in their entirety: U.S. Pat. Nos. 5,570,315; 5,774,397; 6,046,935; 5,386,422; 6,456,528; and U.S. patent application Ser. No. 09/893,277 (Publication No. US2003/0002348). Other types of non-volatile memory in addition to NAND flash memory can also be used with the present invention.

Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. The memory cells described in this paragraph can also be used with the present invention. Thus, the technology described herein also applies to coupling between dielectric regions of different memory cells.

Another approach to storing two bits in each cell has been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. The memory cells described in this paragraph can also be used with the present invention.

Figure 4:
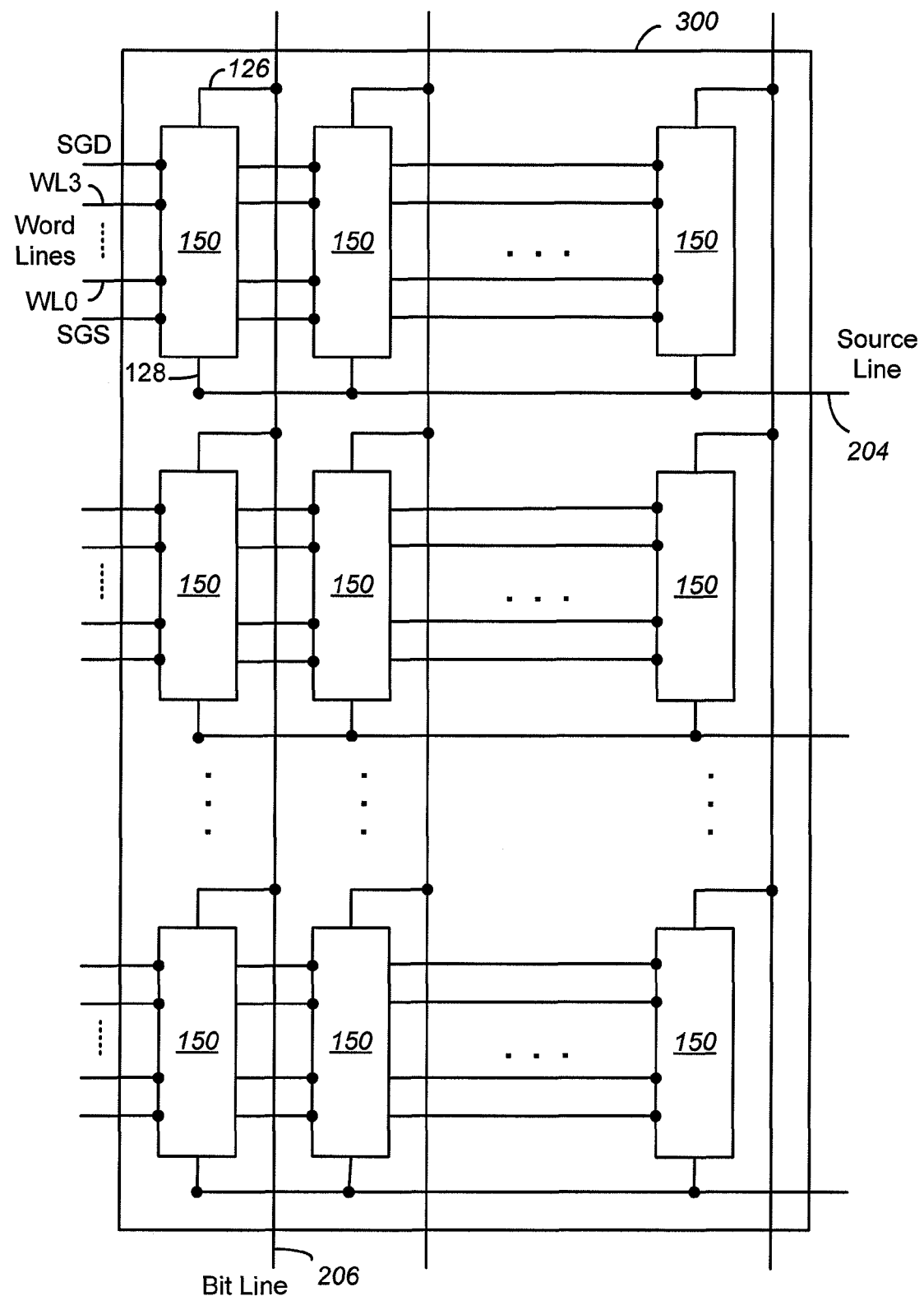
FIG. 4 is a block diagram of a portion of an array of NAND flash memory cells.

FIG. 4 illustrates an example of an array of NAND cells, such as those shown in FIGS. 1-3. Along each column, a bit line 206 is coupled to the drain terminal 126 of the drain select gate for the NAND string 150. Along each row of NAND strings, a source line 204 may connect all the source terminals 128 of the source select gates of the NAND strings. An example of a NAND architecture array and its operation as part of a memory system is found in U.S. Pat. Nos. 5,570,315; 5,774,397; and 6,046,935.

The array of memory cells is divided into a large number of blocks of memory cells. As is common for flash EEPROM systems, the block is the unit of erase. That is, each block contains the minimum number of memory cells that are erased together. Each block is typically divided into a number of pages. A page is a unit of programming. In one embodiment, the individual pages may be divided into segments and the segments may contain the fewest number of cells that are written at one time as a basic programming operation. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages.

Figure 5:
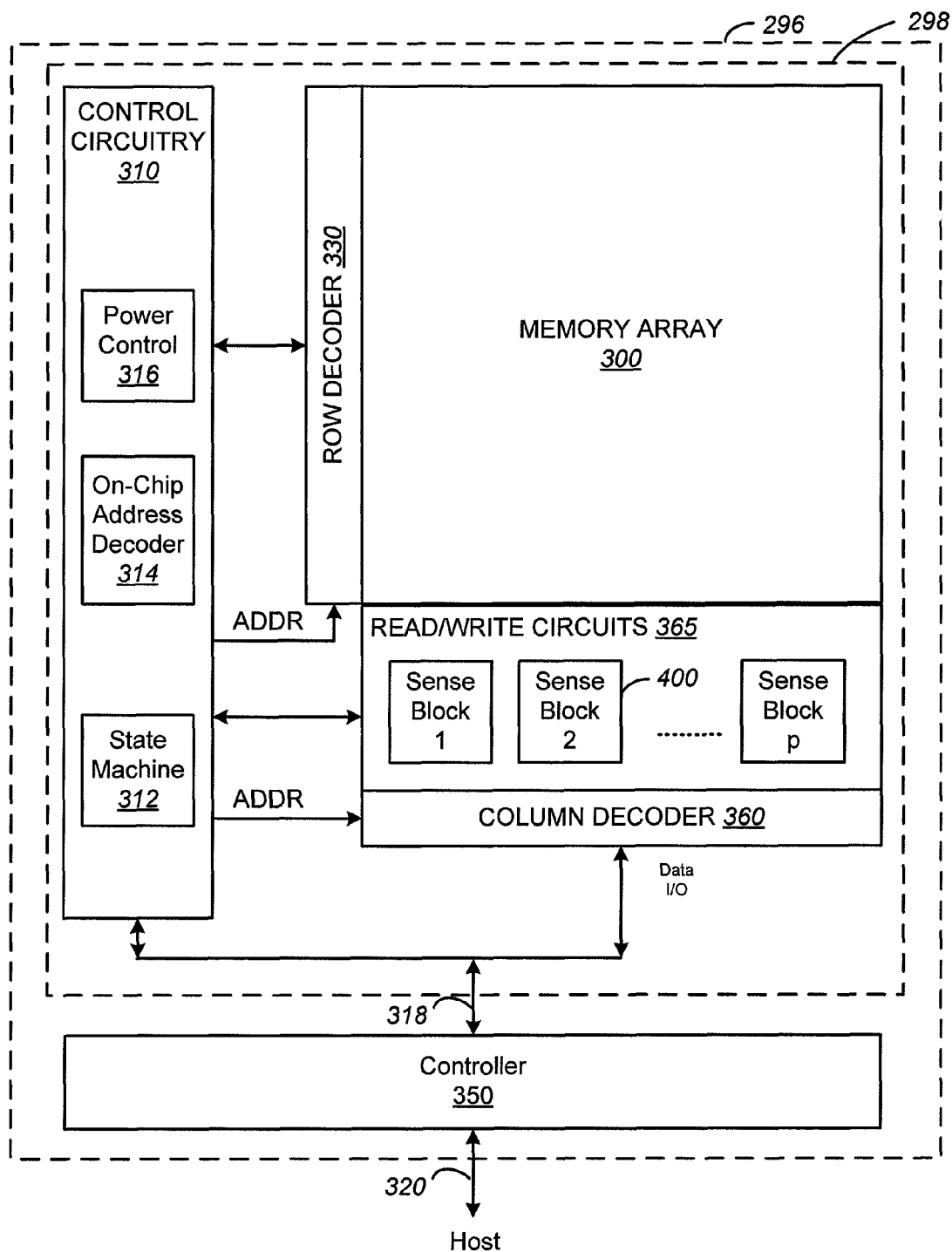
FIG. 5 is a block diagram of a non-volatile memory system.

FIG. 5 illustrates a memory device 296 having read/write circuits for reading and programming a page of memory cells in parallel, according to one embodiment of the present invention. Memory device 296 may include one or more memory die 298. Memory die 298 includes a two-dimensional array of memory cells 300, control circuitry 310, and read/write circuits 365. In some embodiments, the array of memory cells can be three dimensional. The memory cell is controlled and accessed by various control lines, such as bit lines, word lines, source lines, and other lines used to control the memory array. For example, the memory array 300 is addressable by word lines via a row decoder 330 and by bit lines via a column decoder 360. The read/write circuits 365 include multiple sense blocks 400 and allow a page of memory cells to be read or programmed in parallel. Typically a controller 350 is included in the same memory device 296 (e.g., a removable storage card) as the one or more memory die 298. Commands and Data are transferred between the host and controller 350 via lines 320 and between the controller and the one or more memory die 298 via lines 318.

The control circuitry 310 cooperates with the read/write circuits 365 to perform memory operations on the memory array 300. The control circuitry 310 includes a state machine 312, an on-chip address decoder 314 and a power control module 316. The state machine 312 provides chip-level control of memory operations. The on-chip address decoder 314 provides an address interface between that used by the host or a memory controller to the hardware address used by the decoders 330 and 360. The power control module 316 controls the power and voltages supplied to the word lines and bit lines during memory operations.

In some implementations, some of the components of FIG. 5 can be combined. In various designs, one or more of the components of FIG. 5 (alone or in combination), other than memory cell array 300, can be thought of as a managing circuit. For example, a managing circuit may include any one of or a combination of control circuitry 310, state machine 312, decoders 314/360, power control 316, sense blocks 400, read/write circuits 365, controller 350, etc.

Figure 6:
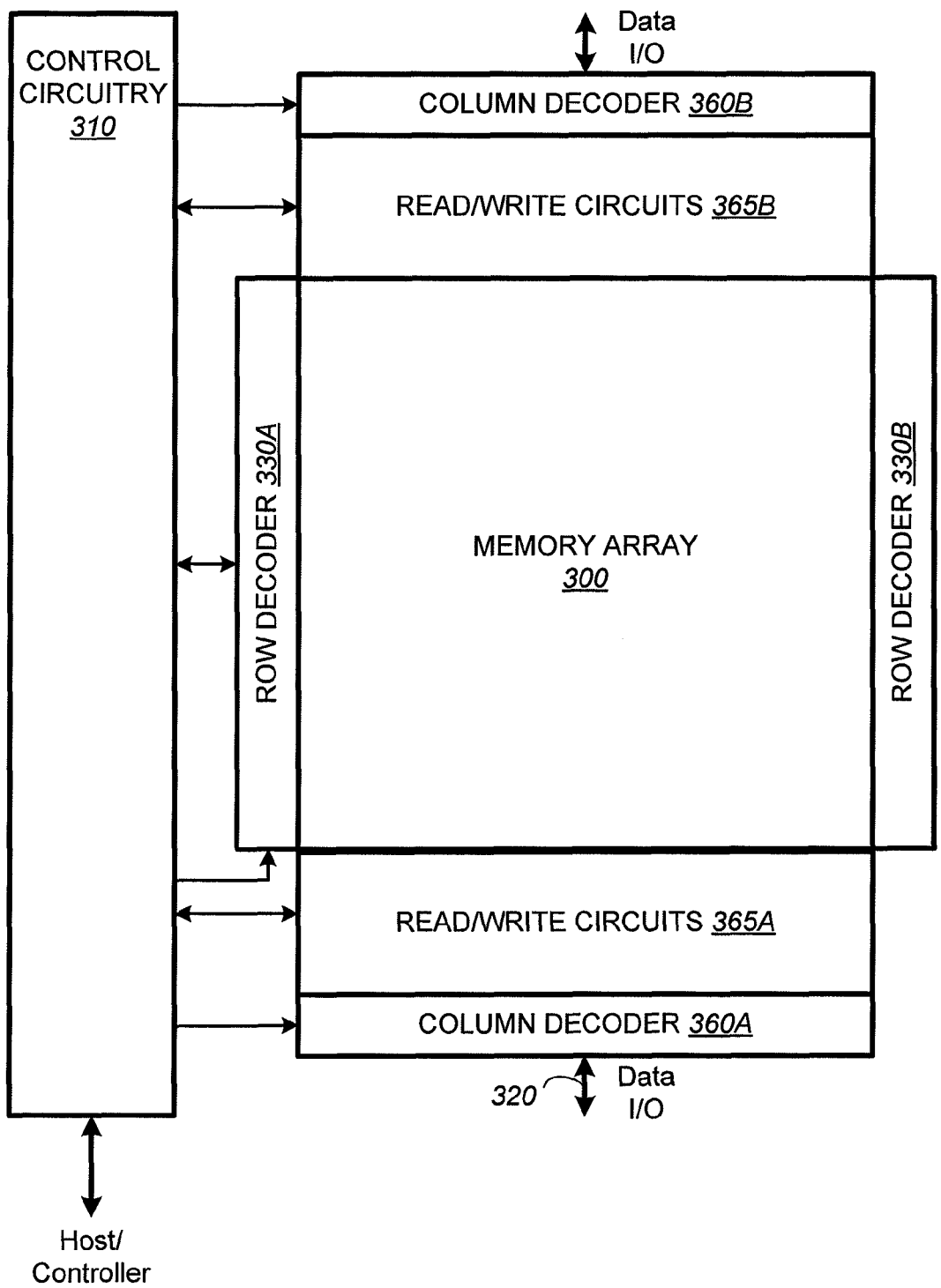
FIG. 6 is a block diagram of a non-volatile memory system.

FIG. 6 illustrates another arrangement of the memory device 296 shown in FIG. 5. Access to the memory array 300 by the various peripheral circuits is implemented in a symmetric fashion, on opposite sides of the array, so that the densities of access lines and circuitry on each side are reduced by half. Thus, the row decoder is split into row decoders 330A and 330B and the column decoder into column decoders 360A and 360B. Similarly, the read/write circuits are split into read/write circuits 365A connecting to bit lines from the bottom and read/write circuits 365B connecting to bit lines from the top of the array 300. In this way, the density of the read/write modules is essentially reduced by one half. The device of FIG. 6 can also include a controller, as described above for the device of FIG. 5.

Figure 7:
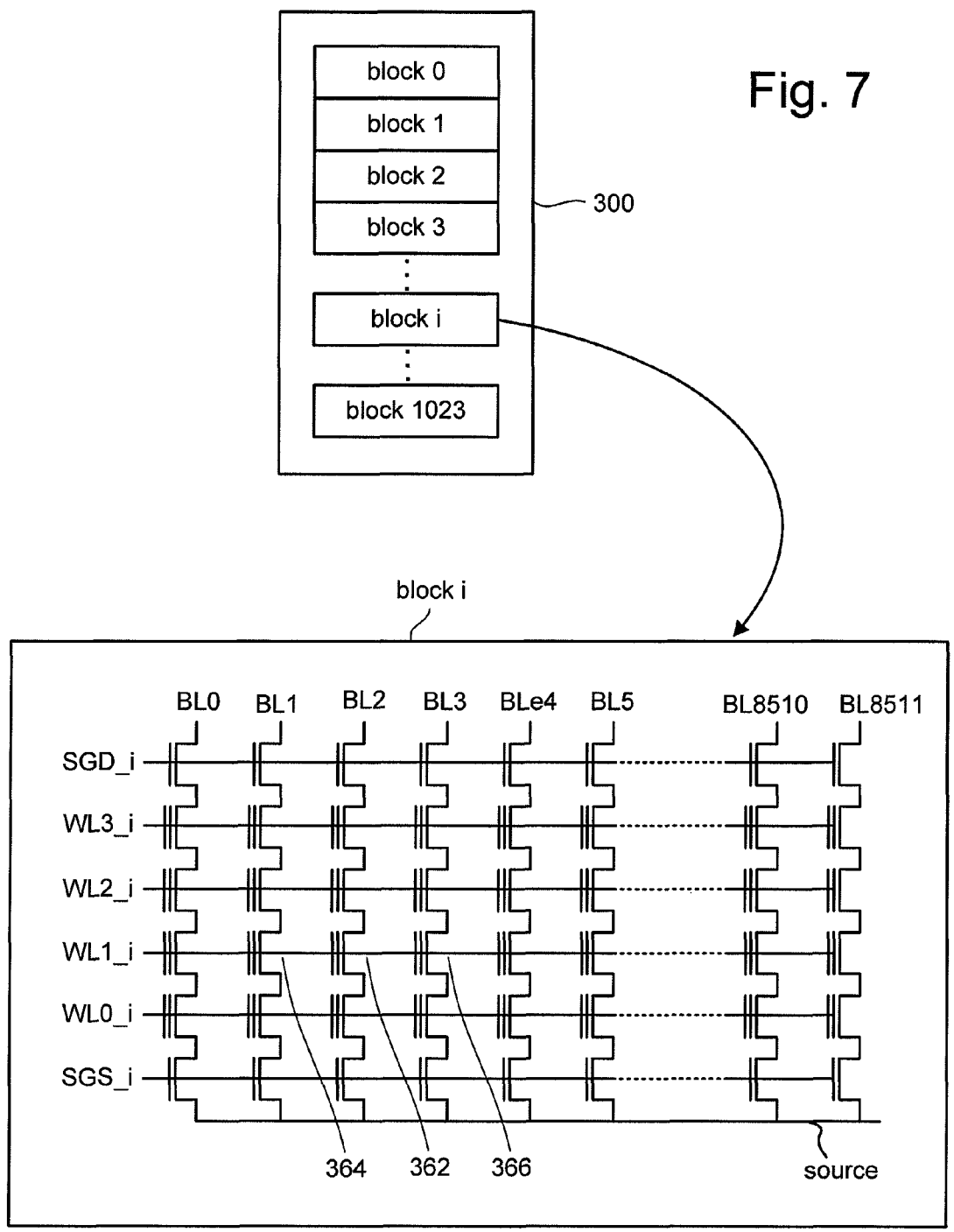
FIG. 7 is a block diagram of a memory array.

With reference to FIG. 7 depicts an exemplary structure of memory cell array 300 is described. As one example, a NAND flash EEPROM is described that is partitioned into 1,024 blocks. The data stored in each block can be simultaneously erased. In one embodiment, the block is the minimum unit of memory cells that are simultaneously erased. In each block, in this example, there are 8,512 columns corresponding to bit lines BL0, BL1, . . . BL8511. In one embodiment, all the bit lines of a block can be simultaneously selected during read and program operations. Memory cells along a common word line and connected to any bit line can be programmed at the same time.

In another embodiment, the bit lines are divided into even bit lines and odd bit lines. In an odd/even bit line architecture, memory cells along a common word line and connected to the odd bit lines are programmed at one time, while memory cells along a common word line and connected to even bit lines are programmed at another time.

FIG. 7 shows four memory cells connected in series to form a NAND string. Although four cells are shown to be included in each NAND string, more or less than four can be used (e.g., 16, 32, or another number). One terminal of the NAND string is connected to a corresponding bit line via a drain select gate (connected to select gate drain line SGD), and another terminal is connected to c-source via a source select gate (connected to select gate source line SGS).

Figure 8:
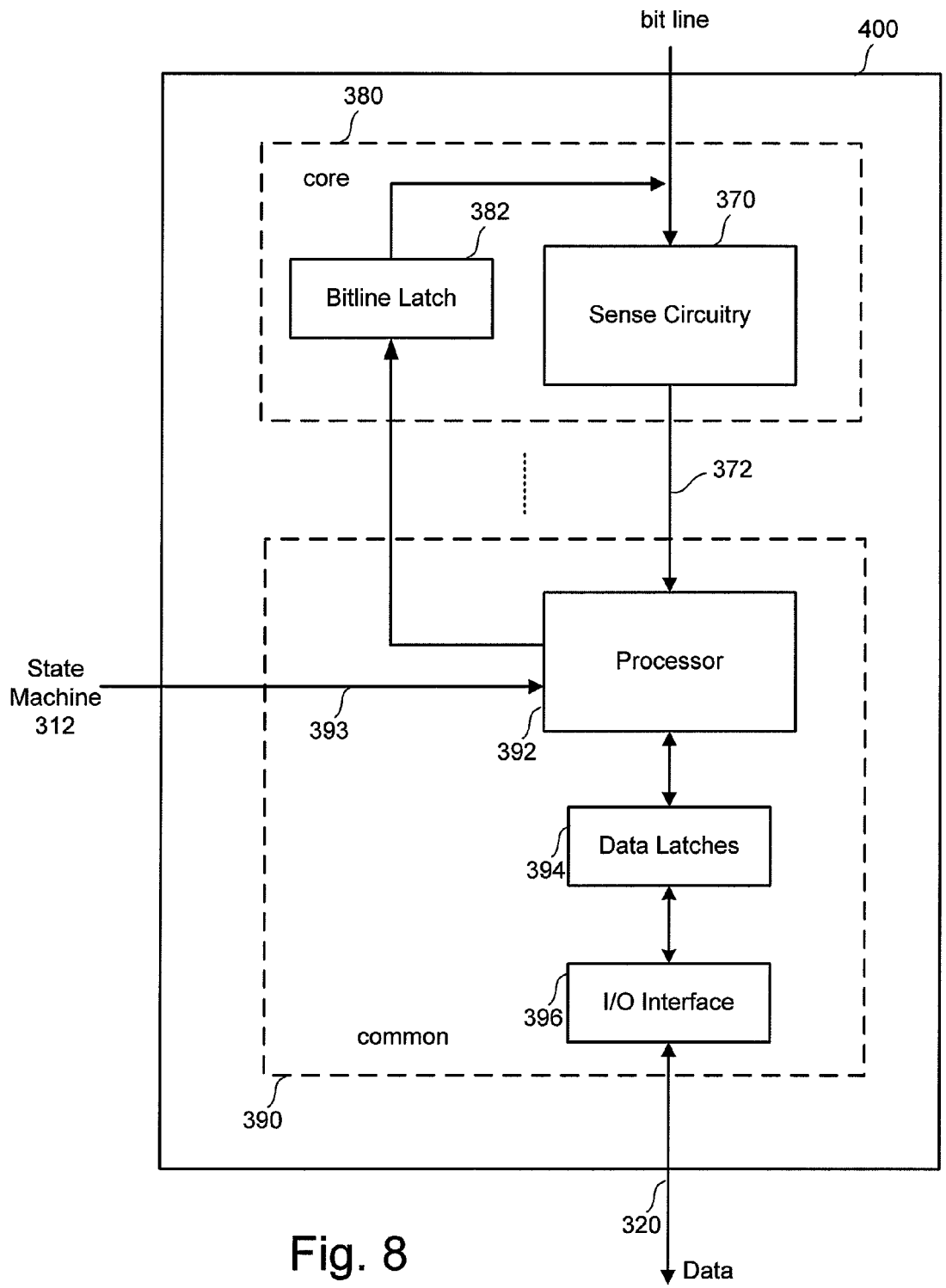
FIG. 8 is a block diagram depicting one embodiment of the sense block.

FIG. 8 is a block diagram of an individual sense block 400 partitioned into a core portion, referred to as a sense module 380, and a common portion 390. In one embodiment, there will be a separate sense module 380 for each bit line and one common portion 390 for a set of multiple sense modules 380. In one example, a sense block will include one common portion 390 and eight sense modules 380. Each of the sense modules in a group will communicate with the associated common portion via a data bus 372. For further details, refer to U.S. patent application Ser. No. 11/026,536 "Non-Volatile Memory & Method with Shared Processing for an Aggregate of Sense Amplifiers" filed on Dec. 29, 2004, which is incorporated herein by reference in its entirety.

Sense module 380 comprises sense circuitry 370 that determines whether a conduction current in a connected bit line is above or below a predetermined threshold level. Sense module 380 also includes a bit line latch 382 that is used to set a voltage condition on the connected bit line. For example, a predetermined state latched in bit line latch 382 will result in the connected bit line being pulled to a state designating program inhibit (e.g., Vdd).

Common portion 390 comprises a processor 392, a set of data latches 394 and an I/O Interface 396 coupled between the set of data latches 394 and data bus 320. Processor 392 performs computations. For example, one of its functions is to determine the data stored in the sensed memory cell and store the determined data in the set of data latches. The set of data latches 394 is used to store data bits determined by processor 392 during a read operation. It is also used to store data bits imported from the data bus 320 during a program operation. The imported data bits represent write data meant to be programmed into the memory. I/O interface 396 provides an interface between data latches 394 and the data bus 320.

During read or sensing, the operation of the system is under the control of state machine 312 that controls the supply of different control gate voltages to the addressed cell. As it steps through the various predefined control gate voltages corresponding to the various memory states supported by the memory, the sense module 380 may trip at one of these voltages and an output will be provided from sense module 380 to processor 392 via bus 372. At that point, processor 392 determines the resultant memory state by consideration of the tripping event(s) of the sense module and the information about the applied control gate voltage from the state machine via input lines 393. It then computes a binary encoding for the memory state and stores the resultant data bits into data latches 394. In another embodiment of the core portion, bit line latch 382 serves double duty, both as a latch for latching the output of the sense module 380 and also as a bit line latch as described above.

It is anticipated that some implementations will include multiple processors 392. In one embodiment, each processor 392 will include an output line (not depicted in FIG. 9) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 392 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 394 from the data bus 320. The program operation, under the control of the state machine, comprises a series of programming voltage pulses applied to the control gates of the addressed memory cells. Each programming pulse is followed by a verify operation to determine if the memory cell has been programmed to the desired state. Processor 392 monitors the verified memory state relative to the desired memory state. When the two are in agreement, the processor 222 sets the bit line latch 214 so as to cause the bit line to be pulled to a state designating program inhibit. This inhibits the cell coupled to the bit line from further programming even if programming pulses appear on its control gate. In other embodiments the processor initially loads the bit line latch 382 and the sense circuitry sets it to an inhibit value during the verify process.

Data latch stack 394 contains a stack of data latches corresponding to the sense module. In one embodiment, there are three data latches per sense module 380. In some implementations (but not required), the data latches are implemented as a shift register so that the parallel data stored therein is converted to serial data for data bus 320, and vice versa. In the preferred embodiment, all the data latches corresponding to the read/write block of m memory cells can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. patent application Ser. No. 11/015,199 titled "Improved Memory Sensing Circuit And Method For Low Voltage Operation," Inventor Raul-Adrian Cernea, filed on Dec. 16, 2004; (4) U.S. patent application Ser. No. 11/099,133, titled "Compensating for Coupling During Read Operations of Non-Volatile Memory," Inventor Jian Chen, filed on Apr. 5, 2005; and (5) U.S. patent application Ser. No. 11/321,953, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

Figure 9:
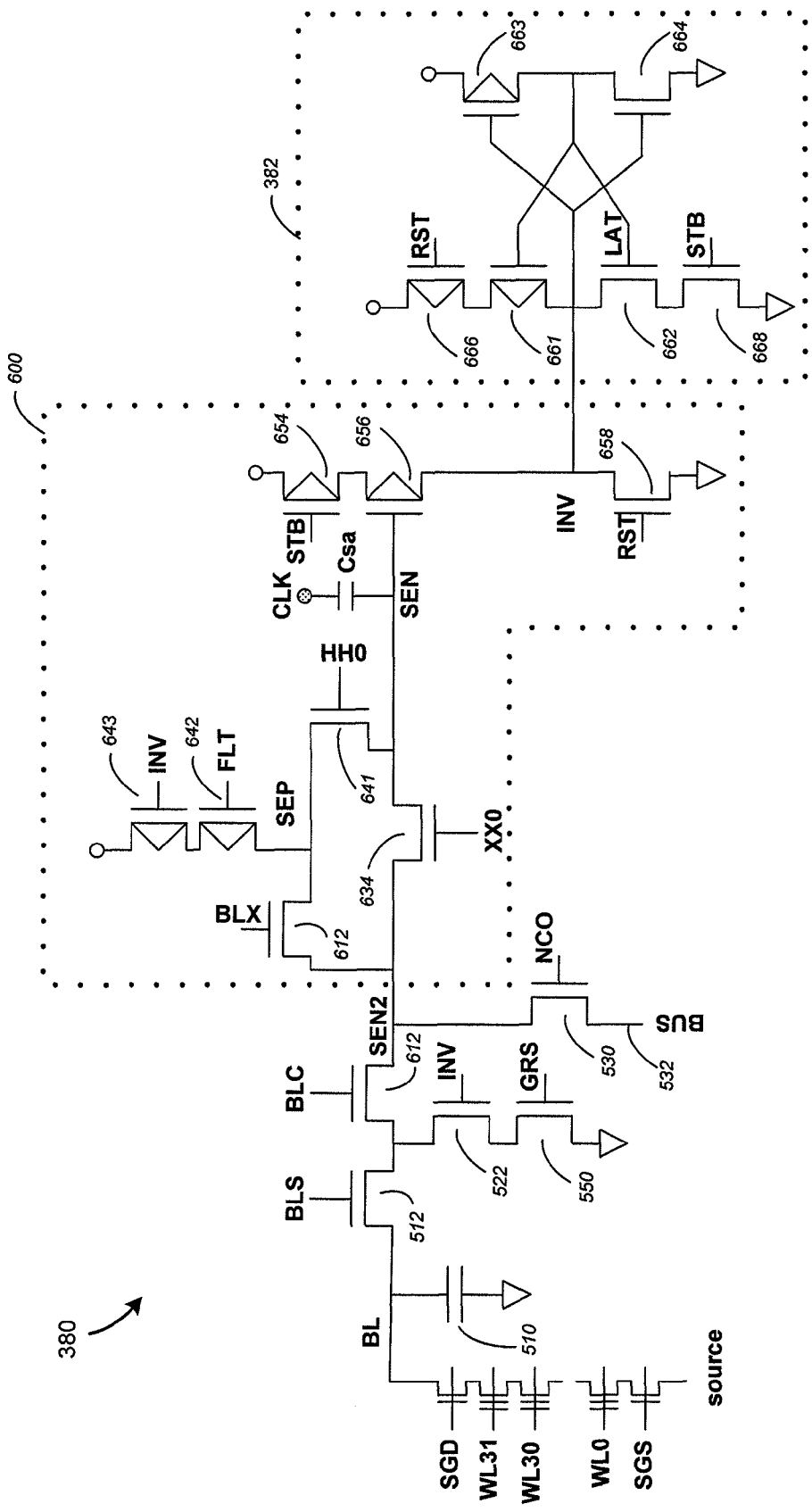
FIG. 9 is a schematic of one embodiment of a sense module.

FIG. 9 illustrates an example of sense module 380; however, other implementations can also be used. Sense module 380 comprises bit line isolation transistor 512, bit line pull down circuit (transistors 522 and 550), bit line voltage clamp transistor 612, readout bus transfer gate 530, sense amplifier 600 and bit line latch 382. One side of bit line isolation transistor 512 is connected to the bit line BL and capacitor 510. The other side of bit line isolation transistor 512 is connected to bit line voltage clamp transistor 612 and bit line pull down transistor 522. The gate of bit line isolation transistor 512 receives a signal labeled as BLS. The gate of bit line voltage clamp transistor 512 receives a signal labeled as BLC. Bit line voltage clamp transistor 512 is connected to readout bus transfer gate 530 at node SEN2. Readout bus transfer gate 530 is connected to readout bus 532. Bit line voltage clamp transistor 512 connects to sense amplifier 600 at node SEN2. In the embodiment of FIG. 9, sense amplifier 600 includes transistors 613, 634, 641, 642, 643, 654, 654 and 658, as well as capacitor Csa, Bit line latch 382 includes transistors 661, 662, 663, 664, 666 and 668.

In general, memory cells along a word line are operated on in parallel. Therefore a corresponding number of sense modules are in operation in parallel. In one embodiment, a controller provides control and timing signals to the sense modules operating in parallel. In some embodiments, data along a word line is divided into multiple pages, and the data is read or programmed a page at a time, or multiple pages at a time.

Sense module 380 is connectable to the bit line (e.g., bit line BL) for a memory cell when the bit line isolation transistor 512 is enabled by signal BLS. Sense module 380 senses the conduction current of the memory cell by means of sense amplifier 600 and latches the read result as a digital voltage level at a sense node SEN2 and outputs it to readout bus 532 via gate 530.

The sense amplifier 600 comprises a second voltage clamp (transistors 612 and 634), a pre-charge circuit (transistors 541, 642 and 643), and a discriminator or compare circuit (transistors 654, 656 and 658; and capacitor Csa). In one embodiment, a reference voltage is applied to the control gate of a memory cell being read. If the reference voltage is greater than the threshold voltage of the memory cell, then the memory cell will turn on and conduct current between its source and drain. If the reference voltage is not greater than the threshold voltage of the memory cell, then the memory cell will not turn on and will not conduct current between its source and drain. In many implementations, the on/off may be a continuous transition so that the memory cell will conduct different currents in response to different control gate voltages. If the memory cell is on and conducting current, the conducted current will cause the voltage on node SEN to decrease, effectively charging or increasing the voltage across capacitor Csa whose other terminal is at Vdd. If the voltage on node SEN discharges to a predetermined level during a predetermined sensing period, then sense amplifier 600 reports that the memory cell turned on in response to the control gate voltage.

One feature of the sense module 380 is the incorporation of a constant voltage supply to the bit line during sensing. This is preferably implemented by the bit line voltage clamp transistor 612, which operates like a diode clamp with transistor 612 in series with the bit line BL. Its gate is biased to a constant voltage BLC equal to the desired bit line voltage VBL above its threshold voltage VT. In this way, it isolates the bit line from the node SEN and sets a constant voltage level for the bit line, such as the desired VBL=0.5 to 0.7 volts during program-verifying or reading. In general, the bit line voltage level is set to a level such that it is sufficiently low to avoid a long precharge time, yet sufficiently high to avoid ground noise and other factors.

Sense amplifier 600 senses the conduction current through the sense node SEN and determines whether the conduction current is above or below a predetermined value. The sense amplifier outputs the sensed result in a digital form as the signal SEN2 to readout bus 532.

The digital control signal INV, which can essentially be an inverted state of the signal at SEN2, is also output to control the pull down circuit. When the sensed conduction current is higher than the predetermined value, INV will be HIGH and SEN2 will be LOW. This result is reinforced by the pull down circuit. The pull down circuit includes an n-transistor 522 controlled by the control signal INV and another n-transistor 550 controlled by the control signal GRS. The GRS signal when LOW allows the bit line BL to be floated regardless of the state of the INV signal. During programming, the GRS signal goes HIGH to allow the bit line BL to be pulled to ground and controlled by INV. When the bit line BL is required to be floated, the GRS signal goes LOW. Note that other designs of sense modules, sense amplifiers and latches can also be used.

Read/write circuits 365 operate on a page of memory cells simultaneously. Each sense module 380 in the read/write circuits 365 is coupled to a corresponding cell via a bit line.

The conduction current flows from the sense module through the bit line into the drain of the memory cell and out from the source before going through a source line to ground. In an integrated circuit chip, the sources of the cells in a memory array are all tied together as multiple branches of the source line connected to some external ground pad (e.g., Vss pad) of the memory chip. Even when metal strapping is used to reduce the resistance of the source line, a finite resistance, R, remains between the source electrode of a memory cell and the ground pad. Typically, the ground loop resistance R is around 50 ohm.

For the entire page of memory being sensed in parallel, the total current flowing through the source line is the sum of all the conduction currents. Generally, each memory cell has a conduction current dependent on the amount of charge programmed into its charge storage element. For a given control gate voltage of the memory cell, a small charge will yield a comparatively higher conduction current. When a finite resistance exists between the source electrode of a memory cell and the ground pad, the voltage drop across the resistance is given by Vdrop=iTOT R.

For example, if 4,256 bit lines discharge at the same time, each with a current of 1 µA, then the source line voltage drop will be equal to 4,000 lines×1 µA/line×50 ohms~0.2 volts. This source line bias will contribute to a sensing error of 0.2 volts when threshold voltages of the memory cells are sensed.

In one set of embodiments, a method for reducing source line bias is accomplished by read/write circuits with features and techniques for multi-pass sensing. Each pass helps to identify and shut down the memory cells with conduction current higher than a given demarcation current value. Typically, with each pass, the given demarcation current value progressively converges to the breakpoint current value for a conventional single-pass sensing. In this way, sensing in subsequent passes will be less affected by source line bias since the higher current cells have been shut down.

For example, multi-pass sensing can be implemented in two passes (j=0 to 1). After the first pass, those memory cells with conduction currents higher than the breakpoint are identified and removed by turning off their conduction current. A preferred way to turn off their conduction currents is to set their drain voltages on their bit lines to ground. In a second pass, error from source line bias is reduced. More than two passes are also contemplated. In embodiments where source line bias will not cause errors, one pass can be used for sensing.

FIGS. 10(A)-10(K) depicts timing diagrams that explain one embodiment of sense module 380 during read/verify operations.

PHASE (0): Setup

The sense module 380 (see FIG. 9) is connected to the corresponding bit line via an enabling signal BLS (FIG. 10(A)). The Voltage clamp is enabled with BLC (FIG. 10(B)). Pre-charge transistor 642 is enabled as a limited-current source with a control signal FLT (FIG. 10(C)).

PHASE (1): Controlled Pre-charge

Sense amplifier 600 is initialized by a reset signal RST (FIG. 10(D)) which will pull the signal INV (FIG. 10(H)) to ground via transistor 658. Thus, on reset, INV is set to LOW. At the same time, p-transistor 663 pulls a complementary signal LAT to $V_{dd}$ or HIGH (FIG. 10(H)). That is, LAT is the complement of INV. Isolation transistor 634 is controlled by the signal LAT. Thus, after reset, isolation transistor 634 is enabled to connect sense node SEN2 to the sense amplifier's internal sense node SEN.

Pre-charge transistor 642 pre-charges the bit line BL through the internal sense node SEN and the sense node SEN2 for a predetermined period of time. This will bring the bit line to an optimal voltage for sensing the conduction therein. Pre-charge transistor 642 is controlled by the control signal FLT ("FLOAT"). The bit line will be pulled up towards the desired bit line voltage as set by the bit line voltage clamp 612. The rate of pull-up will depend on the conduction current in the bit line. The smaller the conduction current, the faster the pull-up.

It has been described earlier that sensing errors due to the source line bias are minimized if those memory cells with conduction currents higher than a predetermined value are turned off and their contributions to the source line bias eliminated. Pre-charge transistor 642, therefore, serves two functions. One is to pre-charge the bit line to an optimal sensing voltage. The other is to help identify those memory cells with conduction currents higher than a predetermined value for D.C. (Direct Current) sensing so that they may be eliminated from contributing to source line bias.

The D.C. sensing is accomplished by providing a precharge circuit that behaves like a current source for supplying a predetermined current to the bit line. The signal FLT that controls the p-transistor 642 is such that it "programs" a predetermined current to flow. As an example, the FLT signal may be generated from a current mirror with a reference current set to 500 nA. When the p-transistor 642 forms the mirrored leg of the current mirror, it will also have the same 500 nA throwing in it.

Figure 10:
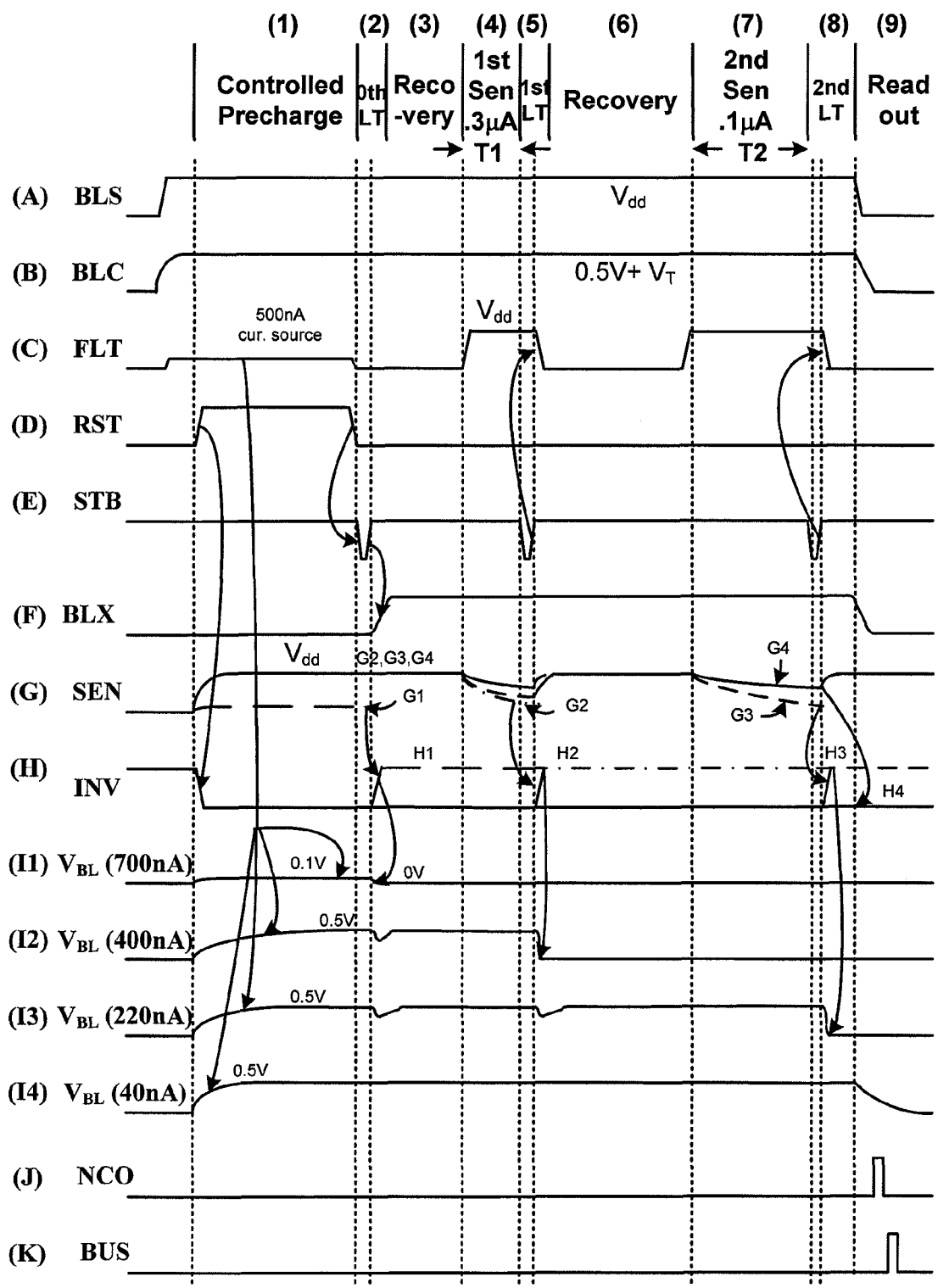
FIG. 10 is a timing diagram for one embodiment of a sense module.

FIGS. 10(I1)-10(I4) illustrate the voltages on four example bit lines connected respectively to memory cells with conduction currents of 700 nA, 400 nA, 220 nA and 40 nA. When a pre-charge circuit (which includes transistor 642) is a current source with a limit of 500 nA, for example, a memory cell having a conduction current exceeding 500 nA will have the charges on the bit line drained faster than it can accumulate. Consequently, for the bit line with conduction current 700 nA, its voltage or the signal at the internal sense node SEN will remain close to 0V (such as 0.1 volt; see FIG. 10(I1)). On the other hand, if the memory cell's conduction current is below 500 nA, the pre-charge circuit (which includes transistor 642) will begin to charge up the bit line and its voltage will begin to rise towards the clamped bit line voltage (e.g., 0.5V set by the voltage clamp 612) (FIGS. 10(I2)-10(I4)). Correspondingly, the internal sense node SEN will either remain close to 0V or be pulled up to Vdd (FIG. 10(G)). Generally, the smaller the conduction current, the faster the bit line voltage will charge up to the clamped bit line voltage. Thus, by examining the voltage on a bit line after the controlled pre-charge phase, it is possible to identify if the connected memory cell has a conduction current higher or lower than a predetermined level.

PHASE (2): D.C. Latching & Removing High Current Cells from Subsequent Strobes

After the controlled pre-charge phase, an initial D.C. high-current sensing phase begins where the node SEN is sensed by the discriminator circuit. The sensing identifies those memory cells with conduction currents higher than the predetermined level. The discriminator circuit includes two p-transistors 654 and 656 in series, which serve as a pull-up for a node registering the signal INV. The p-transistor 654 is enabled by a read strobe signal STB going LOW and the p-transistor 656 is enabled by the signal at the internal sense node SEN going LOW. High current memory cells will have the signal SEN close to 0V or at least unable for its bit lines to be pre-charged sufficiently high to turn off the p-transistor

656. For example, if the weak pull up is limited to a current of 500 nA, it will fail to pull up a cell with conduction current of 700 nA (FIG. 10(G1)). When STB strobes LOW to latch, INV is pulled up to $V_{dd}$. This will set the latch circuit 660 with INV HIGH and LAT LOW (FIG. 10(H1)).

When INV is HIGH and LAT LOW, the isolation gate 630 is disabled and the sense node SEN2 is blocked from the internal sense node SEN. At the same time, the bit line is pulled to ground by the pull down transistor 522 (FIGS. 9 & 10(I1)). This will effectively turn off any conduction current in the bit line, eliminating it from contributing to source line bias.

Thus, in one preferred implementation of the sense module 380, a limited-current source pre-charge circuit is employed. This provides an additional or alternative way (D.C. sensing) to identify bit lines carrying high currents and to turn them off to minimize source line bias error in subsequent sensing.

In another embodiment, the pre-charge circuit is not specifically configured to help identify high current bit lines but is optimized to pull up and pre-charge the bit line as fast as possible within the allowance of the maximum current available to the memory system.

PHASE (3): Recovery/Pre-Charge

Prior to a sensing of the conduction current in a bit line that has not been previously pulled down, the pre-charge circuit is activated by the signal FLT going LOW to pre-charge the internal sense node SEN2 to $V_{dd}$ (FIG. 10(C) and FIGS. 10(I2)-10(I4)) and the bit line which may have been partially coupled down due to a decrease in the voltage on adjacent bit lines.

PHASE (4): First A.C. Sensing

In one embodiment, an A.C. (Alternating Current or transient) sensing is performed by determining the voltage drop at the floated internal sense node SEN. This is accomplished by the discriminator circuit employing the capacitor Csa coupled to the internal sense node SEN, and considering the rate the conduction current is charging it (reducing the voltage on node SEN). In an integrated circuit environment, the capacitor Csa is typically implemented with a transistor; however, other implementations are suitable. Capacitor Csa has a predetermined capacitance, e.g., 30 fF, which can be selected for optimal current determination. The demarcation current value, typically in the range of 100-1000 nA, can be set by appropriate adjustment of the charging period.

The discriminator circuit senses the signal SEN in the internal sense node SEN. Prior to each sensing, the signal at the internal sense node SEN is pulled up to $V_{dd}$ by pre0charge transistor 642. This will initially set the voltage across the capacitor Csa to be zero.

When the sense amplifier 600 is ready to sense, the pre-charge circuit is disabled by FLT going HIGH (FIG. 10(C)). The first sensing period T1 is ended by the assertion of the strobe signal STB. During the sensing period, a conduction current induced by a conducting memory cell will charge the capacitor. The voltage at SEN will decrease from $V_{dd}$ as the capacitor Csa is charged through the draining action of the conduction current in the bit line. FIG. 10(G) (see curves G2-G4) illustrates the SEN node corresponding to the remaining three example bit lines connected respectively to memory cells with conduction currents of 400 nA, 220 nA and 40 nA, the decrease being more rapid for those with a higher conduction current.

PHASE (5): First A.C. Latching and Removal of Higher Current Cells from Subsequent Sensing At the end of the first predetermined sensing period, the SEN node will have decreased to some voltage depending on the conduction current in the bit line (see curves G2-G4 of FIG. 10G). As an example, the demarcation current in this first phase is set to be at 300 nA. The capacitor Csa, the sensing period T1 and the threshold voltage of the p-transistor 656 are such that the signal at SEN corresponding to a conduction current higher than the demarcation current (e.g., 300 nA) will drop sufficiently low to turn on the transistor 656. When latching signal STB strobes LOW, the output signal INV will be pulled HIGH, and will be latched by the latch 382 (FIG. 10(E) and FIG. 10(H) (curve H2)). On the other hand, the signal SEN corresponding to a conduction current below the demarcation current will produce a signal SEN unable to turn on the transistor 656. In this case, the latch 382 will remain unchanged, in which case LAT remains HIGH (FIGS. 10(H3) and 10(H4)). Thus, it can be seen that the discriminator circuit effectively determines the magnitude of the conduction current in the bit line relative to a reference current set by the sensing period.

Sense amplifier 600 also includes the second voltage clamp transistor 612 whose purpose is to maintain the voltage of the drain of the transistor 612 sufficiently high in order for the bit line voltage clamp 610 to function properly. As described earlier, the bit line voltage clamp 610 clamps the bit line voltage to a predetermined value $V_{BL}$, e.g., 0.5V. This will require the gate voltage BLC of the transistor 612 to be set at $V_{BL}+V_T$ (where $V_T$ is the threshold voltage of the transistor 612) and the drain connected to the sense node 501 to be greater than the source, i.e., the signal SEN2>$V_{BL}$. In particular, given the configurations of the voltage clamps, SEN2 should be no higher than the smaller of XX0–$V_T$ or BLX–$V_T$, and SEN should be no lower. During sensing, the isolation gate 630 is in a pass-through mode. However, during sensing the signal at the internal sense node SEN has a voltage that decreases from Vdd. The second voltage clamp prevents SEN from dropping below XX0–$V_T$ or BLX–$V_T$, whichever is lower. This is accomplished by an n-transistor 612 controlled by a signal BLX, where BLX is $\geqq V_{BL}+V_T$. Thus, through the actions of the voltage clamps, the bit line voltage $V_{BL}$ is kept constant, e.g., ~0.5V, during sensing.

The output of the current determination is latched by the latch circuit 382. The latch circuit is formed as a Set/Reset latch by the transistors 661, 662, 663 and 664 together with the transistors 666 and 668. The p-transistor 666 is controlled by the signal RST (RESET) and the n-transistor 668 is controlled by the signal STB. A variation of the above-described sense amplifier that is adapted for low voltage operation is found in U.S. patent application Ser. No. 11/015,199 titled "Improved Memory Sensing Circuit And Method For Low Voltage Operation," Inventor Raul-Adrian Cernea, filed on Dec. 16, 2004, incorporated herein by reference in its entirety.

In general, there will be a page of memory cells being operated on by a corresponding number of multi-pass sense modules 380. For those memory cells having conduction current higher than the first demarcation current level, their LAT signal will be latched LOW (INV latched HIGH). This in turn activates the bit line pull down circuit 520 to pull the corresponding bit lines to ground, thereby turning off their currents.

PHASE (6): Recovery/Pre-Charge

Prior to the next sensing of the conduction current in a bit line that has not been previously pulled down, the pre-charge circuit is activated by the signal FLT to pre-charge the internal sense node 631 to $V_{dd}$ (FIG. 10(C) and FIGS. 10(I3)-10(I4)).

PHASE (7): Second Sensing

When the sense amplifier 600 is ready to sense, the pre-charge circuit is disabled by FLT going HIGH (FIG. 10(C)). The second sensing period T2 is set by the assertion of the strobe signal STB. During the sensing period, a conduction current, if any, will charge the capacitor. The signal at the node SEN will decrease from $V_{dd}$ as capacitor Csa is charging through the draining action of the conduction current in the bit line 36.

In accordance with the example before, the memory cells with conduction currents higher than 300 nA have already been identified and shut down in the earlier phases. FIG. 14(G) (curves G3 and G4) illustrate respectively the SEN signal corresponding to the two example bit lines connected respectively to memory cells with conduction currents of 220 nA and 40 nA.

PHASE (8): Second Latching for Reading Out

At the end of the second predetermined sensing period T2, SEN will have decreased to some voltage depending on the conduction current in the bit line (FIG. 10(G) (curves G3 and G4)). As an example, the demarcation current in this second phase is set to be at 100 nA. In this case, the memory cell with the conduction current 220 nA will have its INV latched HIGH (FIG. 10(H)) and its bit line subsequently pulled to ground (FIG. 10(I3)). On the other hand, the memory cell with the conduction current 40 nA will have no effect on the state of the latch, which was preset with LAT HIGH.

PHASE (9): Read Out to the Bus

Finally, in the read out phase, the control signal NCO at the transfer gate 530 allows the latched signal SEN2 to be read out to the readout bus 532 (FIGS. 10(J) and 10(K)).

As can be seen from FIGS. 10(I1)-10(I4), the bit line voltage remains constant during each sensing period. Thus, from the discussion earlier, capacitive bit-line to bit-line coupling is eliminated.

The sense module 380 described above is one embodiment where sensing is performed with three passes, the first two passes being implemented to identify and shut down higher current memory cells. With the higher current contributions to the source line bias eliminated, the final pass is able to sense the cells with lower range conduction currents more accurately.

In other embodiments, sensing operations are implemented with different combination of D.C. and A.C. passes, some using only two or more A.C. passes, or only one pass. For the different passes, the demarcation current value used may be the same each time or converge progressively towards the demarcation current used in the final pass. Additionally, the sensing embodiment described above is just one example of a suitable sense module. Other designs and technologies can also be used to implement the invention described herein. No one particular sense module is required or suggested for the invention described herein.

Figure 11:
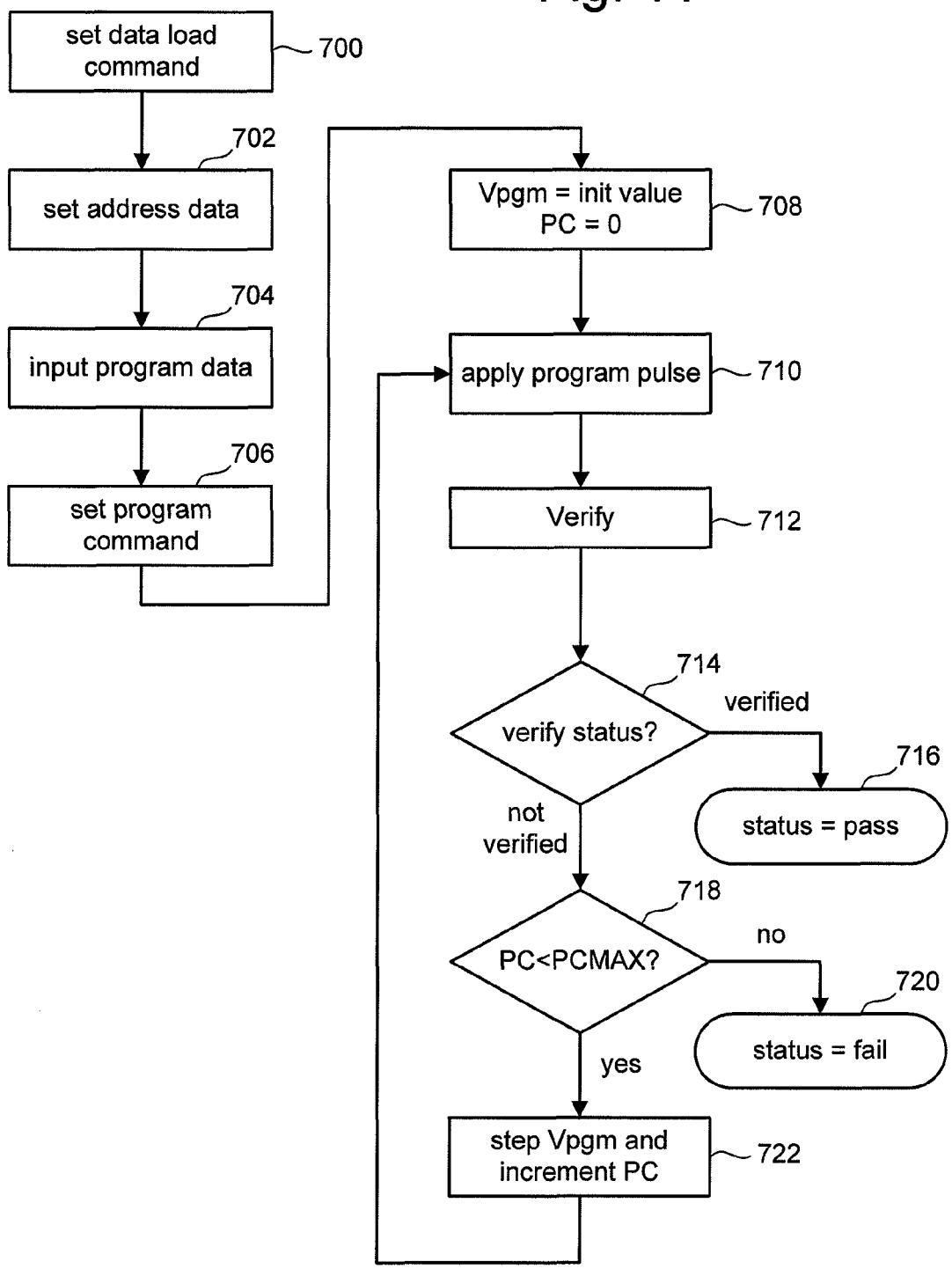
FIG. 11 is a flow chart describing one embodiment of a process for programming non-volatile memory.

FIG. 11 is a flow chart describing one embodiment of a method for programming non-volatile memory. In one implementation, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected memory cells and the data of the selected memory cells are erased as electrons of the floating gates are emitted to the substrate side, typically by Fowler-Nordheim tunneling. As electrons are transferred from the floating gate to the p-well region, the threshold voltage of a selected cell is lowered. Erasing can be performed on the entire memory array, separate blocks, or another unit of cells.

In step 700 of FIG. 11, a "data load" command is issued by the controller and received by control circuitry 310. In step 702, address data designating the page address is input to decoder 314 from the controller or host. In step 704, a page of program data for the addressed page is input to a data buffer for programming. That data is latched in the appropriate set of latches. In step 706, a "program" command is issued by the controller to state machine 312.

Figure 12:
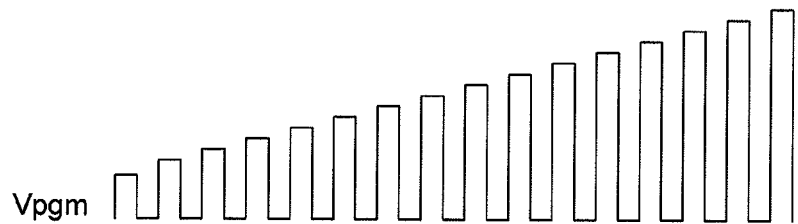
FIG. 12 is an example wave form applied to the control gates of non-volatile memory cells.

Triggered by the "program" command, the data latched in step 704 will be programmed into the selected memory cells controlled by state machine 312 using the stepped pulses of FIG. 12 applied to the appropriate word line. In step 708, the program voltage Vpgm is initialized to the starting pulse (e.g., 12V or other value) and a program counter PC maintained by state machine 312 is initialized at 0. In step 710, the first Vpgm pulse is applied to the selected word line. If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to Vdd to inhibit programming.

In step 712, the states of the selected memory cells are verified to determine if they have reached their target threshold voltage. If it is detected that the threshold voltage of a selected cell has reached the target level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine (via the wired-OR type mechanism described above) knows that all selected cells have been programmed. In step 714, it is checked whether all of the data latches are storing logic "1." If so, the programming process is complete and successful because all selected memory cells were programmed and verified. A status of "PASS" is reported in step 716.

If, in step 714, it is determined that not all of the data latches are storing logic "1," then the programming process continues. In step 718, the program counter PC is checked against a program limit value PCMAX. One example of a program limit value is 20; however, other numbers can also be used. If the program counter PC is not less than 20, then the program process has failed and a status of "FAIL" is reported in step 720. In some embodiments, after the maximum number of loops is reached, the system checks whether less than a predetermined amount of cells have not finished programming. If less than that predetermined number has not finished programming, the programming process is still considered pass. If the program counter PC is less than 20, then the Vpgm level is increased by the step size and the program counter PC is incremented in step 722. After step 722, the process loops back to step 710 to apply the next Vpgm pulse.

FIG. 12 shows a series of program pulses that are applied to the word line selected for programming. In between program pulses are a set of verify pulses (not depicted). In some embodiments, there can be a verify pulse for each state that data is being programmed into. In other embodiments, there can be more or less verify pulses.

In one embodiment, data is programmed to memory cells along a common word line. Thus, prior to applying the program pulses of FIG. 12, one of the word lines is selected for programming. This word line will be referred to as the selected word line. The remaining word lines of a block are referred to as the unselected word lines.

Figure 13:
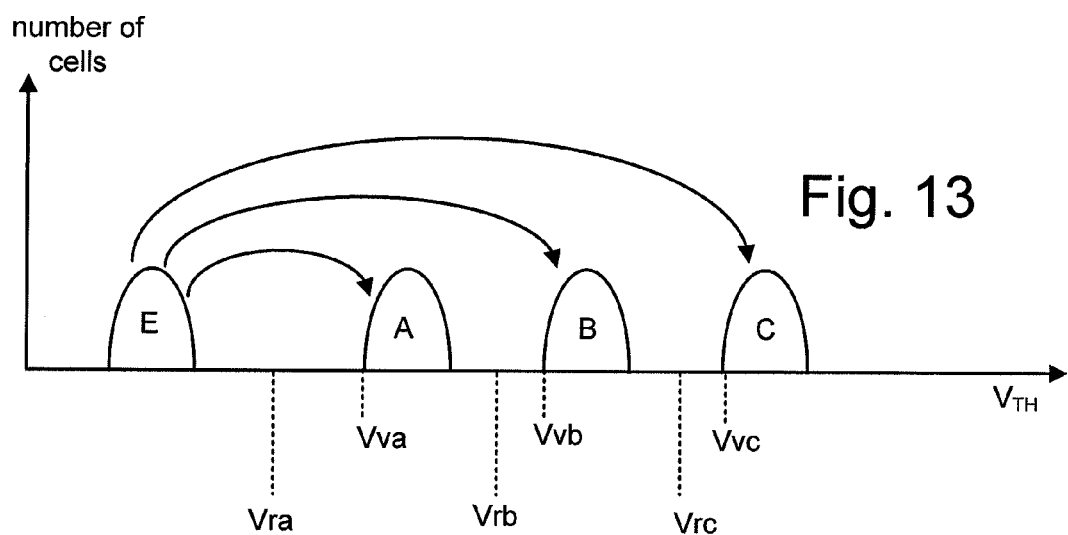
FIG. 13 depicts an example set of threshold voltage distributions.

At the end of a successful program (with verification) process, the threshold voltages of the memory cells should be within one or more distributions of threshold voltages for programmed memory cells or within a distribution of threshold voltages for erased memory cells, as appropriate. FIG. 13 illustrates example threshold voltage distributions for the memory cell array when each memory cell stores two bits of data. FIG. 13 shows a first threshold voltage distribution E for erased memory cells. Three threshold voltage distributions, A, B and C for programmed memory cells, are also depicted. In one embodiment, the threshold voltages in the E distribution are negative and the threshold voltages in the A, B and C distributions are positive.

Each distinct threshold voltage range of FIG. 13 corresponds to predetermined values for the set of data bits. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, "Tracking Cells For A Memory System," filed on Jun. 13, 2003, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although FIG. 13 shows four states, the present invention can also be used with other multi-state structures including those that include more or less than four states. For example, some non-volatile storage elements can utilize eight (seven programmed and one erased) or more states.

FIG. 13 also shows three read reference voltages, Vra, Vrb and Vrc, for reading data from memory cells. By testing whether the threshold voltage of a given memory cell is above or below Vra, Vrb and Vrc, the system can determine what state the memory cell is in.

FIG. 13 also shows three verify reference voltages, Vva, Vvb and Vvc. When programming memory cells to state A, the system will test whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc.

In one embodiment, known as full sequence programming, memory cells can be programmed from the erase state E directly to any of the programmed states A, B or C. For example, a population of memory cells to be programmed may first be erased so that all memory cells in the population are in erased state E. While some memory cells are being programmed from state E to state A, other memory cells are being programmed from state E to state B and/or from state E to state C.

Figure 14:
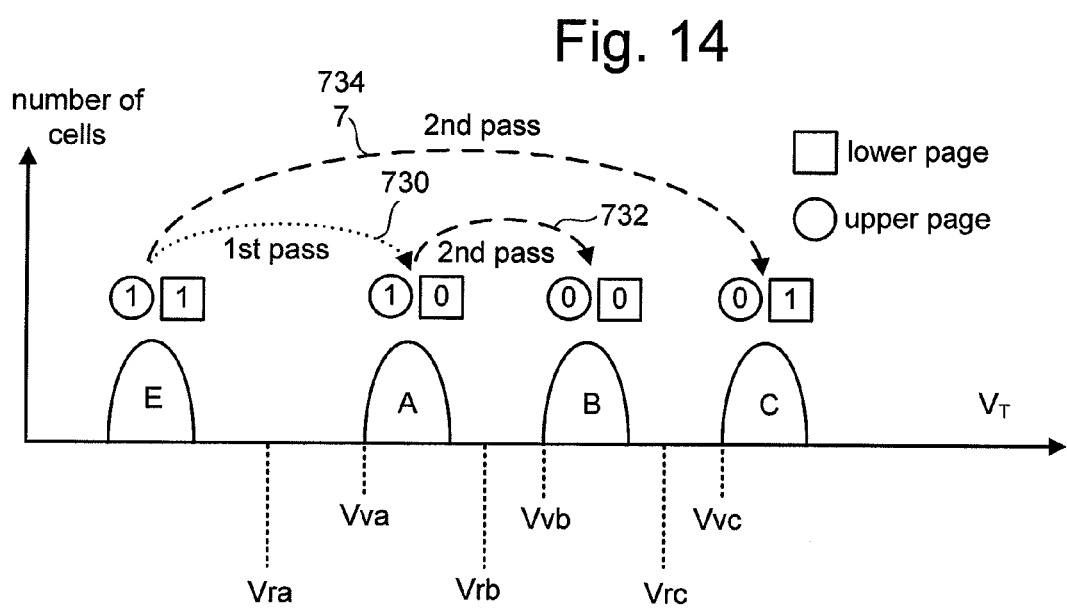
FIG. 14 depicts an example set of threshold voltage distributions.

FIG. 14 illustrates an example of a two-pass technique of programming a multi-state memory cell that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the cell's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the cell is increased to be state A, as shown by arrow 730.

In a second programming pass, the cell's threshold voltage level is set according to the bit being programmed into the upper logical page. If the upper logical page bit is to store a logic "1," then no programming occurs since the cell is in one of the states E or A, depending upon the programming of the lower page bit, both of which carry an upper page bit of "1." If the upper page bit is to be a logic "0," then the threshold voltage is shifted. If the first pass resulted in the cell remaining in the erased state E, then in the second phase the cell is programmed so that the threshold voltage is increased to be within state C, as depicted by arrow 734. If the cell had been programmed into state A as a result of the first programming pass, then the memory cell is further programmed in the second pass so that the threshold voltage is increased to be within state B, as depicted by arrow 732. The result of the second pass is to program the cell into the state designated to store a logic "0" for the upper page without changing the data for the lower page.

In one embodiment, a system can be set up to perform full sequence writing if enough data is written to fill up a word line. If not enough data is written, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's memory cells. More details of such an embodiment are disclosed in U.S. Patent Application titled "Pipelined Programming of Non-Volatile Memories Using Early Data," Ser. No. 11/013,125, filed on Dec. 14, 2004, inventors Sergey Anatolievich Gorobets and Yan Li, incorporated herein by reference in its entirety.

Figure 15:
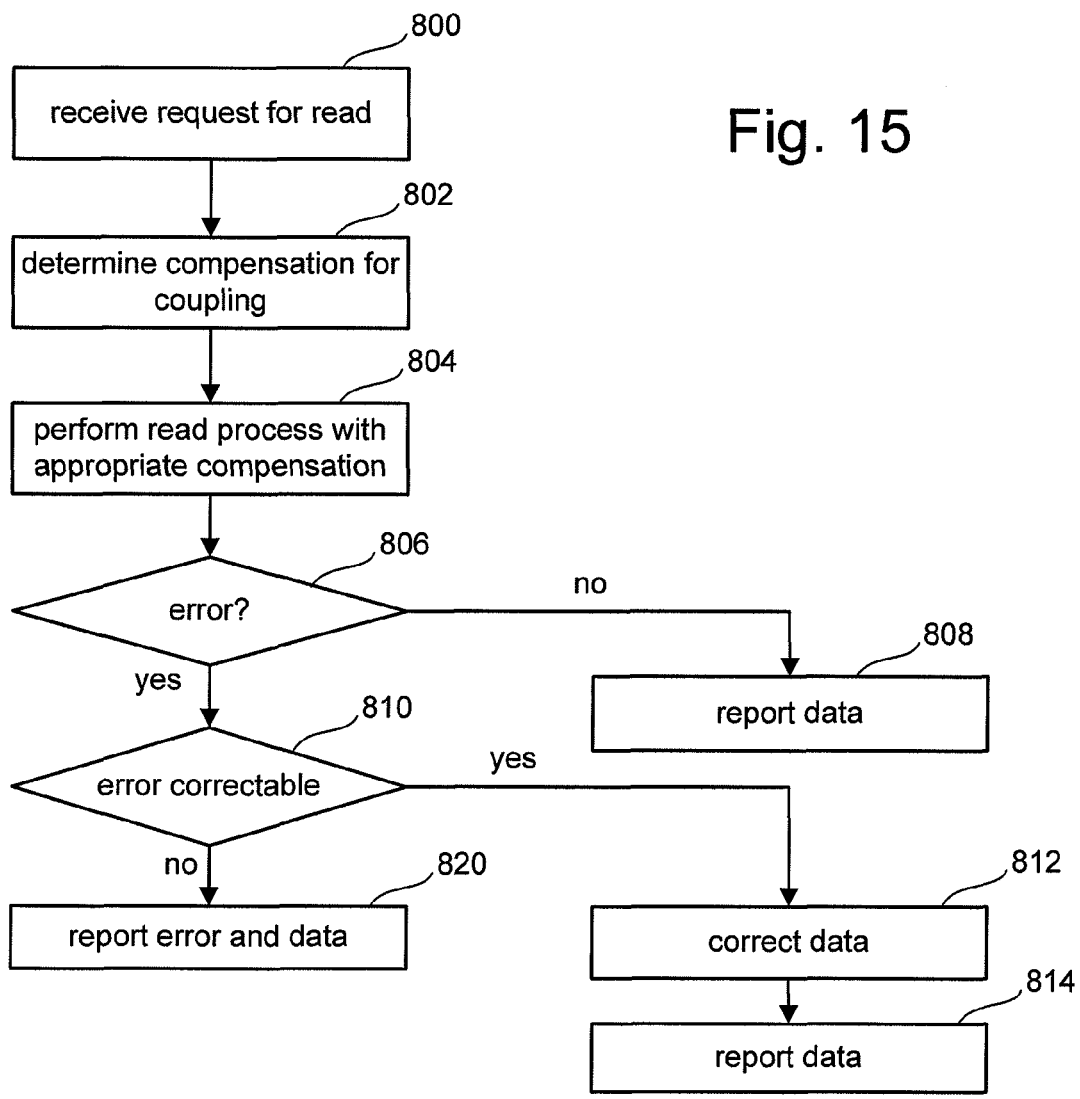
FIG. 15 is a flow chart describing one embodiment of process that is performed when reading data.

FIG. 15 is a flow chart describing one embodiment for reading data from non-volatile memory cells. The discussion above with respect to the sense modules discusses how data is read from particular bit lines. FIG. 15 provides the read process at the system level. In step 800, a request to read data is received from the host, the controller, or another entity. As discussed above, shifts in the apparent charge stored on a floating gate (or other charge storing element) of a non-volatile memory cell can occur because of the coupling of an electric field based on the charge stored in adjacent floating gates (or other adjacent charge storing elements). To compensate for this coupling, the read process for a given memory cell will take into account the programmed state of an adjacent memory cell. Step 802 includes determine whether to provide such compensation for coupling between neighboring floating gates. In some embodiments, step 802 also includes determining how much compensation to use. In step 804, a read process is performed for a particular page or other unit of data in response to the request to read data. The read process of step 804 may include appropriate compensation for coupling between neighboring floating gates, based on step 802. In one embodiment, the memory cells read in step 804 are connected to a common word line, but different bit lines.

In one embodiment, when data for a page is programmed, the system will also create Error Correction Codes (ECCs) and write those ECCs with the page of data. ECC technologies are well known in the art. The ECC process used can include any suitable ECC process known in the art. When reading data from a page (or other unit of data), the ECCs will be used to determine whether there are any errors in the data (step 806). The ECC process can be performed by the controller, the state machine or elsewhere in the system. If there are no errors in the data, the data is reported to the user at step 808. If an error is found at step 806, it is determined whether the error is correctable (step 810). Various ECC methods have the ability to correct a predetermined number of errors in a set of data. If the ECC process can correct the data, then the ECC process is used to correct that data in step 812 and the data, as corrected, is reported to the user in step 814. If the data is not correctable by the ECC process (step 810), an error will be reported to the user in step 820. In some embodiments, step 820 can also include reporting all or a subset of the data. If it is known that a subset of data does not have an error, that subset can be reported.

Figure 16:
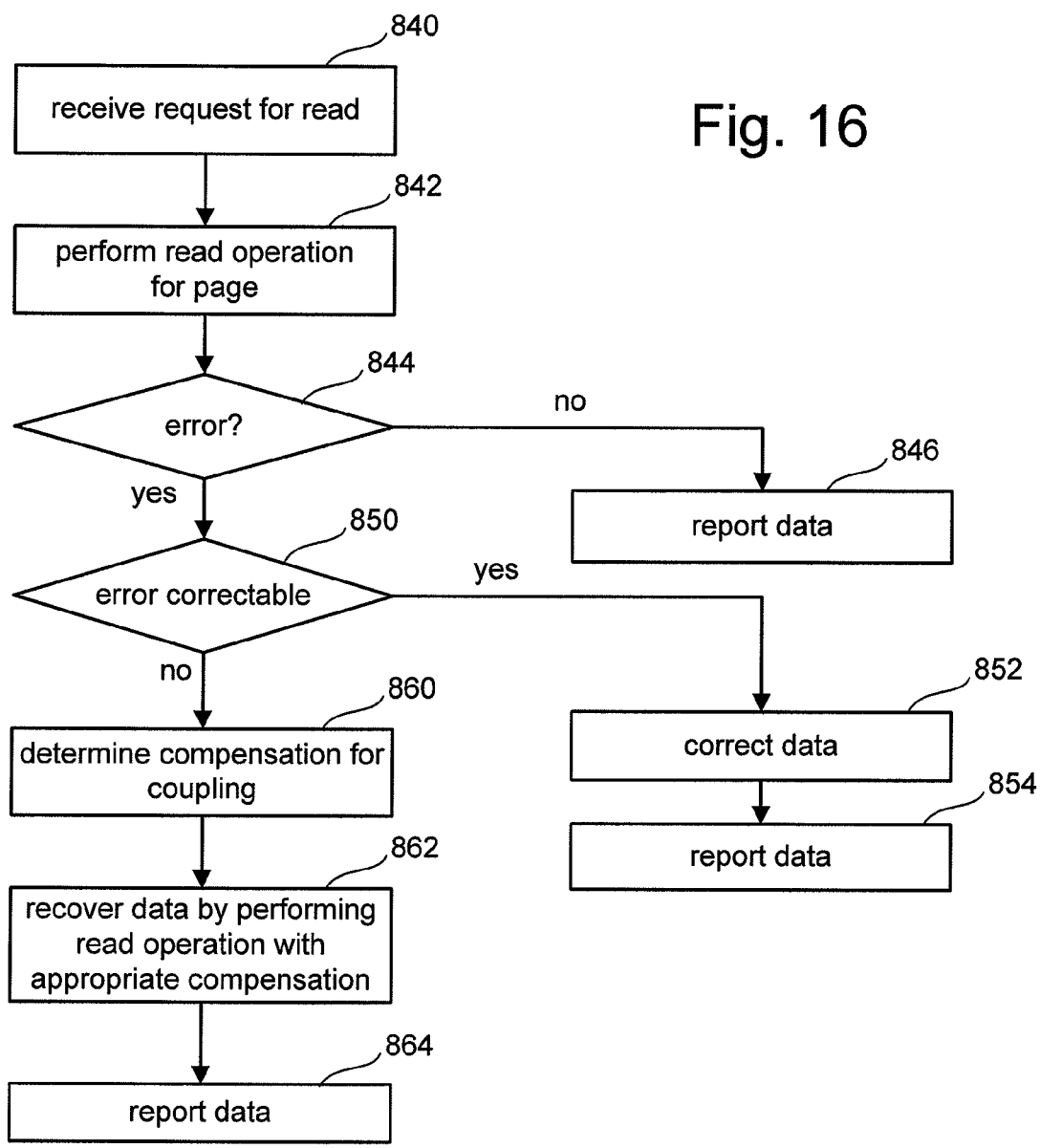
FIG. 16 is a flow chart describing one embodiment of process that is performed when reading data.

FIG. 16 is a flow chart describing another embodiment for reading data from non-volatile memory cells that potentially uses compensation for coupling between neighboring floating gates. One difference between the process of FIG. 15 and the process of FIG. 16, is that the process of FIG. 16 uses the compensation only if there is an error during the read process.

In step 840 of FIG. 16, a request to read data is received from the host, the controller, or another entity. In step 842, a read process is performed for a particular page or other unit of data in response to the request to read data. The read process of step 842 does not include the compensation for coupling described herein. Step 844 includes determining whether there are any errors in the data. If there are no errors in the data, the data is reported to the user at step 846. If an error is found at step 844, it is determined whether the error is correctable in step 850. Various ECC methods have the ability to correct a predetermined number of errors in a set of data. If the ECC process can correct the data, then the ECC process is used to correct that data in step 852 and the data, as corrected, is reported to the user in step 854. If the data is not correctable by the ECC process (step 850), then the system will attempt to recover the data by performing a read process with compensation for coupling between neighboring floating gates. Thus, in step 860, the system determines whether and/or how much compensation to use to address coupling between neighboring floating gates. In step 862, a read process is performed for a particular page or other unit of data in response to the request to read data. The read process of step 862 attempts to recover data by using appropriate compensation for coupling between neighboring floating gates, based on step 860.

A neighboring floating gate to a target floating gate may include neighboring floating gates that are on the same bit line but different word line, neighboring floating gates on the same word line but different bit line, or floating gates that are across from the target floating gate because they are on both a neighboring bit line and neighboring word line. In one embodiment, the compensation for coupling discussed herein can apply to any of these above mention sets of neighboring floating gates. In some embodiments, the compensation for coupling discussed herein applies to neighboring floating gates on the same word line but different bit line. For example, memory cell 362 may have its apparent threshold voltage changed due to coupling from memory cells 364 and 366 (see FIG. 7). Compensation for coupling due to neighboring floating gates on the same bit line but different word line is discussed in more detail in U.S. patent application Ser. No. 11/099,049, "Read Operation For Non-Volatile Storage That Includes Compensation for Coupling," filed on Apr. 5, 2005, inventors Yan Li and Jian Chen, incorporated herein by reference in its entirety. Some embodiments provide compensation for coupling between neighboring floating gates on the same word line but different bit line and between neighboring floating gates on the same bit line but different word line.

The amount of coupling between neighboring floating gates depends on the timing of when the neighboring floating gates are programmed. Two neighboring floating gates programmed at the same time are likely to have little or no coupling. The greatest amount of coupling is likely to happen between two neighboring floating gates where one floating gate is not programmed (e.g., remains in erased state E) and the other floating gate is subsequently programmed to the highest (e.g., most) programmed state (e.g., programmed to state C-see FIG. 13). Because there is a large margin between state E and state A, even with coupling there is not likely to be an error reading data in state E. The second largest amount of coupling is between a first floating gate programmed to state A and a later programmed floating gate programmed to state C. Thus, in one embodiment, the only time compensation for coupling will be used is when a memory cell is in the first programmed state (e.g., state A) and its neighbor is in the highest programmed state (e.g., state C) of a set of states (4 state, 8 states or a different number of states). In other embodiments, compensation for coupling can be used when a neighbor memory cell is in a different state, such as state B or another state. In some embodiments that use more or less than four states, compensation for coupling can be used when a neighbor memory cell is in a state that has been found to cause coupling. Similarly, compensation for coupling can be used when a target memory cell is in a state other than state A, as appropriate for the particular implementation.

If the neighbor memory cell's state can be detected or acquired using some technique, the amount of correction needed for the memory cell under consideration can be determined and adjusted in the next read operation. One way to know the state of a particular memory cell is through a read operation. But, in one embodiment, there is no communication between sense amplifiers for neighboring bit lines. Even after a read operation, the memory cell under consideration will not know the state of its neighbor memory cells.

Figure 17:
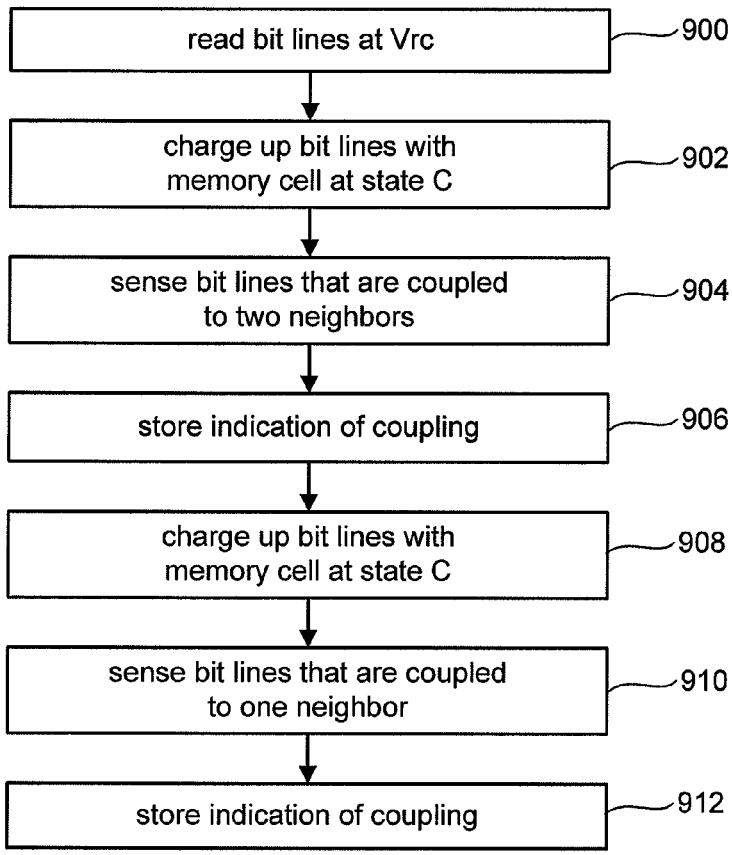
FIG. 17 is a flow chart describing one embodiment of a process for sensing data from a neighboring bit line.

FIG. 17 is a flow chart describing one embodiment for determining whether and how much compensation should be used based on whether a memory cell is in state A and one or more of its neighbors are in state C. There are at least two scenarios. In one scenario, the particular memory cell being read is in state A and one of its neighbors are in state C. In the second scenario, the particular memory cell being read is in state A and two of its neighbors (different bit lines) are in state C. The process of FIG. 17 determines whether any neighbors for a particular memory cell (or particular bit line) are in state C (or in a the highest programmed state of a set of 7 or more states). This process can be used to implement step 802 of FIG. 15 and step 860 of FIG. 16.

In step 900 of FIG. 17, all of the memory cells (or a subset) connected to the selected word line are read to determine whether the memory cells are in state C. This is accomplished by using read compare point Vrc. Those memory cells having a threshold voltage greater than Vrc are assumed to be in state C. Those memory cells having a threshold voltage that is less than Vrc are not in state C. At the end of the read operation using Vrc, each sense amplifier will latch whether that corresponding memory cell is in state C or not. One hurdle that must be overcome is that in some implementations sense amplifiers cannot talk to neighboring sense amplifiers. Thus, looking at FIG. 7, the sense amplifier for bit line BL2 cannot communicate with the sense amplifier bit line BL1 or bit line BL3. Therefore, the sense amplifier for BL2 does not know whether the neighbor memory cells on BL1 and BL3 are in state C. Steps 902-910 are performed to indicate whether neighbor memory cells are in state C. At step 902, all of the bit lines that are connected to a memory cell sensed in step 900 to be in state C are charged to a predetermined voltage. In one example, the bit lines with memory cell in state C are charged to 0.5 volts. Looking back at FIG. 9, this can be accomplished by applying 0.5 volts+Vth (of transistor 612) to the gate of transistor 612 and toggling the RST signal low to cause INV=0. Other sense amplifiers were set up with INV=1, and therefore, their bit lines will not be charged up. With GRS=0, there is no active pull down on the bit line. When the bit lines with C data charge up, the neighboring bit lines will be coupled to those bit lines due to bit line to bit line coupling. In one implementation, such coupling can be 40% of the total bit line capacitance. For bit lines that have both neighbors with C data, capacitive coupling could be up to 80% of the total bit line capacitance. For example, if the bit line has one neighbor with C data, it can be coupled-up by approximately 0.15 volts. If the bit line has two neighbors with C data, it can be coupled-up by approximately 0.3 volts.

In step 904, those bit lines having two neighbors with C data are identified. In one embodiment, step 904 is accomplished by lowering BLC to 0.2+Vth (of transistor 612). This will cause the bit lines with two C neighbors to have its transistor 612 turn off, since the drain site of transistor 612 is Vdd and the source side is 0.3 volts. Then, SEN node will not be discharged, the sense amplifier will latch LAT=1. Other bit lines with one C neighbor or no C neighbor will have transistor 612 conducting. Since the bit line has a much higher capacitance than capacitor Csa, the SEN node will discharge and the sense amplifier will latch LAT=0. The result of whether the SEN node charged or discharged will be stored in appropriate data latches 394 (step 906). After step 906, the sense amplifier and bit lines are reset and those bit lines connected to memory cells in state C are then charged up again in step 908, similar to step 902. In step 910, those bit lines that are coupled to one or more C neighbors are sensed by applying BLC=0.15 volts+Vth (transistor 612). The system senses those bit lines with one or more neighbors having memory cells in state C. In step 912, the results will be stored in one of the latches 394. For those bit lines that stored indication that two neighbors are in state C in step 904 and one or more neighbors are in state C in step 908, it is assumed that that bit line has two or more neighbors in state C. For those bit lines that did not store an indication in step 906 that two or more neighbors are in state C but did store an indication that one or more neighbors are in state C in step 910, it is assumed that those bit lines have one neighbor in state C.

Figure 18:
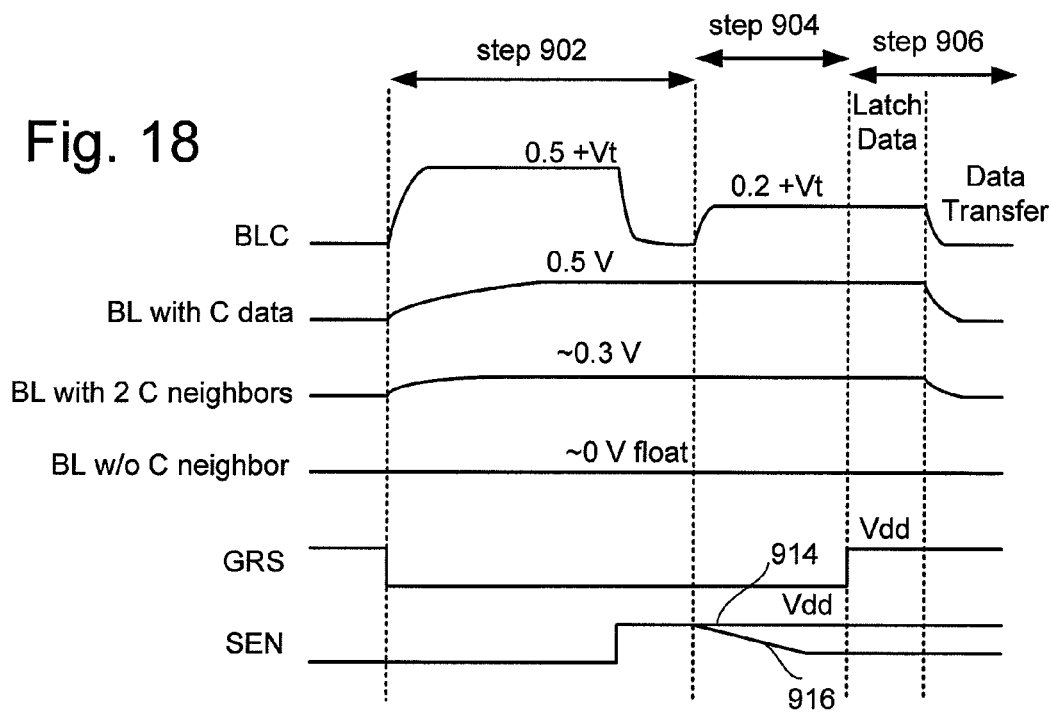
FIG. 18 is a timing diagram describing one embodiment of a process for sensing data from a neighboring bit line.

FIG. 18 is a timing diagram that graphically depicts some of the operations performed in the process of FIG. 17. The timing diagram is broken up into three time periods corresponding to steps 902, 904 and 906. During step 902, it is seen that the signal BLC is raised to 0.5 volts plus the threshold voltage for transistor 612. This is done for all bit lines that are coupled to a memory cell connected to the selected word line and in state C. Those bit lines are shown to be raised to 0.5 volts. Bit lines then with two C neighbors are coupled to the two corresponding neighbor bit lines such that the bit lines are raised to 0.3 volts. A bit line with no C neighbor will stay at 0 volts. During this timeframe the signal GRS is low. BLC is then lowered down to 0 volts and subsequently raised to 0.2 volts plus the threshold voltage for transistor 612, at which time the bit lines are sensed (step 904). Those bit lines next to two state C neighbors will not discharge the SEN node (see line 914). Those bit lines that did not have two state C neighbors will discharge the SEN node (see line 916). After latching the data in the appropriate bit line latch 382, the data will be transferred to the data latches 394.

Figure 19:
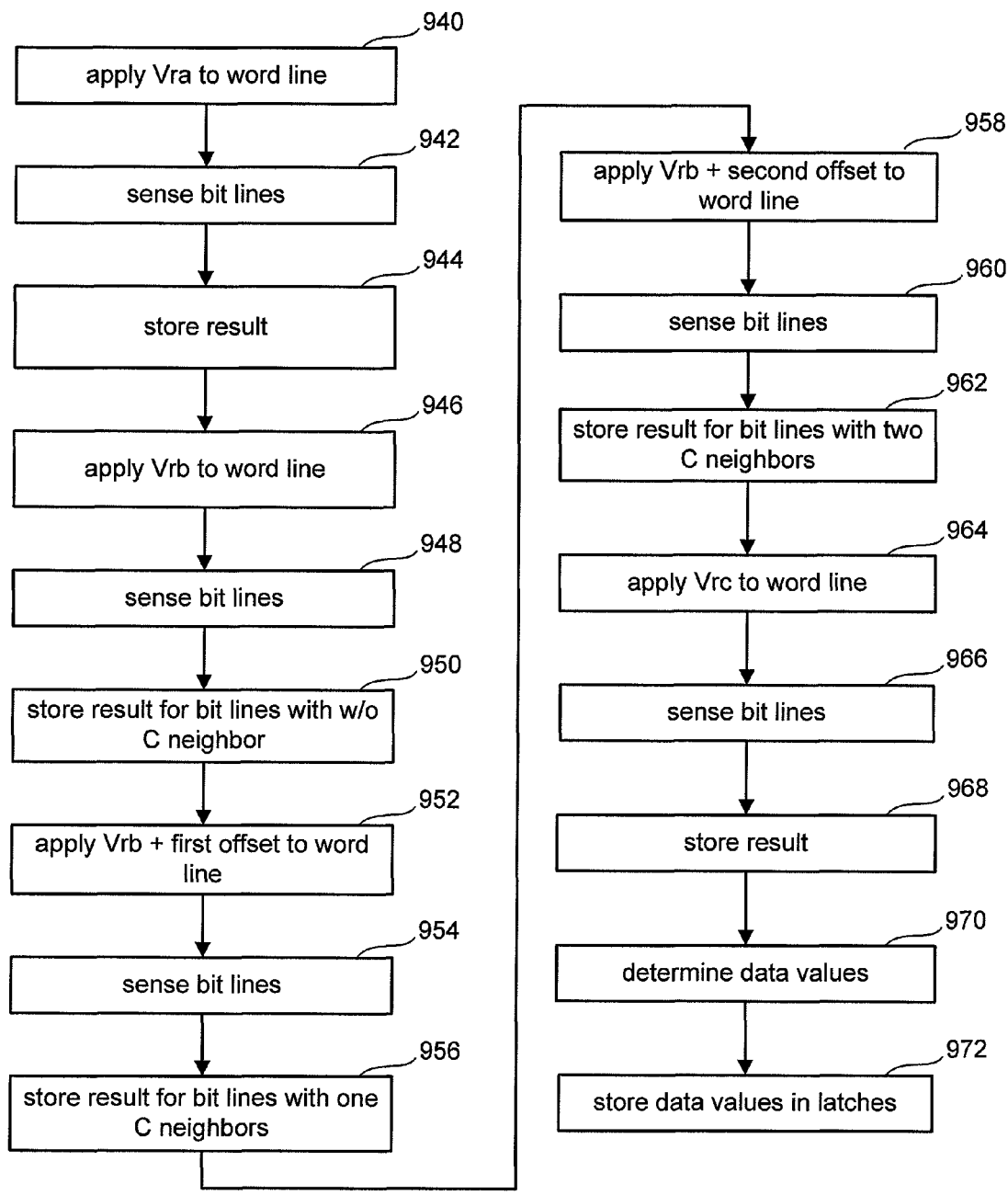
FIG. 19 is a flow chart describing one embodiment of a read process.

FIG. 19 describes one embodiment of a read process which can include providing compensation for memory cells having one or more C neighbors. The process of FIG. 19 provides more details of one embodiment of step 804 of FIG. 15 and step 862 of FIG. 16. Additionally, steps 940-950 and 964-972 can be used to implement step 842 of FIG. 16. The process of FIG. 19 can be performed for a page of data that encompasses a word line and all bit lines, or a subset of bit lines. In step 940 of FIG. 19, read reference voltage Vra is applied to the appropriate word line associated with the page. This causes the read reference voltage Vra to be applied to the control gates for the memory cells connected to that word line. In step 842, the bit lines associated with the page are sensed to determine whether the addressed memory cells conduct or do not conduct based on the application of Vra to their control gates. Bit lines that conduct indicate that the memory cells turned on; therefore, the threshold voltages of those memory cells are below Vra (e.g., in state E). In step 944, the results of the sensing for the bit line is stored in the appropriate latches for those bit lines.

In step 946, read reference voltage Vrb is applied to the word lines associated with the page being read. In step 948, the bit lines are sensed as described above. In step 950, results are stored in the appropriate latches for those bit lines connected to memory cells in the page that do not have a neighbor memory cell in state C.

This embodiment attempts to correct for data in state A that is next to memory cells in state C. The error that can be caused is that the memory cells will have an apparent threshold voltage that is increased so that it appears to be in state B, when it is actually in state A. In step 952, Vrb plus a first offset is applied to the word lines associated with the page being read. In line 954, bit lines are sensed as described above. In step 956, the results are stored in the appropriate latches for those bit lines connected to memory cells in the page that have one neighboring memory cell in state C. In step 958, Vrb plus a second offset is applied to the word line associated with the page being read. In step 960, the bit lines are sensed as described above. In step 962, the results are stored in the appropriate latches for those bit lines connected to memory cells in the page having two neighboring memory cells in state C.

In step 964, read reference voltage Vrc is applied to the word line associated with the page being read. In step 966, the bit lines are sensed as described above. In step 968, the results are stored in the appropriate latches for all the bit lines. In step 970, the data value for each memory cell in the page (or other unit of data) is determined. For example, if a memory cell conducts at Vra then the memory cell is in state E. If the memory cell conducts at Vrb (or Vrb plus first offset or Vrbt plus second offset) and Vrc, but not at Vra, then the memory cell is in state A. If the memory cell conducts at Vrc but not at Vra or Vrb (or Vrb plus either offset), then the memory cell is in state B. If the memory cell does not conduct at Vra, Vrb (or Vrb plus either offset) or Vrc, then the memory cell is in state C. In one embodiment, data values are determined by processor 392. In step 972, processor 392 will store the determined data values in the appropriate latches for each bit line. In other embodiments, sensing the various levels (Vra, Vrb, and Vrc) may occur in different orders.

The amount of the first offset and second offset is dependent on the particular implementation. The invention described herein does not depend on any particular value for the first offset or second offset. In one embodiment, the first offset is 0.1 volts and the second offset is 0.2 volts; however, other values as appropriate may also be used.

Instead of correcting for the capacitive coupling between neighboring memory cells on different bit lines during the read process, the compensation can also be performed at the time of programming. Since the system will know the data at the time of programming, the system can intentionally program memory cells to state A with a slightly lower threshold voltage if that memory cell has one or more of its neighbors assigned to be programmed to state C. This way that state A memory cell will be read correctly after the neighbor assigned to state C has finished programming.

One solution for achieving tight threshold voltage distributions without unreasonably slowing down the programming process is to use a two phase programming process. The first phase, a coarse programming phase, includes attempts to raise the threshold voltage in a faster manner and paying relatively less attention to achieving a tight threshold voltage distribution. The second phase, a fine programming phase, attempts to raise a threshold voltage in a slower manner in order to reach the target threshold voltage while achieving a tighter threshold voltage distribution. An example of coarse/fine programming methodology can be found in U.S. Pat. No. 6,888,758 incorporated herein by reference in its entirety.

In one example of a coarse/fine programming method, the process uses two verify levels: a target verify level (also called a fine verify level) and a coarse verify level. The process will start by performing the coarse phase of the programming process. When the threshold voltage of the memory cell reaches the coarse verify level, which is below the target verify level, the memory cell will enter the fine programming phase by raising the bit line voltage to a value greater than 0 volts and less than the inhibit voltage. During the coarse phase, the bit line voltage will be at approximately 0 volts. To inhibit a memory cell from programming, the bit line voltage is raised to the inhibit voltage (e.g., Vdd). During the fine programming phase, programming is slowed, as compared to the coarse programming phase, due to the affect that the bit line voltage is raised from 0 volts to an intermediate value. Therefore, the change in threshold voltage per program step is likely to be smaller during the coarse programming phase. The memory cell will remain in the fine programming phase until the threshold voltage for the memory cell has reached the target threshold voltage. When the threshold voltage of the memory cell reaches the target threshold voltage, the bit line voltage is raised to Vdd (or other inhibit voltage) to inhibit further programming of that memory cell.

Figure 20:
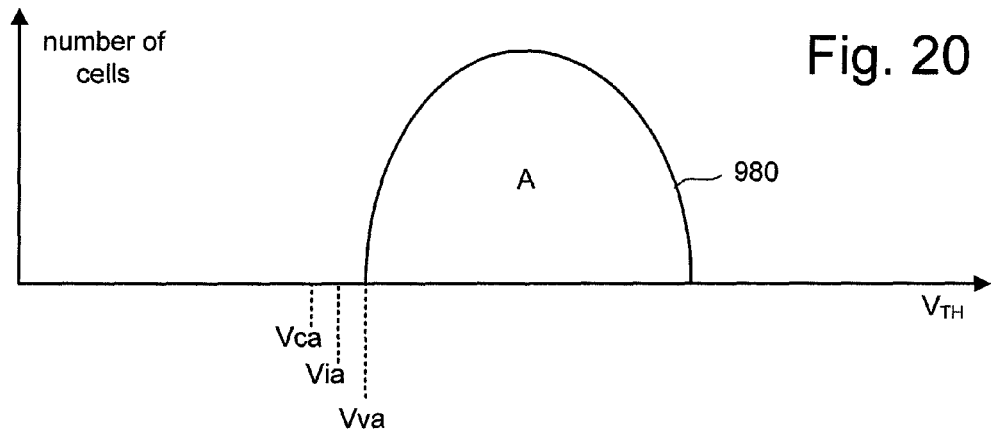
FIG. 20 depicts a distribution of threshold voltages for a programmed state.

The proposed method for programming that includes correcting for the coupling between neighboring memory cells on different bit lines will use the above-described coarse/fine programming process; however, three verify levels will be used instead of two. For example, FIG. 20 shows threshold voltage distribution 980 for state A. The target voltage used for verification is Vva. The prior art method for coarse/fine programming discussed above has a coarse verification level noted as Vca. The proposed scheme includes adding a third verification level Via to be used as discussed below. In summary, during the coarse programming phase, memory cells will be programmed until the threshold voltage reaches Vca. Those memory cells that require compensation because they are being programmed to state A and are next to memory cells that are to be programmed to state C, will be programmed in the fine phase until the threshold voltage reaches Via. Other memory cells will be programmed in the fine phase until their threshold voltage reaches Vva. Thus, memory cells in state A that have neighbors in state C are likely to have lower threshold voltages, possibly even below target threshold voltage distribution 980. The coupling, therefore, will cause the threshold voltages of those memory cells to be raised into threshold voltage distribution 980.

Figure 21:
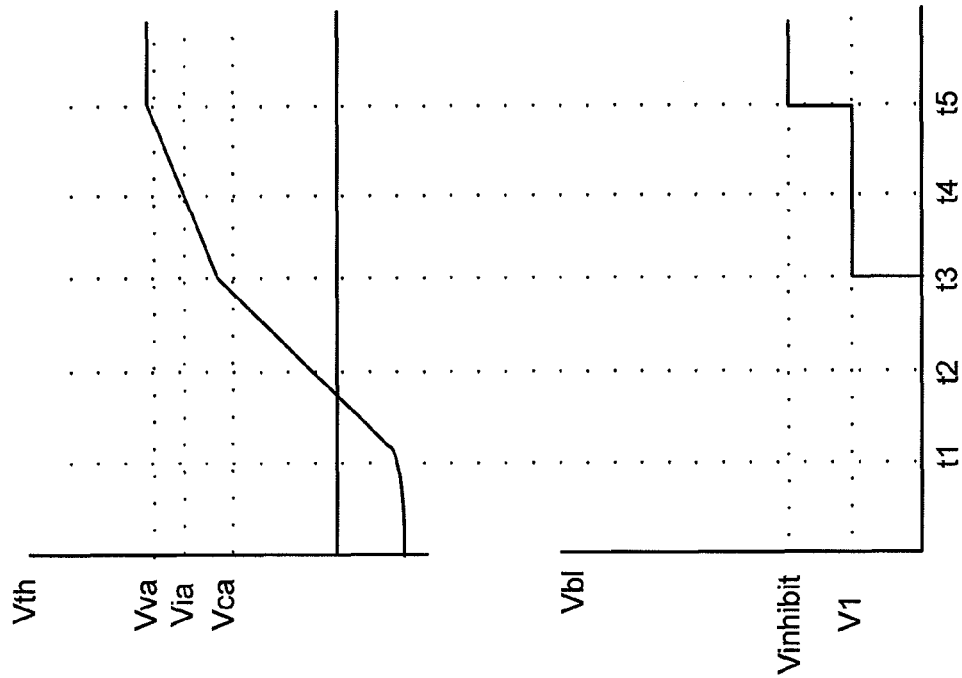
FIG. 21 is a graph that describes one embodiment of a programming process.

FIG. 21 provides graphs of a threshold voltage versus time and bit line voltage versus time to indicate one example of coarse/fine programming for memory cell that did not need compensation because neither its neighbors are in state C. The graphs assume that at times t1, t2, t3, t4 and t5 a programming pulse is applied to the control gate for the memory cell. At the pulses associated with t1, t2 and t3, the threshold voltage of the memory cell is increased. At time t3 the memory cell's threshold voltage becomes higher than Vca. Therefore, the coarse programming phase is over and the fine programming phase begins. The bit line voltage is raised accordingly from 0 volts to intermediate voltage V1 (e.g., one volt). The application of the intermediate voltage V1, as opposed to 0 volts, slows down the programming process for that bit line. At time t5, when the threshold voltage of the memory cell is greater than Vva, the bit line voltage will be raised to an inhibit voltage (e.g., Vdd).

Figure 22:
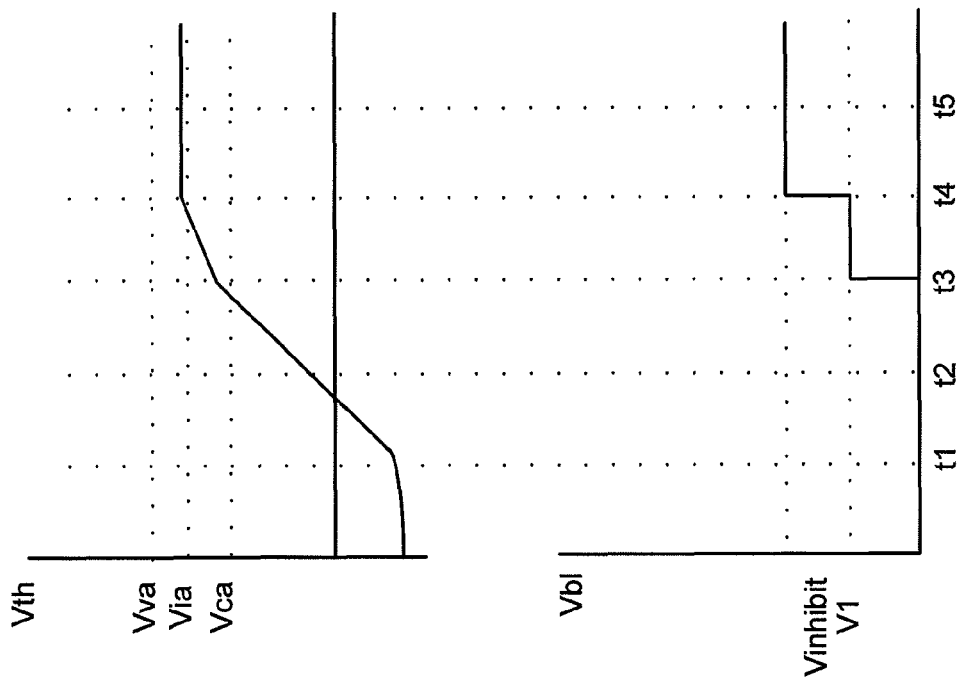
FIG. 22 is a graph that describes one embodiment of a programming process.

FIG. 22 shows graphs for a memory cell that does require compensation because one or more of its neighbors are in state C and this memory cell is being programmed to state A. At time t3, the threshold voltage of memory cell has increased to reach Vca; therefore, the bit line voltage is raised to intermediate voltage V1. At time t4, the threshold voltage of the memory cell reaches Via, which is greater than Vca and less than Vva; therefore, the memory cell is locked out from further programming by raising the bit line voltage to Vdd.

Note that in other embodiments, multiple intermediate voltages can be used in addition to V1. For example, memory cells receiving compensation may use one intermediate bit line voltage and memory cells not receiving compensation may use another intermediate bit line voltage. In other embodiments, different bit lines may use different intermediate voltages.

FIG. 23 is a flowchart describing one embodiment of a process for programming according to the graphs of FIGS. 21 and 22. In step 700, a "data load" is issued by the controller and received by the control circuitry. In step 1002, the address data designating the page address is input to decoder 314 from the controller or host. In step 1004, a page of program data (or other unit of data) for the addressed page is input to a data buffer for programming. That data is latched in the appropriate set of latches. In step 1006, a "program" command is issued by the controller to state machine 312. In step 1008, a determination is made regarding whether to compensate for coupling. For example controller 350, control circuitry 310, sense block 400 or another component will determine if a particular memory cell will need to receive compensation during the programming process because the particular memory cell is being programmed to state C and one or more (or two or more) of its neighbors will be programmed to state C. Since controller 350 and control circuitry 310 are aware of all the program data, in one embodiment, the system will automatically know whether compensation is necessary. In other embodiments, each of the data latches for each bit line will know the data to be programmed. Therefore, sense modules 400 can perform steps 908, 910 and 912 of FIG. 17 to determine whether any of the bit lines have neighbors with data to be programmed in state C. If so, those bit lines that have such neighbors are marked for compensation. In one embodiment of FIG. 23, there is only one compensation value provided to a memory cell with one or more neighbors in state C. In other embodiments, different compensation of values can be provided depending on whether there is one neighbor in state C or two neighbors in state C.

In step 1010 of FIG. 23, the initial pulse is set to its initial value, the program counter is set to its initial value, and the bit line voltage is set to its initial value. For memory cells to be programmed, the bit line voltage will be set at 0 volts. For memory cells that will not be programmed, the bit line will be set at Vdd. An indication of the initial voltage can also be stored in a latch. In some embodiments, the initial bit line value can be applied during program pulse step 1012 (discussed below).

In step 1012, a program pulse is applied to the appropriate word line. In step 1014, a verification process is performed. If the memory cells are in the coarse programming phase, then the verification process of step 1014 will be used to determine whether the memory cells' threshold voltages have reached the coarse verification level. If the memory cells are in the fine programming phase, the threshold voltage for the memory cell will be compared to either the target threshold voltage (e.g., Vva) or the intermediate verification level (e.g., Via) for those memory cells that require compensation. More details of step 1014 will be provided below. In step 1016, it is determined whether the status for all the memory cells to be programmed is such that they have all been verified. If they all have been verified then a successful programming process is reported in step 1018. If they have not all been verified, then in step 1020 the program counter PC is checked against a program limit value PC max. If the program counter PC is not less than PC max, then the program process has failed and a status of fail is reported in step 1022. If the program counter is less than PC max, then the program voltage (Vpgm) magnitude is increased by the step size and the program counter PC is incremented in step 1024. After step 1024, the process loops back to step 1012 to apply the next Vpgm pulse.

Figure 24:
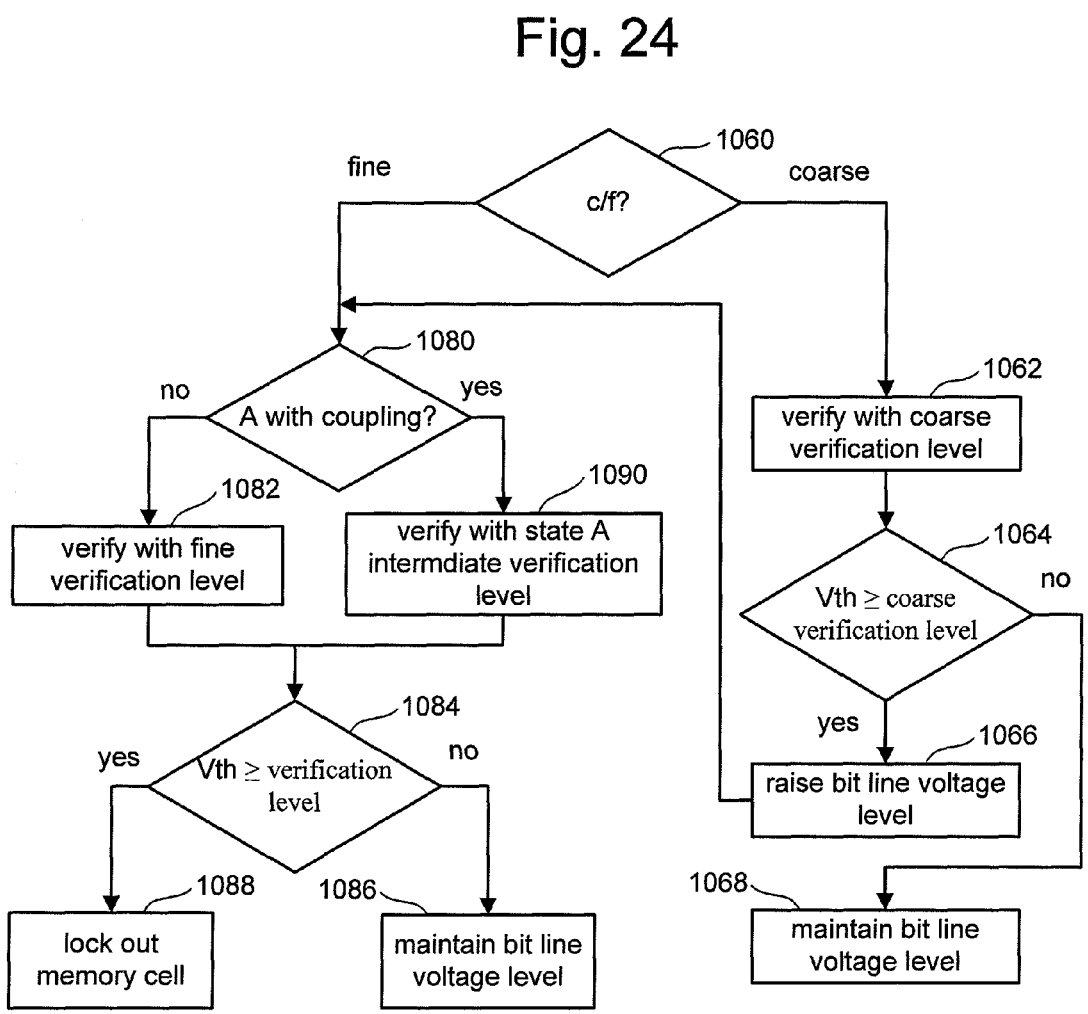
FIG. 24 is a flow chart describing one embodiment of a process for verifying.

FIG. 24 is a flowchart describing one embodiment of the verification step 1014 of FIG. 23. In step 1060, the system determines whether the memory cell is in the coarse programming phase or fine programming phase. Note that the process of FIG. 23 describes the high level process performed for a group of memory cells (e.g., a page of memory cells connected to a common word line). The process of FIG. 24 is performed individually for each particular memory cell being programmed. In one embodiment, the sense blocks will be provided with a latch to store an indication of whether a particular memory cell is in the coarse or fine programming phase. If the memory cell is in the coarse programming phase then a verification process will be performed with the coarse verification level (e.g., Vca) in step 1062. That is, the sense amplifier will be used to determine whether the memory cell's threshold voltage has reached the appropriate coarse verification level. For example, if the memory cell is being programmed to state A, the sense amplifier will test whether the memory cell's threshold voltage has reached Vca, as described above. If the threshold voltage has reached the coarse verification level (step 1064), then the memory cell has completed the coarse programming phase. Therefore, at step 1066, the bit line voltage is raised to intermediate voltage V1 so that the memory cell will enter the fine programming phase at the next programming pulse. After step 1066, the process will continue at step 1080 (discussed below) to determine whether the threshold voltage also exceeded the fine verification level (or intermediate verification level is appropriate). If the threshold voltage of the memory cell has not reached a coarse verification level, then the bit line voltage will remain at the current level in step 1068 so that the memory cell will continue the coarse programming phase.

If, in step 1060, it is determined that the memory cell is in the fine programming phase, then in step 1080 it is determined whether the memory cell is being programmed to state A and needs compensation for coupling. If not, the verification process is performed in step 1082 using the fine verification level (e.g., the target verification level Vva, Vvb or Vvc). If compensation is needed, then in step 1090 a verification process is performed using the intermediate verification level Via. If the threshold voltage of the memory cell is above the appropriate verification level (step 1084), then the memory cell is locked out from further programming in step 1088 by raising the bit line voltage to Vdd. If the threshold voltage of the memory cell is not above the verification level (step 1084), then the bit line voltage is maintained at its current level in step 1086 and the fine programming phase will continue.

Figure 25:
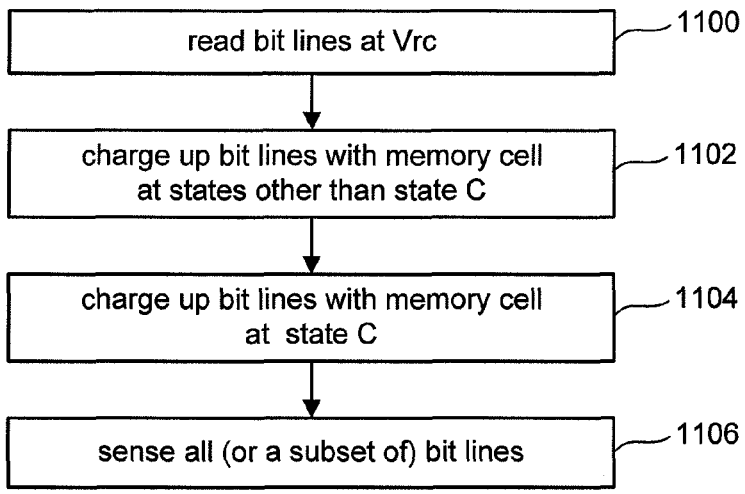
FIG. 25 is a flow chart describing one embodiment of a process for reading data.
Figure 26:
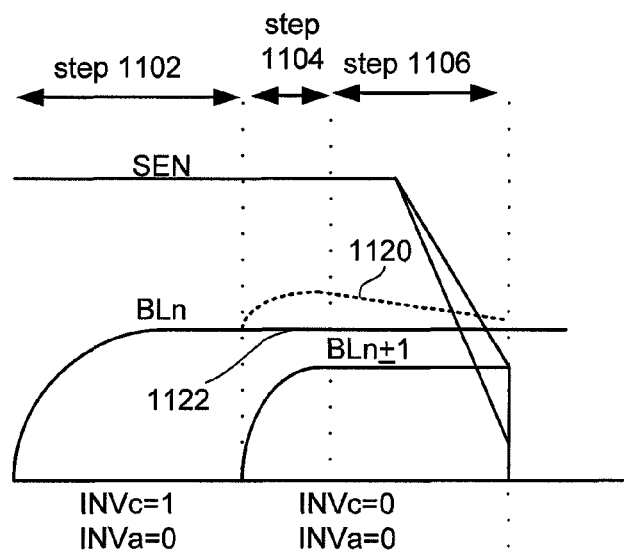
FIG. 26 is a timing diagram describing one embodiment for reading data.

The cells floating gate to floating gate coupling effect can be corrected during program sequence, as described above. It can also be corrected during read operations. The following discussion describes a read sequence which incorporates the bitline to bitline coupling effect as a modification factor to the sensing process, so that the read can be modified according to the neighbor memory cell states. FIGS. 25 and 26 explain an embodiment of a process for reading data that allows for providing compensation to certain memory cells experiencing coupling from neighboring memory cells. In step 1100, all bit lines are read to determine whether the memory cells connected to those bit lines and to the selected word line are in state C. This is performed by performing a read operation using Vrc as the read compare point. Those bit lines having a memory cell in state C will latch an indication that the memory cell is in state C. The read operation is shown in FIG. 18. In step 1102, those bit lines with memory cells in states other than state C will be charged-up. In one embodiment, those bit lines are charged to 0.5 volts. After the bit lines are charged in step 1102, those bit lines that are connected to a memory cell in state C are charged to between 0.25 and 0.4 volts in step 1104. Charging the bit lines connected to a memory in state C in step 1104 will couple up the bit lines charged in step 1102 to a voltage higher than 0.5 volts. For example, FIG. 26 shows bit line BLn representing those bit lines that do not have the memory cell in state C. The graph shows the bit line being charged up during step 1102 to 0.5 volts. Bit line BLn+1 is connected to a memory cell in state C and BLn+1 is a neighbor to BLn. During step 1104, bit line BLn+1 is charged to some approximately 0.4 volts. Bit line BLn will then be coupled to a higher voltage than 0.5, as depicted by dashed line 1120. Those bit lines not next to a neighbor that were charged in step 1104 will remain at 0.5 volts, as depicted by line 1122. In step 1106 of FIG. 25, all the bit lines (or a subset of bit lines) will be sensed. The bit lines with a C neighbor will be sensed to have a higher bit line voltage. Because of the higher the bit line voltage, the bit line will conduct more current which gives the appearance of a lower threshold voltage. This will compensate for coupling between neighboring cells. The cells with C neighbors are coupled to a higher floating voltage than its original program level after their neighbors are programmed. This read with floating gate to floating gate coupling compensation will correctly read back the original program levels of the cells. This read correction is done without the time penalty from multiple read operations. One read operation obtains the results for memory cells that need correction and memory cells which do not need correction.

In one embodiment described above, there can be several sensing strobes as cell source noise is being removed. The process described above with respect to FIGS. 25 and 26 can be applied during all sending strobes or during the later sensing strobes. For example, in one embodiment with two strobes, the first strobe may not use the process of FIGS. 25 and 26, while the second strobe may use the process of FIGS. 25 and 26.

The above description describes processes for compensating for floating gate coupling during programming and during reading. In some embodiments, compensation can be performed during both programming and reading. In most embodiments, however, compensation will either be performed during programming or during reading, but not during both. The decision whether to perform the compensation during reading or during programming can be made based on the use of the memory system. For example, if the memory system is going to be used in a host where data will be programmed very few times but read many times, it may be better to compensate during programming. Alternatively, if the host will program many times and read very few times, then it is better to perform the compensation during the read process.

In one embodiment, the memory system can be manufactured to include technology for performing compensation during the read process and during the programming process. At some point during or after the manufacturing process, the memory system can be configured so that it will perform the compensation either during the read process only or during the programming process only.

Figure 27:
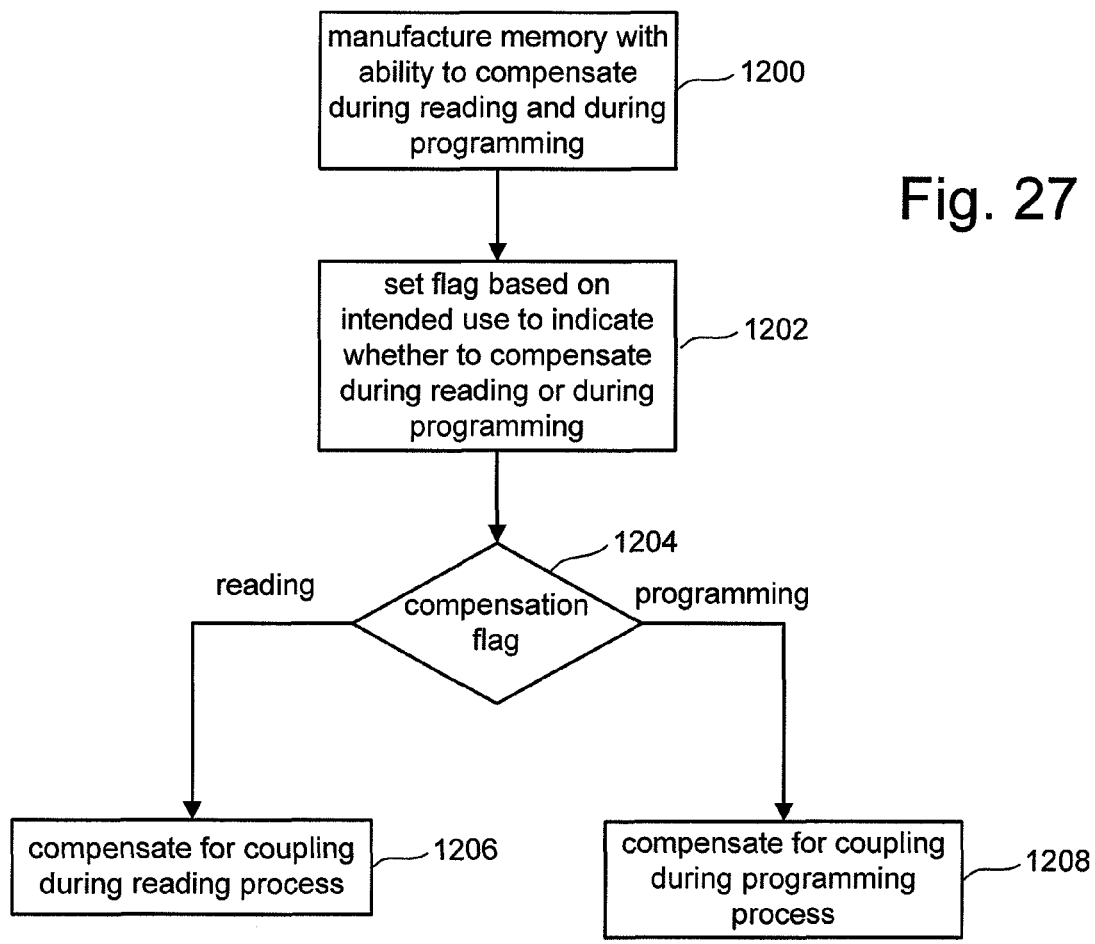
FIG. 27 is a flow chart describing one embodiment of a process configuring and using a memory system.
Figure 28:
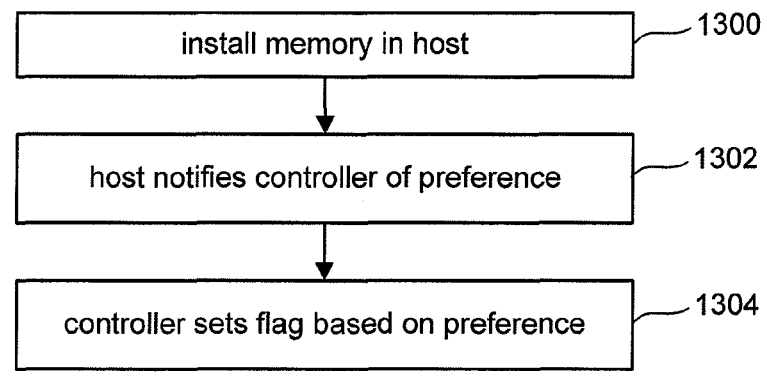
FIG. 28 is a flow chart describing one embodiment of a process for configuring a memory system.

FIG. 27 provides a flowchart describing a process for configuring a memory system so that it will perform the compensation either during the read process or during the programming process. In step 1200, the memory system is manufactured with the ability to perform compensation during reading and to perform compensation during programming. This may include manufacturing the semiconductor wafer. Optionally, step 1200 could also include packaging the wafer using processes known in the art. The package may or may not have a switch to perform the configuration described above. Technology for adding such a switch connected to a storage element on the integrated circuit is known in the art. In step 1202, a flag (compensation flag) that is part of the memory system manufactured in step 1200 is set based on the intended use to indicate whether the compensation should be performed during reading or whether the compensation should be performed during programming. The flag can be set during the manufacturing process, after the manufacturing process, during the testing process or while the device is being used. In step 1204, while using the device, the system will check the compensation flag. If the compensation flag was set to perform compensation during reading, then in step 1206 the memory system will provide the compensation for coupling during the read process. If the compensation flag is set for programming, then the memory will provide compensation for coupling during the programming process (step 1208).

The flag can be set in step 1202 in many different ways. During the manufacturing or testing process, a ROM fuse can be set to either indicate that compensation should be performed during reading or during programming. In other embodiments, other means (e.g., a memory cell in the non-volatile array, a flip flop, or other storage device) for storing indication of a flag can be implemented and/or set during the manufacturing process, or later. The flag can also be set during the testing process or during use. Additionally, the packaging for the integrated circuit could include a switch that can be set by the user prior to insertion of a memory card into a host.

In some embodiments, the compensation flag can be set in step 1202 after the memory system is inserted into the host. FIGS. 28-31 provide examples of such a configuration. In step 1300 of FIG. 28, the memory system is installed in the host. Examples of a host can include a digital camera, music player, mobile telephone, handheld computing device, or other computing device. For example purposes, consider that a music player may read a lot more often than program. Therefore, a music player may provide compensation during programming. On the other hand, a digital camera may program more often, therefore, it may be more appropriate to provide the compensation process during the read process. In step 1302 of FIG. 28, the host will notify the controller of its preference. That is, the host will be preprogrammed to know that it can tell the controller using a known protocol when it wishes to perform the compensation. In step 1304, the controller will receive the preference from the host and set the compensation flag (stored in a memory cell or other storage device) based on that preference received from the host.

Figure 29:
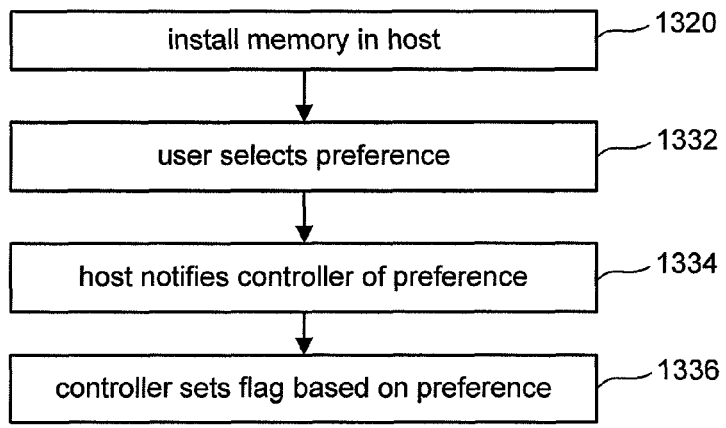
FIG. 29 is a flow chart describing one embodiment of a process for configuring a memory system.

FIG. 29 provides a flowchart of another embodiment for configuring a memory system. In step 1320, the memory system is installed in the host. In step 1332, a user can select a preference. In one embodiment, the user will select a preference by moving a mechanical switch or selecting a preference in a user interface of the host. For example, a user of a digital camera may select to perform compensation during reading and a user of a music playing device may elect to perform compensation during programming. In step 1334, the host notifies the controller of that preference. In step 1336, the controller sets the compensation flag based on the preference received from the host.

Figure 30:
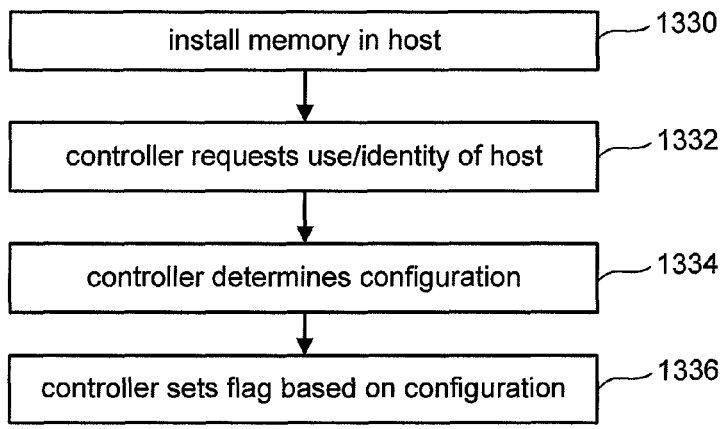
FIG. 30 is a flow chart describing one embodiment of a process for configuring a memory system.

FIG. 30 provides a flowchart describing another embodiment of a process for configuring a memory system. In step 1330, the memory system is installed in a host. In step 1332, the controller requests that the host identify itself. For example, the host may indicate that it is a digital camera, music player, PDA, cell phone, etc. The controller will receive that information and access a table of host information in step 1334. The table will identify for each model or type of device how to set the compensation flag. Based on that table and the received information from the host, the controller will choose a configuration (e.g., choose whether to perform compensation during read or program). In step 1336, the controller will accordingly set the flag based on the configuration determined in step 1334.

Figure 31:
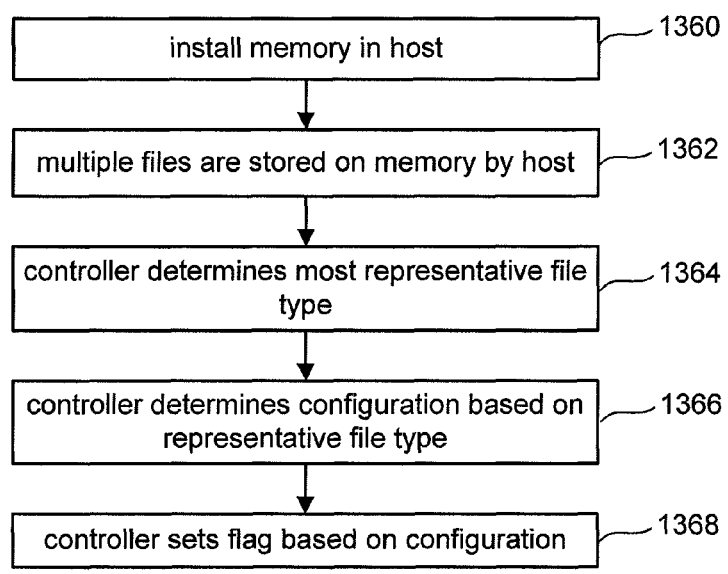
FIG. 31 is a flow chart describing one embodiment of a process for configuring a memory system.

FIG. 31 is a flowchart describing another embodiment of a process for configuring a memory system. In step 1360, the memory system will be installed in a host. Step 1362, the host will cause multiple files to be stored in the memory system. After a predetermined amount of time, after a predetermined amount of files have been stored in the memory system or upon command from the host or user, the controller will determine the most representative file type stored on the memory system in step 1364. For example, if ten files are stored and eight of them are music files, the controller will determine that the most representative file is a music file. At step 1366, the controller will determine the configuration based on the representative file type. For example, a table can be stored in the memory system which lists file types and for each file type a value will be stored for the compensation flag. The value of the flag can indicate whether to perform compensation during programming or reading. In step 1368, the controller will set the compensation flag based on the configuration determined in step 1366.

Compensation During Programming for Perturbation Due to Charges in Neighboring Cells Cell-To-Cell's Floating Gate Coupling (the "Yupin Effect")

As described earlier, the charge programmed into the charge storage element of one memory cell produces an electric field that perturbs the electric field of a neighboring memory cell. This will affect the characteristics of the neighboring memory cell which essentially is a field-effect transistor with a charge storage element. In particular, when sensed the memory cell will appear to have a higher threshold level (or more programmed) than when it is less perturbed.

In general, if a memory cell is program-verified under a first field environment and later is read again under a different field environment due to neighboring cells subsequently being programmed with different charges, the read accuracy may be affected due to coupling between neighboring floating gates in what is referred to as the "Yupin Effect". With ever higher integration in semiconductor memories, the perturbation of the electric field due to the stored charges between memory cells (Yupin effect) becomes increasing appreciable as the inter-cellular spacing shrinks.

Correction for BL-BL and WL-WL Yupin Effects During Read

As described in earlier sections, one way is to compensate for the BL-BL Yupin effect during read operations. It is a look-ahead ("LA") technique where the programmed states of cells on the neighboring bit lines are first noted and are used to make appropriate compensation when reading the current cell on the current bit line. To read the data of a neighboring cell, additional sensing is performed at the bit line of the current cell. Based on the detected data on neighboring bit lines, an appropriate amount of compensate is used when sensing the current cell.

Correction for WL-WL Yupin effect during read is essentially what has been referred to as the Look-Ahead ("LA") read. The LA reading scheme has been disclosed in U.S. Pat. No. 7,196,928 and United States Patent Application Publication No. US-2006-0221714-A1 published on October, 2006, entitled, "Read Operations for Non-Volatile Storage that Includes Compensation for Coupling," which entire disclosure is herein incorporated by reference. Read with the LA correction basically examines the memory states programmed into the cells on an adjacent word line and corrects any perturbation effect they have on the memory cells being read on the current word line. If the pages have been programming according to the preferred programming scheme described above, then the adjacent word line will be from the word line immediately above the current one. The LA correction scheme would require the data on the adjacent word line to be read prior to the current page.

An alternative, Direct LA scheme ("DLA") is disclosed in U.S. patent application Ser. No. 11/377,972 filed on Mar. 17, 2006, entitled, "System for Performing Read Operations on Non-Volatile Storage with Compensation for Coupling," which entire disclosure is herein incorporated by reference. The DLA scheme also makes correction to the reading of a cell in the current word line by taking into account the programmed state of the adjacent cell on the next word line. Instead of simply biasing the current word line during read, the correction is effected by biasing the adjacent word line in such a way that the resultant floating-gate coupling offsets the WL-WL Yupin effect errors.

While it is possible to correct for Yupin effect during read, the operation becomes increasing burdensome when the memory supports more and more memory states per cell. In a 2-bit or 4-state memory, there will already be at least 3 reads to determine the programmed states of the page on the current word line. If the data on the next word line is used to make compensation, the page on the next word line will also have to be read. So reading the current page on the current word line will also require reading the next page on the next word line.

Correction for Yupin Effect During Programming

In many ways it is preferable to correct for Yupin effect during programming although at the expense of reduced programming performance. Many memory devices are used in such a way that once the data is programmed, it is subsequently read many times with little or no updates. Thus, overall performance of the device is optimized by shifting the burden of correction to the programming side.

The Yupin effect more strongly affects adjacent cells, which can be across bit lines along a row (BL-BL Yupin effect) and across word lines along a column (WL-WL Yupin effect) of a memory array. It can be mitigated by minimizing the asymmetry in field environment for a cell between the time of program-verifying and a time of reading subsequent to the neighboring cells have been programmed.

There are several ways to reduce the Yupin effect during programming. One way is perform multi-pass programming in which programming for a page of memory cells along a word line is completed in more than one pass. Typically, at least two programming passes are performed. The first pass programs all cells in the page close to their respective target states using corresponding verify levels which are offset lower than what it should normally be for the target states. A subsequent pass completes the programming using the normal verify levels with no such offset. The Yupin effect on a cell is only contributed by the changes (i.e., programming) of neighbors subsequent to the programming of the cell. When the subsequent pass is performed with a minimum of change of charges among the floating gates, there will be a minimum in asymmetry in field environment between program-verify and subsequent read operations. Thus, the Yupin effect is minimized in the 2-pass programming technique. This technique can minimize BL-BL Yupin effect. As will be described later, it can also reduce WL-WL Yupin effect if the two passes are performed in a particular sequence when programming from word line to word line, One disadvantage of the above at least 2-pass programming scheme is that each programming requires at least two passes before the data is in place. In other word, the data is not valid and therefore not useful until the final pass is completed.

An alternative multi-pass programming scheme is to adopt a multi-bit coding such that each pass progressively programs one additional bit until all the bits are in place. In this way, each pass programs at least one bit of the multi-bit data and can store useful data without having to complete all the passes before the multi-bit data programmed into the cells becomes valid. To reduce the BL-BL Yupin effect, a coding is used that avoids large change in charges between each pass of binary programming. A preferred coding with such characteristics is given by the "LM" coding described earlier in connection with FIG. 14. The LM coding, while efficiently allowing each pass to store one bit of data nevertheless only reduces the Yupin effect by about 50%.

Verify Level Dependent on Both the Target Memory State and the Predetermined States of the Neighboring Cells According to a general aspect of the invention, perturbations due to charges on neighboring memory cells are compensated for during programming of a cell to a given target state by adjusting the verify level accordingly so that the correct target state will be read from the cell in spite of the perturbing charges that are subsequently programmed into neighboring memory cells.

This is accomplished by predetermining the memory states of the neighboring memory cells and adjusting the verify level as a function of the target state of the memory cell being programmed and the memory states of the neighboring memory cells. The scheme also has the advantage that programming will be completed in a single pass.

Figure 32:
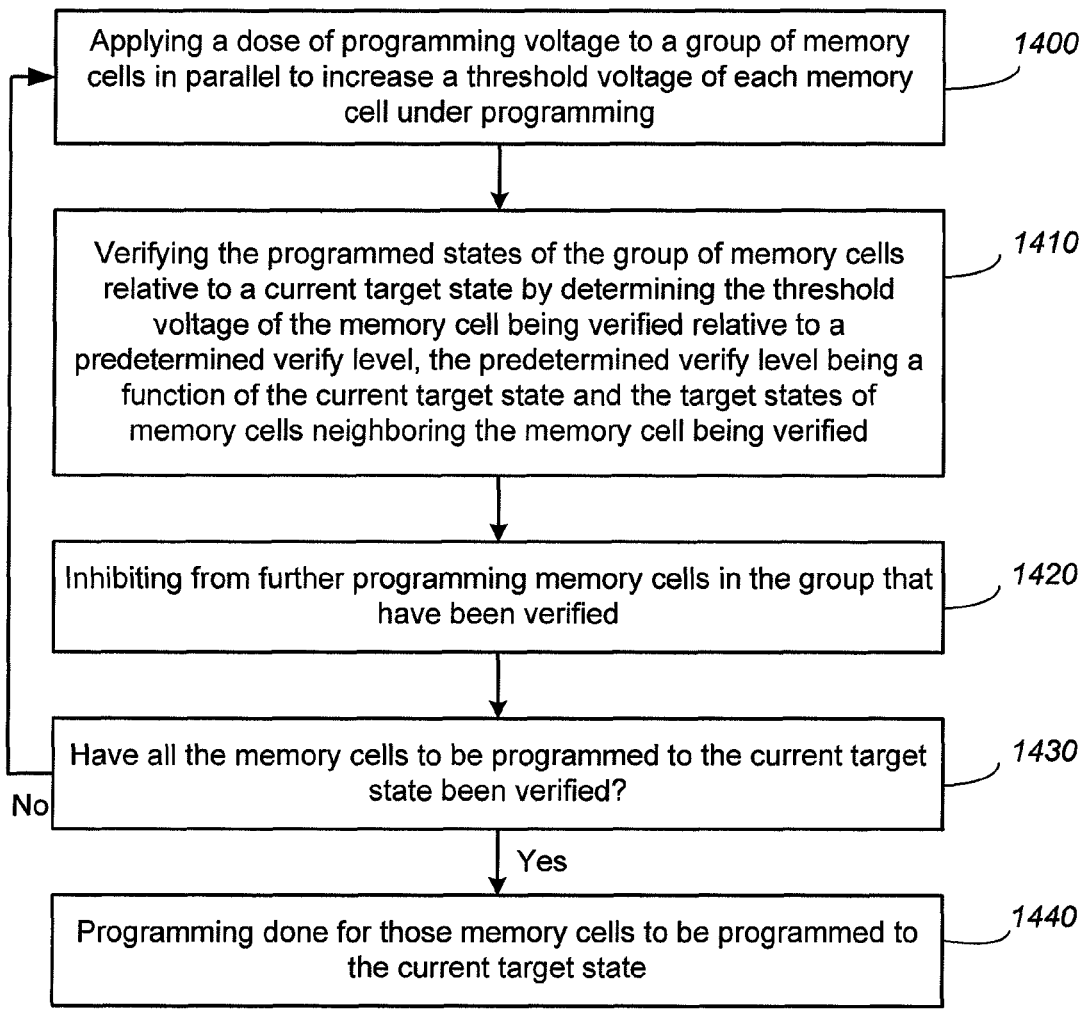
FIG. 32 is a flow diagram illustrating a method of compensating for Yupin effect during programming using data-dependent verify levels.

FIG. 32 is a flow diagram illustrating a method of compensating for Yupin effect during programming using data-dependent verify levels. It is essentially a one-pass programming scheme with data dependent verify levels.

STEP 1400: Applying a dose of programming voltage to a group of memory cells in parallel to increase a threshold voltage of each memory cell under programming.

STEP 1410: Verifying the programmed states of the group of memory cells relative to a given target state by determining the threshold voltage of the memory cell being verified relative to a predetermined verify level, the predetermined verify level being a function of the given target state and the target states of memory cells neighboring the memory cell being verified.

STEP 1420: Inhibiting from further programming memory cells in the group that have been verified.

STEP 1430: Have all the memory cells to be programmed to the given target state been verified? If so, proceeding to STEP 1440; otherwise, proceeding to STEP 1400.

STEP 1440: Programming done for those memory cells to be programmed to the given target state.

Figure 33:
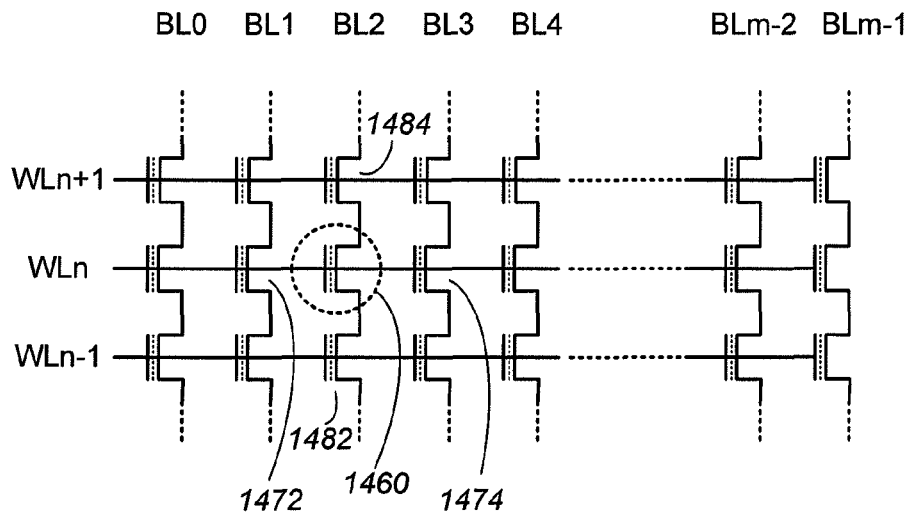
FIG. 33 illustrates a portion of a memory array suitable for illustrating the invention.

FIG. 33 illustrates a portion of a memory array suitable for illustrating the invention. For example, a page of memory cells connected by a word line WLn is being programmed in parallel. The Yupin effect on any one of the cells in the page, such as memory cell 1460 is mostly contributed by subsequent programming of neighboring cells adjacent to the memory cell 1460 being programmed. In particular, along the word line WLn, a left side neighbor is cell 1472 and a right side neighbor is cell 1474. Similarly, the programming cell 1460 is coupled to a sense amplifier (not shown) via a bit line BL2. Alone the bit line BL2, a neighbor below the programming cell 1460 on word line WLn−1 is cell 1482 and a neighbor on the WLn+1 word line above is cell 1484.

The neighbors to the memory cell 1460 can be in any one of possible memory states, each having a different amount of charge in its charge-storage element and therefore asserting different amount of perturbation. With four adjacent neighbors, the range of perturbation is given by the permutation of the possible memory states in these neighbors. In general the only relevant neighbors are those that will be programmed after the memory cell 1460 has completed programming. In practice, it is preferable to quantize the amount of perturbation seen by the memory cell 1460 and therefore the number of compensation levels into a manageable number. For example, the number of compensation levels may be coded by one bit where "0" may denote no compensation and "1" may denote a predetermined level of compensation. In another embodiment, two bits may be used to represent up to four possible compensation levels.

Predetermined Offset Verify Level Applied to the Current Word Line WLn

In one embodiment, the verifying is performed by sensing with a predetermined offset verify voltage level applied to the word line associated with the memory cell to be program-verified. For example, referring to FIG. 33, if the memory cell 1460 is being program-verified, the predetermined verify voltage level is applied to WLn.

Figure 34:
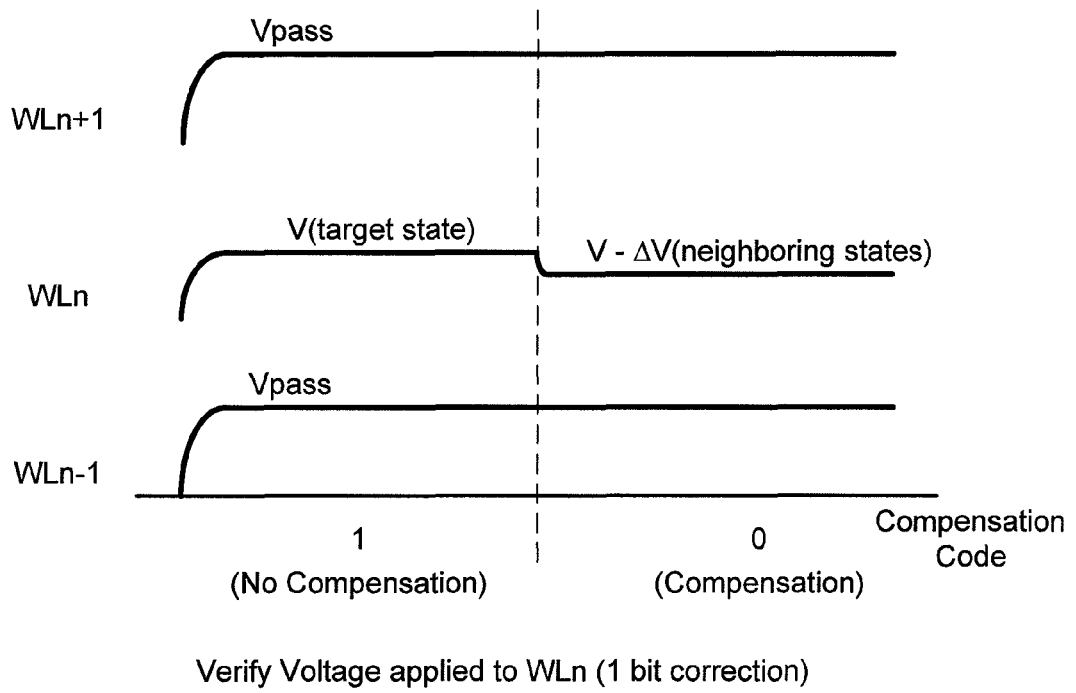
FIG. 34 illustrates adjusting the verify level on WLn during programming to compensate for perturbation during to neighboring charges.

FIG. 34 illustrates adjusting the verify level on WLn during programming to compensate for perturbation during to neighboring charges. The example shows two possible compensation levels coded by one bit. When the neighbors are less programmed with the total perturbation below a predetermined threshold, no compensation is employed. Therefore the verify voltage level applied to the WLn word line during verify sensing is the same as the normal V(target state), appropriate for programming cell such as cell 1460 to the target state (compensation code "1"). On the other hand, when the neighbors are in more programmed states with the total perturbation above the predetermined threshold, compensation is effected by offsetting the normal verify level lower by a predetermined offset voltage $\Delta V$, i.e., a voltage of V−$\Delta V$ is applied to WLn (compensation code "0".) The offset $\Delta V$ is a function of the neighboring states as denoted by $\Delta V$(neighboring states). The example in FIG. 34 is relevant to NAND memory where WLn is the selected word line among a NAND chain (see FIG. 2) and the rest of the unselected word lines will have a voltage Vpass applied to them during the verify operation. WLn−1 and WLn+1 are shown as two of the unselected word lines adjacent WLn.

In general, the offset is a function of how much perturbation from the neighbors which depends on the target states to be programmed thereto. The more programmed states there are, the more charges and perturbation there will be. The offset can be predetermined by initial testing and qualifying of the memory chip at the factory.

While the example in FIG. 32 shows a 1-bit compensation scheme, more refined schemes such as a 2-bit compensation scheme is possible. In the 2-bit case, there will be four possible voltage levels that can be applied to WLn, namely, V, (V−$\Delta V1$), (V−$\Delta V2$) and (V−$\Delta V3$).

Figure 35:
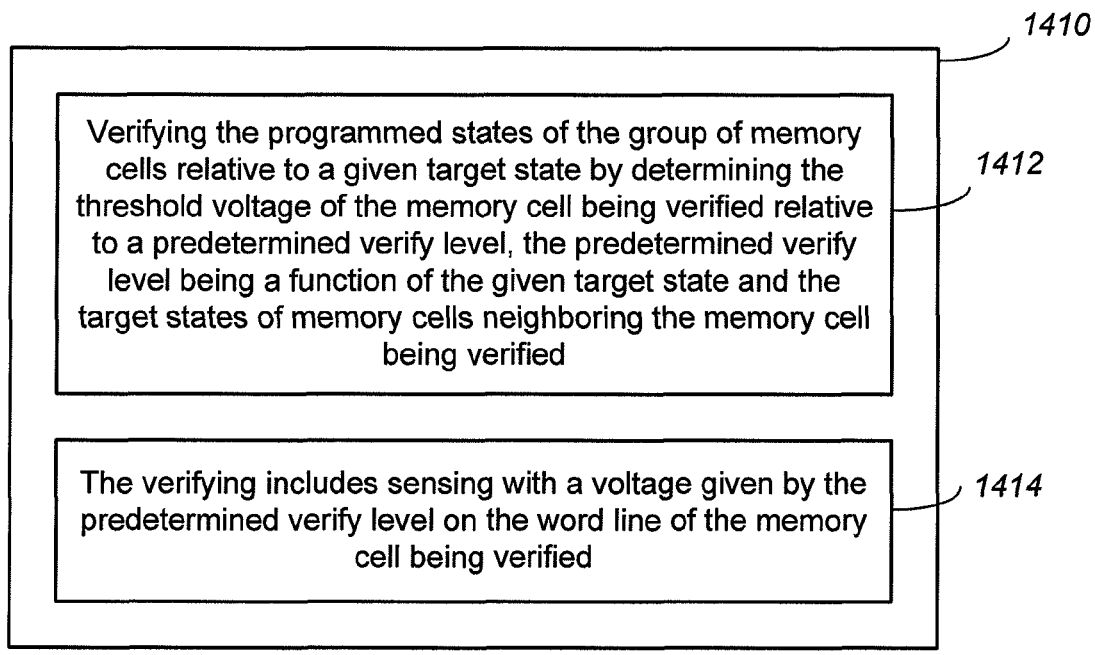
FIG. 35 is a flow diagram illustrating one embodiment of the verifying step shown in FIG. 32 in which the one-pass data-dependent verify level is applied only to the current word line.

FIG. 35 is a flow diagram illustrating one embodiment of the verifying step shown in FIG. 32 in which the one-pass data-dependent verify level is applied only to the current word line. The verifying STEP 1410 includes:

STEP 1412: Verifying the programmed states of the group of memory cells relative to a given target state by determining the threshold voltage of the memory cell being verified relative to a predetermined verify level, the predetermined verify level being a function of the given target state and the target states of memory cells neighboring the memory cell being verified; and STEP 1414: The verifying includes sensing with a voltage given by the predetermined verify level on the word line of the memory cell being verified.

If the memory cell to be programmed is part of a NAND chain (see FIG. 2), then the predetermined verify level will be applied to the word line associated with the memory cell being programmed. All other memory cells in the chain will have a pass voltage Vpass (while the cell at the far drain side could be at Vdd) applied to their associated word lines in order to turn them on.

With the 1-bit compensation scheme, verify during programming needs be preformed twice on the page for a given target state since the control gates of all cells of the page share the same word line WLn. For those cells in the page whose neighbors do not require compensation, a normal verify voltage level V is applied to WLn. For those cells that require compensation, an offset verify voltage level V-ΔV is applied to WLn.

It will be understood that in other embodiments, more compensation levels are contemplated. The different levels will be coded by more than one bit and the verify operation will have to be performed on different subsets of the page having different compensation levels. Once the compensation level for a cell under programming is determined, it is latched in the same column or sensing circuit of the cell for use during verify operations. As described earlier, those cells that fail to verify will be subject to further programming by the next programming pulse, whereas those that have been verified will be program-inhibited from further programming.

By adjusting the verify level as a function of the target state and the predetermined memory states of the neighboring memory cells during programming, Yupin effect due to existing or anticipated charges on neighboring cells is compensated for essentially in one programming pass. There is no need to program all the cells in a first pass close to their target states and then to complete the programming in a further pass preferably after the neighboring cells have been programmed. In practice, the programming may preferably employ more than one phase (e.g., coarse/fine phases) to increase performance, but there is no need to perform two separate passes at completely different times in order to mitigate the Yupin effect. Single-pass programming will allow for maximum programming performance and simpler programming sequence from word line to word line.

Issues with Operating with Lower Offset Verify Levels

In either case of single-pass or multi-pass programming scheme, verify levels are required to be offset lower in at least one of the passes. An issue may arise with using too low a verify level.

In general, the perturbation on a cell due to Yupin effect from its neighbors has the effect of raising the apparent threshold level of the cell. In other words, the cell appears to be more programmed than without the Yupin effect. Thus, the verify level would need to be lower than normal when taking the Yupin effect into account. This is particularly so with the two-pass programming scheme. The first pass will be fully impacted by the Yupin effect while the second completing pass will verify with less impact from the Yupin effect. Thus the first-pass verify level will need to be offset lower than normal to avoid "over-programming" due to a worst-case Yupin effect and to ensure a tight distribution for the population of threshold levels among the memory cells. However, as can be seen from the following explanation, the offset may be as low as 1V or more. This can pose operational difficulties during sensing or limit the number of memory states a memory cell can support.

Figure 36A:
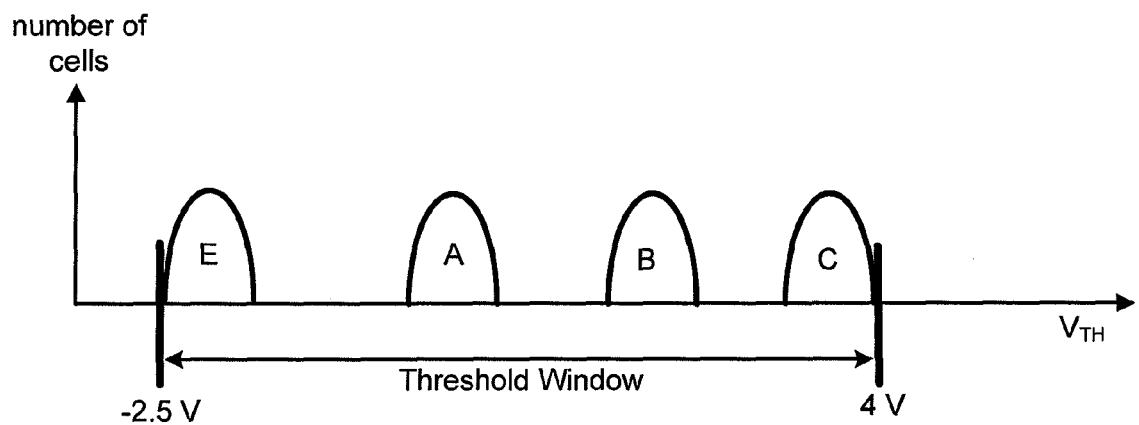
FIG. 36A illustrates an example of a typical population of memory cells supporting four memory states distributed in a threshold window in four distinct clusters.

FIG. 36A illustrates an example of a typical population of memory cells supporting four memory states distributed in a threshold window in four distinct clusters. Each cluster represents the population memory cells having one of the four memory states. The example shows a threshold window that ranges from −2.5 V to 4 V. In general, the lower limit of the threshold window is determined by the ability of the sense amplifiers to sense at negative voltages. On the other hand, the upper limit of the threshold window is determined by the limit of the high voltage transistor breakdown voltage and the floating gate's deterioration for retaining large amount of charges.

Figure 36B:
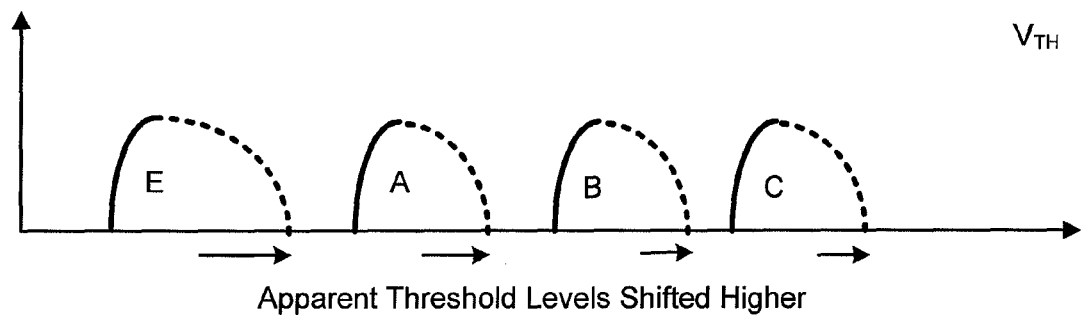
FIG. 36B illustrates the effect of highly programmed neighboring cells on the programmed threshold level of a cell currently being sensed.

FIG. 36B illustrates the effect of highly programmed neighboring cells on the programmed threshold level of a cell currently being sensed. This is the Yupin effect that increases the perceived threshold level of the current cell. For example, a highly programmed neighbor will have a substantial amount of charges programmed into its charge storage element (e.g., floating gate) and the effect of the neighboring charges will couple to the floating gate of the current cell being sensed. Each neighbor can raise the perceived threshold level of the current cell by as much as 350 mV. If the cell is perturbed by all four of its immediate neighbors (left, right, above and below), it can raise the perceived threshold level by over 1 V. Thus, depending on the programmed states of its neighbors, each cell may have its apparent threshold level shifted in a range from zero to some maximum volts. The net effect on each cluster is that its tail end is spread out towards the higher voltages.

Figure 37A:
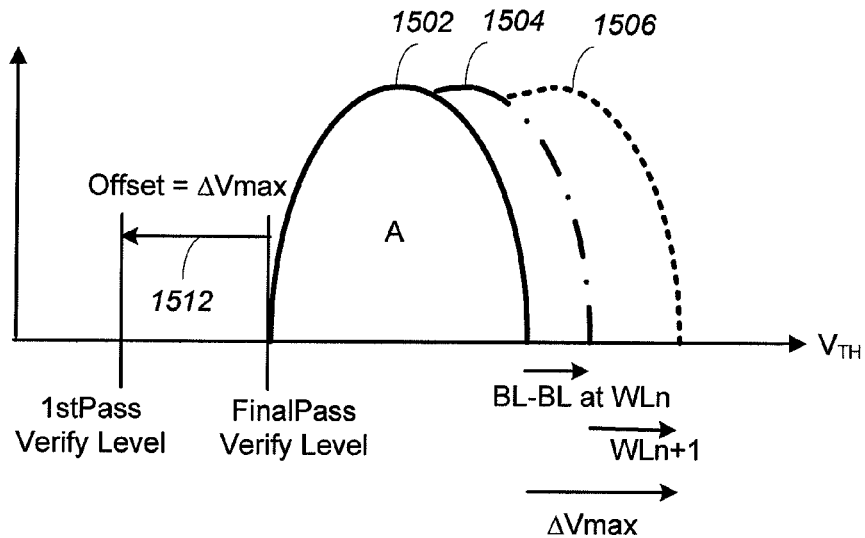
FIG. 37A illustrates the contribution of Yupin effect from different neighbors on a current cell being sensed.

FIG. 37A illustrates the contribution of Yupin effect from different neighbors on a current cell being sensed. The example shows the current cell being sensed to be from a population of memory cells that are in state "A". The population 1502 represents memory cells that are not subject to any neighboring perturbations. The tail end of 1502 is modified to 1504 when some cells of the population is perturbed by both its neighbors on adjacent bit lines being later programmed to the most programmed state (BL-BL Yupin effect). Similarly, the tail end of 1504 is further modified to 1506 when some cells of the population is also perturbed by its neighbor on the next word line (WLn+1) being later programmed to the most programmed state (WL-WL Yupin effect). Thus, it can be seen that the combination of both BL-BL and WL-WL Yupin effect can made a cell appear to have a higher threshold voltage level. For example, a worst-case BL-BL effect may shift the threshold voltage by 250 mV and a worst-case WL-WL effect from one neighbor may shift the threshold voltage by 350 mV and by 700 mV if from both sides. The combination may then amount from 600 mV to about 1 V.

As described earlier, in order not to "over program" due to the rise in apparent threshold level of a memory cell subject to Yupin effect, the verify level for a first pass of a multiple pass programming is set lower by an offset 1512 that substantially comprehends the worst-case Yupin effect. Thus for the first programming pass, to avoid possible "over programming" of the current cell as manifested by the perceived elevated threshold level due to highly programmed neighboring cells, the verify level for the first pass may have to be offset lower by as much as 1 V.

Figure 37B:
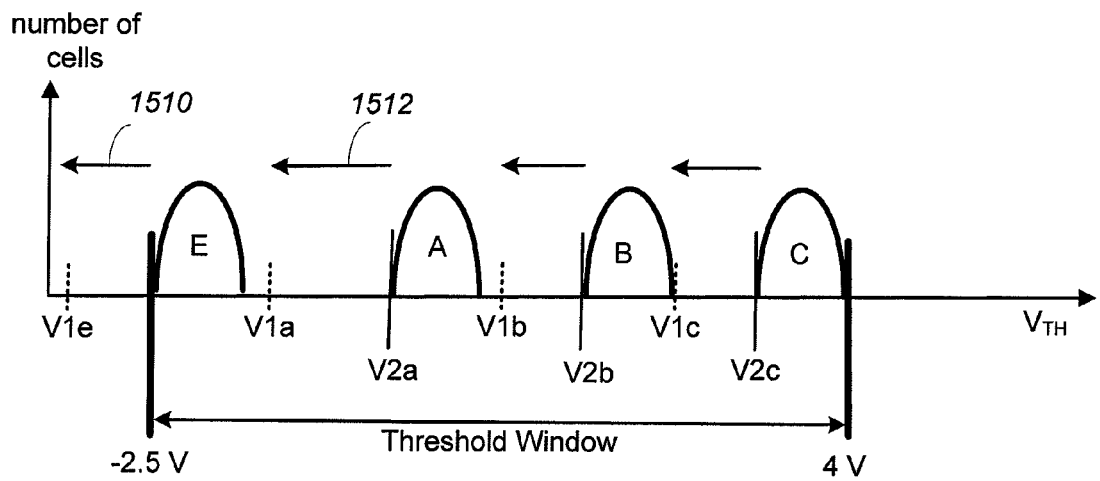
FIG. 37B illustrates the shifting of the verify levels for the first pass of a multiple pass programming to reduce the Yupin effect.

FIG. 37B illustrates the shifting of the verify levels for the first pass of a multiple pass programming to reduce the Yupin effect. For example, if there are two passes and the final pass employs the normal verify levels V2a, V2b and V2c respectively for states "A", "B" and "C", then the corresponding first-pass verify levels V1a, V1b and V1c for programming to each of these target states could be offset lower by predetermined amounts. For example, V1a is offset lower from V2a by a predetermined amount 1512 (see also FIG. 37A.)

The offsetting of the first-pass verify level in the multi-pass programming scheme, and to a smaller extend the lower verify level used to compensate for Yupin effect in the single-pass programming scheme, present a problem for the erased state "E". Generally, to maximize the extent of the threshold window in order to fit as many distinct states as possible, the erased state is place at the limit of the lower end of the threshold window. As explained earlier, this limit is controlled by the ability of the sense amplifiers to sense at negative voltages. For example, the lower limit may be at −2.5 V as shown. In practice, it is preferable to have a well-defined and tightly controlled distribution of erased cells. It is typically accomplished by soft programming after erase to form a tighter distribution. The soft programming would require program-verifying relative to a predetermined level for the erase state. However, with the requirement of an offset first-pass verify level, the offset 1510 may have a verify level shifted beyond the lower limit of the threshold window. While it is possible to shift all the clusters towards the more positive end to keep the offset within bounds, nevertheless, it will reduce the useful range of the threshold window.

Virtual Offset of Verify Level by Biasing Adjacent Word Line

According to another aspect of the invention, the adjusting of the verify level is effected virtually by biasing an adjacent word line accordingly so that when program-verified with the adjusted verify level, the correct target state will be read from the cell in spite of the perturbing charges that are subsequently programmed into neighboring memory cells. This has the advantage of avoiding using a real offset on the verify level of the cell being programmed, thereby avoiding the problem of possibly having the verify level shifted too low to require negative voltage sensing when verifying the lowest memory state.

As described earlier in connection with FIGS. 36A and 36B, using a verify level offset lower is undesirable. This aspect of the invention avoids the problem of using a lower than normal verify level by achieving the same effect with appropriate biasing of the adjacent word line WLn+1.

Figure 38:
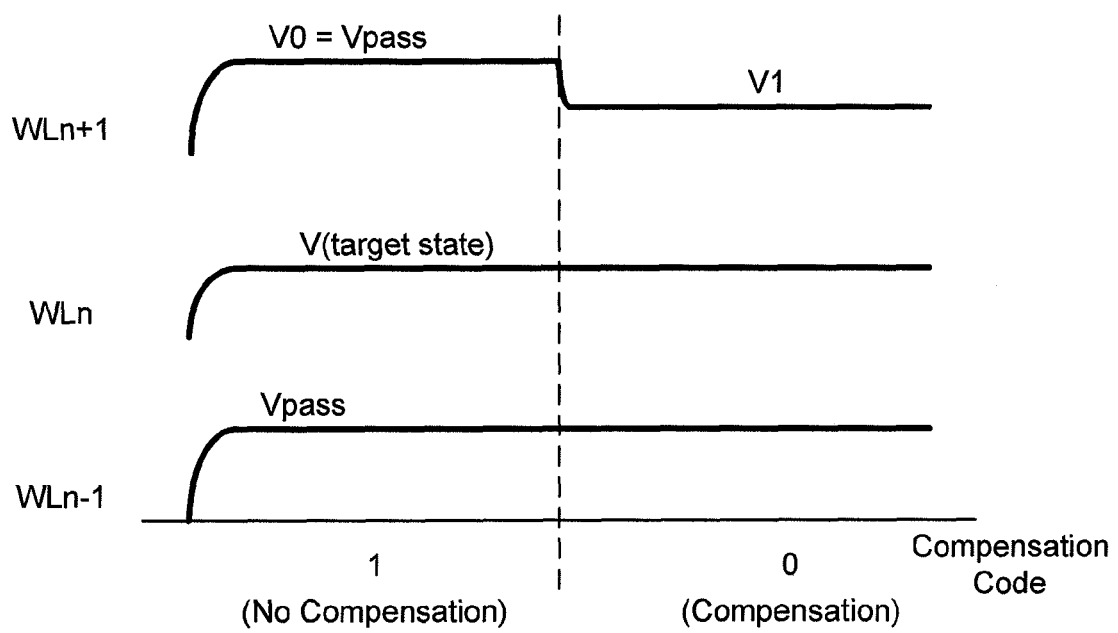
FIG. 38 shows the combination of a normal verify level on the word line under verifying and the biasing of an adjacent word line to effect a virtual offset to the normal verify level, according to the preferred embodiment.

FIG. 38 shows the combination of a normal verify level on the word line under verifying and the biasing of an adjacent word line to effect a virtual offset to the normal verify level, according to the preferred embodiment. The example shows two possible compensation levels coded by one bit applied to a NAND memory. In particular, WLn is the selected word line among a NAND chain (see FIG. 2) and the rest of the unselected word lines will have a voltage Vpass applied to them during the verify operation.

When the neighbors are less programmed with the total perturbation below a predetermined threshold, no compensation is employed (compensation code "1".) Therefore the verify voltage level applied to the WLn word line during verify sensing is the same as the normal V(target state), appropriate for programming cell such as cell 1460 to the target state (compensation code "1"). At the same time, the rest of the unselected word lines in the chain will have a voltage Vpass applied to them during the verify operation. WLn−1 and WLn+1 are shown as two of the unselected word lines adjacent WLn. In particular one of two voltages V0=Vpass is applied to WLn+1.

On the other hand, when the neighbors are in more programmed states with the total perturbation above the predetermined threshold, compensation is required (compensation code "0".) In this case, V1 which is less than V0 is applied to WLn+1. V1 is predetermined so that it has virtually similar effect as the configuration for compensation code "0" shown in FIG. 34. However, instead of offsetting the normal verify level lower and applying it to WLn (compensation code "0".) The equivalent scheme is to apply V1 which is Vpass offset lower on Wn+1.

Thus, with 1-bit compensation, the word lines voltage configuration is similar to a normal verify operation with V0=Vpass applied to the next word line WLn+1 when no compensation is required and V1 applied to the next word line when compensation is required. The voltage V1 may be regarded as Vpass−ΔV', where ΔV' is the extra biasing to produce the effect of the virtual offset on the normal verify level at WLn shown in FIG. 34. Preferably, the voltage on the adjacent word line is raised from the lower voltage V1 during verify of those cells with compensation to the higher voltage V0 during verify of other cells without compensation.

Figure 39:
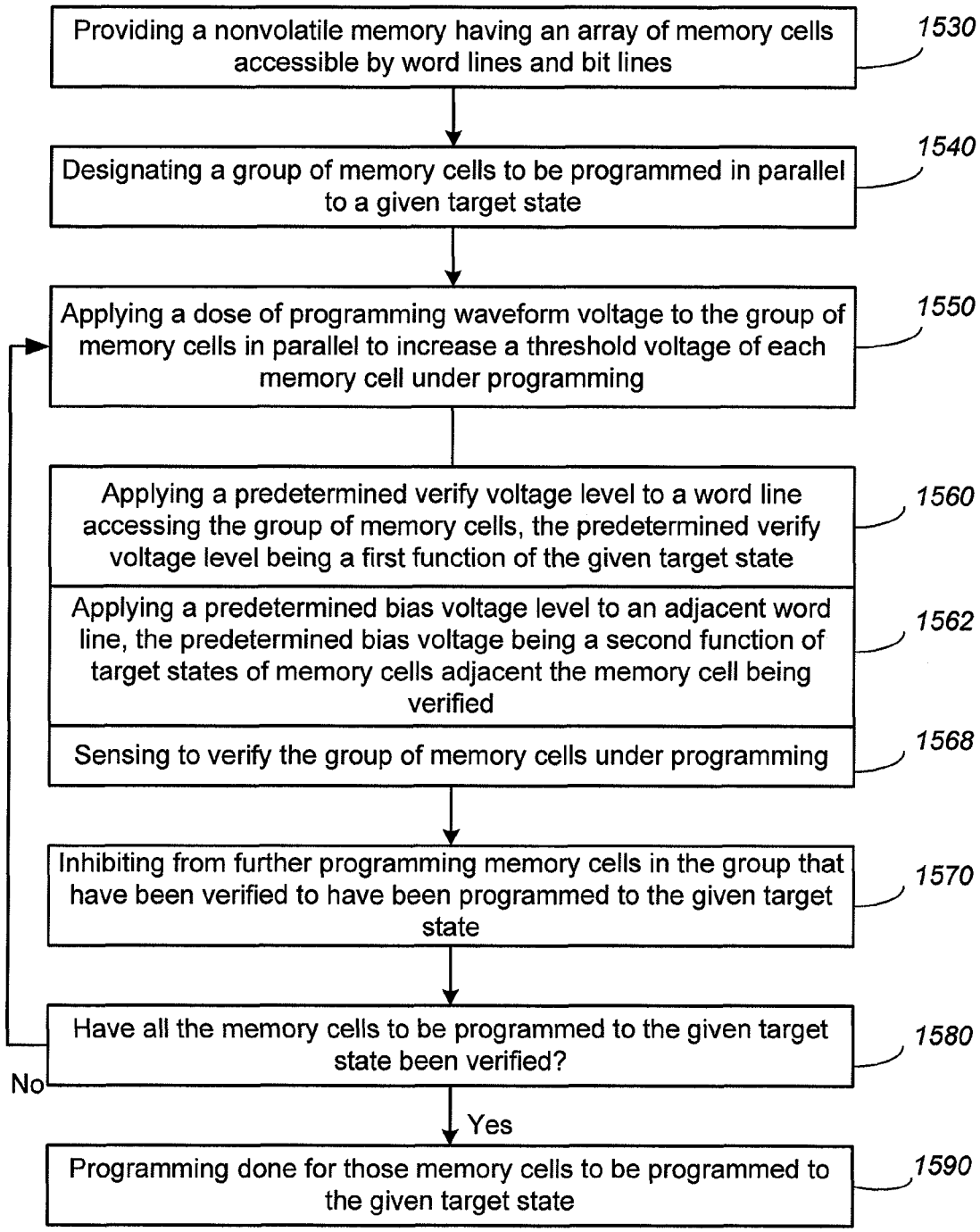
FIG. 39 is a flow diagram illustrating another preferred embodiment of the verifying step shown in FIG. 32 in which the one-pass data-dependent verify level is applied over both the current word line and the adjacent word line.

FIG. 39 is a flow diagram illustrating another preferred embodiment of the verifying step shown in FIG. 32 in which the one-pass data-dependent verify level is applied over both the current word line and the adjacent word line. The additional application of a bias voltage on the adjacent word line (e.g., WLn+1) has the effect of virtually offsetting the verify voltage level applied to the current word line (e.g., WLn.) This avoids the disadvantages associated with the lowering of the verify voltage described earlier. Indeed, the effect of virtual offsetting mimics the mechanism for WL-WL coupling effect and is therefore more accurate in modulating the WL-WL coupling effect.

STEP 1530: Providing a nonvolatile memory having an array of memory cells accessible by word lines and bit lines.

STEP 1540: Designating a group of memory cells to be programmed in parallel to a given target state.

STEP 1550: Applying a dose of programming waveform voltage to the group of memory cells in parallel to increase a threshold voltage of each memory cell under programming.

STEP 1560: Applying a predetermined verify voltage level to a word line accessing the group of memory cells, the predetermined verify voltage level being a first function of the given target state.

STEP 1562: Applying a predetermined bias voltage level to an adjacent word line, the predetermined bias voltage being a second function of target states of memory cells adjacent the memory cell being verified.

STEP 1568: Sensing to verify the group of memory cells under programming.

STEP 1570: Inhibiting from further programming memory cells in the group that have been verified to have been programmed to the given target state.

STEP 1580: Have all the memory cells to be programmed to the given target state been verified? If so, proceeding to STEP 1590; otherwise, proceeding to STEP 1540.

STEP 1590: Programming done for those memory cells to be programmed to the given target state.

Preferred Programming Scheme to Reduce WL-WL Yupin Effect by Half

As for WL-WL Yupin effect where the perturbations are between memory cells on adjacent word lines, it is mitigated during programming using a preferred programming scheme. This will effectively reduce the perturbation by half. The remaining half can also be corrected using one or a combination of the various compensation schemes during program or read operations described earlier.

U.S. Pat. No. 6,781,877 discloses a programming scheme in which WL-WL Yupin effect is also reduced by programming the pages in the memory array in an optimal order.

A preferred programming scheme would have the pages associated with the word lines programmed in an optimal sequence. For example, in the case of binary memory where every physical page holds a page of binary data, the pages are preferably programmed sequentially along a consistent direction, such as from bottom to top. In this way, when a particular page is being programmed, the pages on the lower side of it are already programmed. Whatever perturbative effects they may have on the current page, they are being accounted for as the current page is being program-verified in view of these perturbations. Essentially, the sequence of the programming the page should allow the current page being programmed to see a minimum of changes around its environment after it has been programmed. Thus, each programmed page is only perturbed by the pages on the upper side of it and the WL-WL Yupin effect is effectively reduced in half by this programming sequence.

In the case of a memory where each physical page of memory cells is multi-state and the resulting multiple logical data pages are programmed in different passes, the sequence is less straight forward. For example in a 2-bit memory encoding 4 memory states, each physical page associated with a word line can be regarded as a single page of 2-bit data from each cell or two separate logical pages, lower and upper-bit of 1-bit data each from each cell. The physical page can therefore be programmed with each cell programmed directly to its target state among the 4 states corresponding to the 2-bit code. Alternatively each of the two bits can be programmed separately, first with the low-bit page and then later with the upper-bit page. When the logical pages of each physical page are to be programmed separately a modified optimal sequence is possible.

Figure 40:
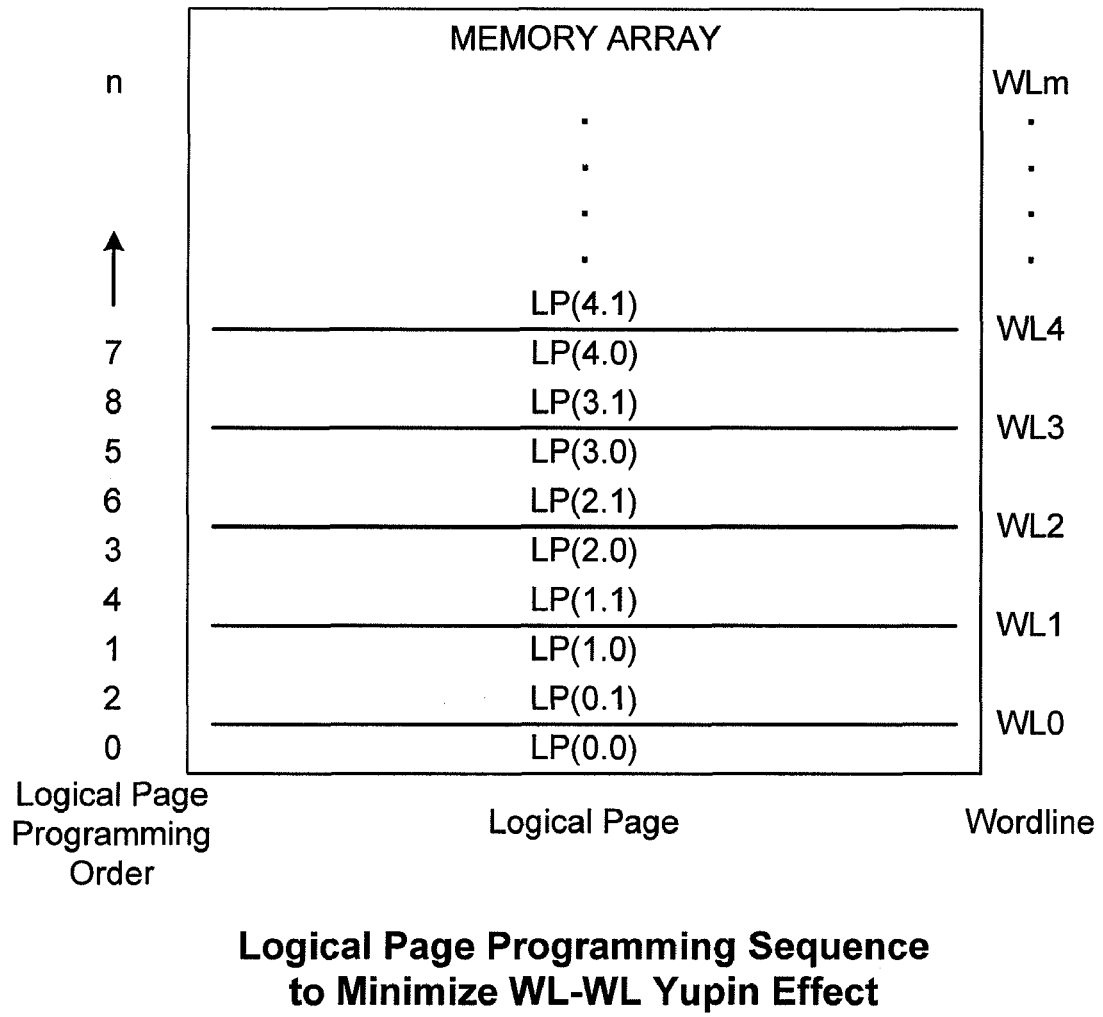
FIG. 40 illustrates an example of a memory having 2-bit memory cells and with its pages programmed in an optimal sequence so as to minimize the Yupin Effect between memory cells on adjacent word lines.

FIG. 40 illustrates an example of a memory having 2-bit memory cells and with its pages programmed in an optimal sequence so as to minimize the Yupin Effect between memory cells on adjacent word lines. For convenience the notation is such that the physical pages P0, P1, P2, ... reside respectively on word lines W0, W1, W2, .... For a 2-bit memory, each physical page has two logical pages associated with it, namely lower-bit and upper-bit logical pages, each with binary data. In general a particular logical page is given by LP(Wordline.logical_page). For example, the lower-bit and upper-bit pages of P0 on W0 would respectively be labeled as LP(0.0) and LP(0.1), and the corresponding ones on W2 would be LP(2.0) and LP(2.1).

Essentially, the programming of the logical pages will follow a sequence n so that the current page being programmed will see a minimum of changes around its environment after it has been programmed. In this case, again moving incrementally in one consistent direction from bottom to top will help to eliminate perturbation from one side. Furthermore, because each physical page may have two programming passes, as the programming moves up the physical pages, it will be better for the current upper-bit page to be programmed after its adjacent lower-bit pages have already been programmed so that their perturbative effects will be accounted for when programming the current upper-bit page. Thus, if programming starts from LP(0.0) then the sequence will be as earmarked by the page-programming order, 0, 1, 2, ... n, ... which would yield: LP(0.0), LP(1.0), LP(0.1), LP(2.0), LP(1.1), LP(3.0), LP(2.1), ....

Determination of Neighboring States for Programming with Data-dependent Verify Level As described earlier, in connection with FIG. 24, a preferred compensation scheme for BL-BL Yupin effect during program-verify is to adjust the program-verify level according to the programmed state of the neighboring states. In order to communicate the neighboring states to the column or bit line of the cell being programmed, the bit line of each neighbor is set to a predetermined voltage dependent on the programmed state of each neighbor. This predetermined voltage is detected in an additional sensing performed at the bit line of the cell being programmed and is then used to offset the program verify level.

In the case of the compensation for WL-WL Yupin effect during programming, the programmed states or data for neighboring word lines must be acquired and made available to the verifying or sensing circuit of the cell under verifying in order to offset the program-verify level accordingly.

If the programming is performed in a preferred order, say starting from a bottom word line in the memory array, then relative to a word line currently being programmed, the previous word line would has already been programmed. The page of data from the previous word line can simply be read and latched into the corresponding column latches. However, if the preferred programming order described in connection with FIG. 40 is adhered to, Yupin effect from the previous word line is already taken care of and there is no need to obtain it data to figure the compensation.

As for the data in the next word line yet to be programmed, there are a number of possibilities to acquire it.

Figure 41:
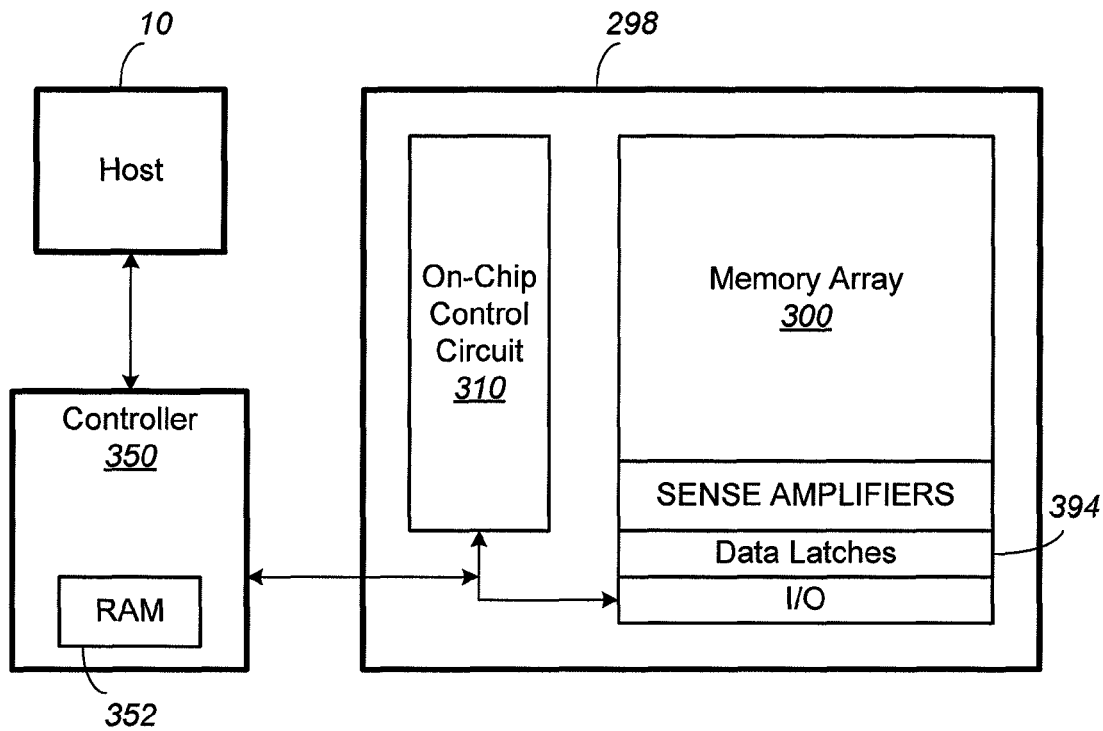
FIG. 41 illustrates a host in communication with the memory device shown in FIG. 5.

FIG. 41 illustrates a host in communication with the memory device shown in FIG. 5. The memory device includes a memory chip 298 and a controller 610. The memory chip 298 includes a memory array 300 and peripheral circuits such as sense amplifiers, data latches 394, I/O circuits and an on-chip control circuit 310. The on-chip control circuit 310 controls the operations of the memory chip. In many implementations, a host 10 communicates and interacts with the memory chip 298 via the controller 350.

The controller 350 co-operates with the memory chip and controls and manages higher level memory operations. For example, in a host write, the host 10 requests data to be written to the memory array 300 page by page. Each page of data is then sent to the controller 350, which in turn has it staged in the data latches 394 to be programmed into the memory array. In one implementation, at least two pages of data are received by the controller 350 and buffered in a controller RAM 352. As the first page is latched in the data latches 394 to be programmed into the current page in word line WLn, the next page of data intended for programming into the next page in word line WLn+1 is evaluated and those corresponding to a highly programmed state is also latched as a coded compensation level into corresponding data latches. In the preferred implementation, the logic and processor associated with each column will co-operate with the state machine to perform programming operation with the various verify schemes of the invention.

Figure 42:
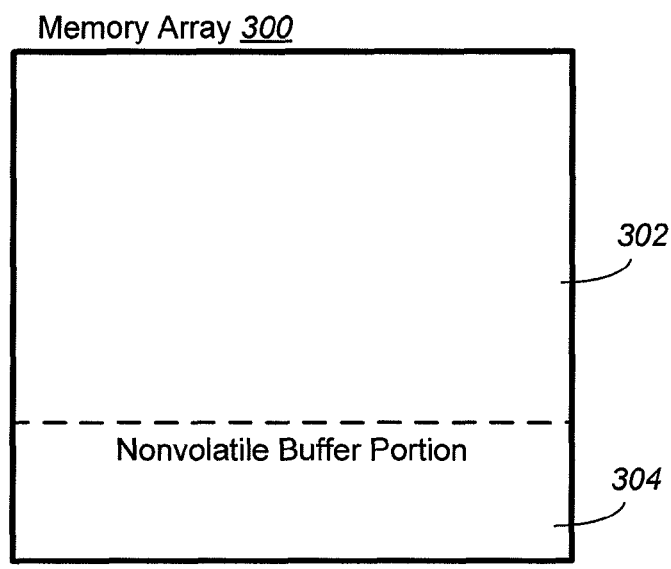
FIG. 42 illustrates another technique for obtaining the page of data for the next word line.

FIG. 42 illustrates another technique for obtaining the page of data for the next word line. A portion of the nonvolatile memory array 300 is partitioned into a regular portion 302 and a buffer portion 304. The regular portion 302 of the memory array typically stores multi-bit data. On the other hand, the memory cells in the buffer portion 302 are preferably configured to store binary data. In this way, the binary data can be programmed to the buffer portion at relatively higher speed and also without the need to correct for Yupin effect. Preferably, when data is first written to the memory, it is first written to the buffer portion 304. Later, at an opportune time, the data from the buffer portion 302 can be copied to the regular portion 302. Since the data to be programmed to the regular portion 302 can readily be read from the buffer portion 304, as the current page is being programming, the data for the next page is also available for consideration of compensation during program verify.

Compensating for Perturbation Due to Charges in Neighboring Cells for Erased Memory State As described earlier, when the pages of data are being programmed in a definite word line order, say from bottom to top, the lower adjacent word line WLn−1 will then be programmed before the current word line WLn and therefore will not have a Yupin effect on the cells of the current word line. Thus, when adjusting for verify level, the previously programmed word line WLn−1 need not be considered.

However, for those memory cells that remain in the erased state, even the programmed cells on the WLn−1 will have a Yupin effect on the erased cells on WLn. In other words, both of the adjacent neighbors on top Wn+1 and bottom Wn−1 will perturb the cell on WLn. This is because if the cell always remains in the erased state any adjacent neighbors that get programmed will be after the cell got to that state. Therefore, both will contribute to the change in field environment of the cell since it was erased.

The memory typically has its cells erased so that their threshold levels are reduced to a range at the far lower end of the threshold window. In the preferred embodiment, a soft programming operation is employed to program the more deeply erased cells to within a narrower range below a predetermined demarcation threshold level. The soft programming alternates with verifying relative to the predetermined demarcation threshold level. In this way, the soft programming and verifying help to tighten the distribution of the erased cells to a predetermined range just below the predetermined demarcation threshold level.

Figure 43:
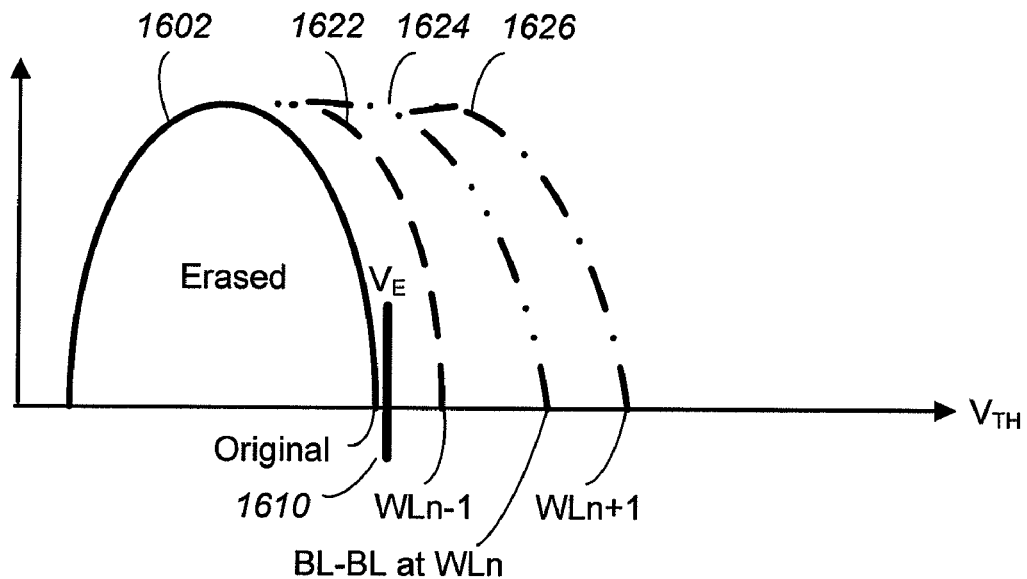
FIG. 43 illustrates a memory with a population of cells in erased state and how they may be affected by the Yupin effect.

FIG. 43 illustrates a memory with a population of cells in erased state and how they may be affected by the Yupin effect. The tightened erased population is represented by the solid distribution 1602 after the erased cells have been soft-programmed verified relative to a predetermined demarcation threshold level 1610 by application of a predetermined verify level $V_E$ on the word line of the cells. As discussed above, the programming of the page at WLn−1 will introduce WL-WL Yupin effect, resulting in the right tail of the distribution 1602 spreading toward higher levels as in the extended tail 1604. Similarly, the programming of the page at WLn will introduce BL-BL Yupin effect, resulting in the right tail of the distribution 1604 further spreading toward higher levels as in the extended tail 1606. Finally, the effect of programming the page on WLn+1 will further spread the right tail from 1606 to the extended tail 1608.

It is clear from FIG. 43 that due to neighbors that are programmed later that some erased cells may become so perturbed to have their threshold levels shifted to the programmed state region.

According to another aspect of the invention, erased memory cells are preferably "soft-programmed" after they have been erased. The "soft programmed" refers to programming the erased cells to a predetermined range of threshold levels relative to a predetermined threshold for demarcating between erased and programmed states. This is accomplished by alternately programming and verifying the erased cells relative to the predetermined threshold. Perturbations due to charges on neighboring memory cells are compensated for during the soft programming by adjusting the verify level accordingly so that the correct erased state will be read from the cell in spite of the perturbing charges that are subsequently programmed into neighboring memory cells.

This is accomplished by predetermining the memory states of the neighboring memory cells, including those on adjacent word lines on both sides of the word line of the cell being programmed, and adjusting the verify level by reducing the demarcation level with an offset, the offset being a function of the memory states of the neighboring memory cells.

Figure 44:
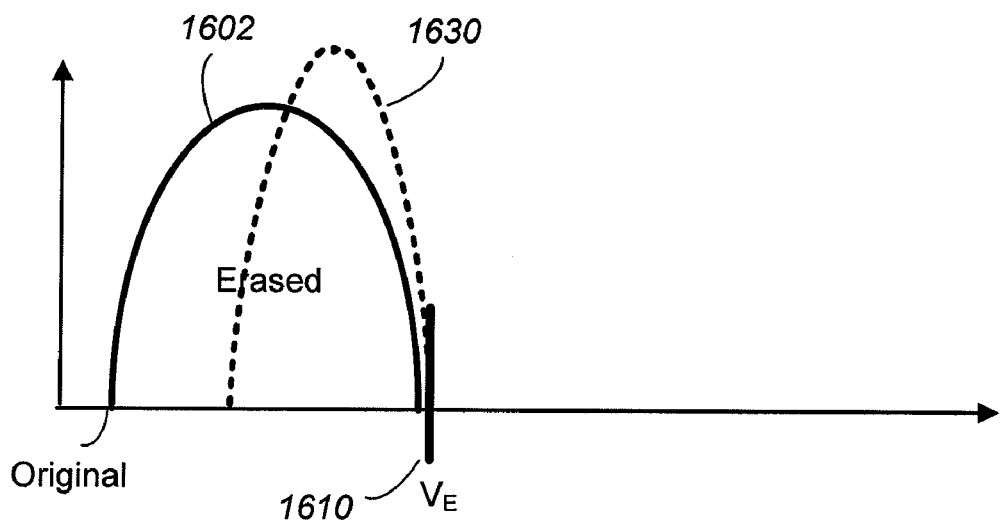
FIG. 44 illustrates the effect of the distribution of erased cells after soft programming with a verify level adjusted to correct for perturbation from all adjacent neighbors.

FIG. 44 illustrates the effect of the distribution of erased cells after soft programming with a verify level adjusted to correct for perturbation from all adjacent neighbors. In this case, the verify level is adjusted as a function of the neighboring cells on both of the adjacent word lines WLn−1 and WLn+1 as well as the neighbors on neighboring bit lines. It can be seen that after soft programming, the erased cells have a threshold distribution 1630 that is tightened relative to the uncorrected distribution shown in FIG. 43 by the left tail of 1602 and the right tail of 1626.

In an alternative embodiment where the BL-BL Yupin effect can be tolerated, only WL-WL Yupin effect is corrected in the adjusting of the offset for the verify level.

In a preferred embodiment, the offset to the verify level is implemented virtually by biasing of one or more of the adjacent word lines similar to that shown in FIG. 38A and FIG. 38B.

Figure 45:
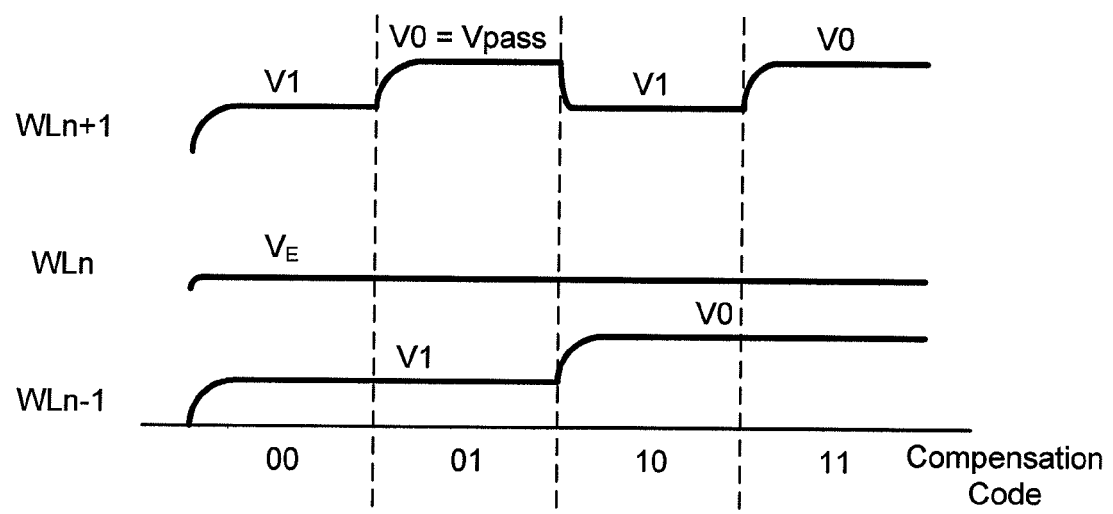
FIG. 45 illustrates the biasing of the adjacent word lines to effect double-sided corrections, according to one preferred embodiment.

FIG. 45 illustrates the biasing of the adjacent word lines to effect double-sided corrections, according to one preferred embodiment. If the erased cells being soft-programmed are on the word line WLn, then the normal verify level $V_E$ is applied to WLn similar to the scheme shown in FIG. 38A. The normal verify level $V_E$ is one that would be used in a normal soft-programming of the erased cells without regard to Yupin effect corrections as described earlier in connection with FIG. 43.

Since there is an adjacent word line on either side of WLn, the preferred implementation is to bias both adjacent word lines. If each adjacent word line is allowed to take on one of two voltages V0 or V1 as denoted by one bit "1" or "0" respectively, then both adjacent word lines would have four possible combinations as denoted by two bits. Each of these combinations presents a different amount of virtual offset to $V_E$ and therefore a corresponding amount of compensation level. As discussed before when the adjacent word line is biased at V0 which has the value Vpass, it is the normal case. On the other hand when the adjacent word line is biased at V1 which is lower than V0, it has the effect of creating a virtual lower offset to $V_E$. Thus, the highest compensation level (00) will be achieved with both adjacent word lines biased at V1. The next lower compensation level (01) will have the adjacent word line WLn+1 at V1 and WLn−1 at V0. Similarly, the least or no compensation level (11) will have both WLn−1 and WLn+1 at V0.

Figure 46:
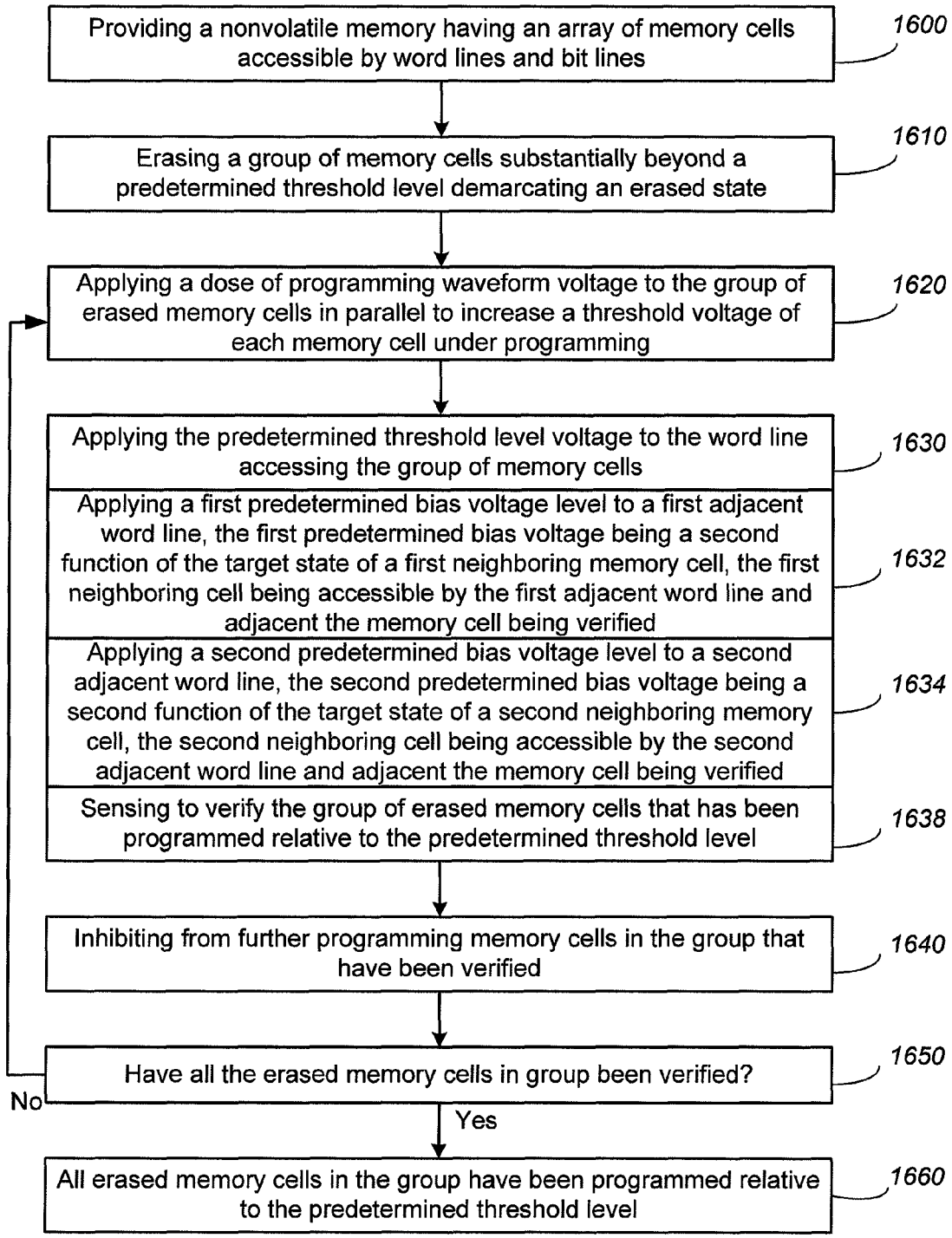
FIG. 46 is a flow diagram of creating a group of memory cells with a well-defined distribution of threshold levels relative to a predetermined threshold level.

FIG. 46 is a flow diagram of creating a group of memory cells with a well-defined distribution of threshold levels relative to a predetermined threshold level.

STEP 1600: Providing a nonvolatile memory having an array of memory cells accessible by word lines and bit lines.

STEP 1610: Erasing a group of memory cells substantially beyond a predetermined threshold level demarcating an erased state.

STEP 1620: Applying a dose of programming waveform voltage to the group of erased memory cells in parallel to increase a threshold voltage of each memory cell under programming.

STEP 1630: Applying the predetermined threshold level voltage to the word line accessing the group of memory cells.

STEP 1632: Applying a first predetermined bias voltage level to a first adjacent word line, the first predetermined bias voltage being a second function of the target state of a first neighboring memory cell, the first neighboring cell being accessible by the first adjacent word line and adjacent the memory cell being verified.

STEP 1634: Applying a second predetermined bias voltage level to a second adjacent word line, the second predetermined bias voltage being a second function of the target state of a second neighboring memory cell, the second neighboring cell being accessible by the second adjacent word line and adjacent the memory cell being verified.

STEP 1638: Sensing to verify the group of erased memory cells that has been programmed relative to the predetermined threshold level.

STEP 1640: Inhibiting from further programming memory cells in the group that have been verified.

STEP 1650: Have all the erased memory cells in group been verified? If so, proceeding to STEP 1660; otherwise, proceeding to STEP 1620.

STEP 1660: All erased memory cells in the group have been programmed relative to the predetermined threshold level.

The various type of non-volatile memory systems described is capable of support memory cells that individually store one to multiple bits of data and are contemplated to be in different digital storage devices and system including removable memory cards and storage devices embedded in circuit boards of other devices.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

The invention claimed is:

1. A method of programming a group of memory cells in parallel with reduced error due to perturbing electric fields from neighboring memory cells, comprising:
   (a) selecting a group of memory cells to be programmed in parallel to a given target state;
   (b) applying a predetermined dose of programming waveform voltage to the group of memory cells in parallel to increase a threshold voltage of each memory cell under programming;
   (c) verifying the programmed states of the group of memory cells relative to the given target state by determining the threshold voltage of the memory cell being verified relative to a predetermined verify level, the predetermined verify level being a function of the given target state and the target states of memory cells neighboring the memory cell being verified;
   (d) inhibiting from further programming memory cells in the group that have been verified; and
   repeating (b) to (d) until the memory cells of the group have all been verified to the given target memory state.

2. The method as in claim 1, wherein the function yields a predetermined verify level for programming a given memory cell to the target state such that the correct target state can still be read from the given memory cell when the neighboring memory cells are programmed after the given memory cell.

3. The method as in claim 1, wherein the memory cells are accessible by word lines and bit lines, and the neighboring memory cells include ones sharing a common word line as the memory cell being verified.

4. The method as in claim 1, wherein the memory cells are accessible by word lines and bit lines, and the neighboring memory cells include ones sharing a common bit line as the memory cell being verified.

5. The method as in claim 1, wherein the memory cells are accessible by word lines and bit lines, and the verifying step further comprises:
   sensing with a voltage given by the predetermined verify level on the word line of the memory cell being verified.

6. The method as in claim 1, wherein the memory cells are accessible by word lines and bit lines, and the verifying step further comprises:
   sensing with a voltage given by a target verify level on the word line of the memory cell being verified, said target verify level being a function of the target state, and with a bias voltage on an adjacent word line, said bias voltage being a function of the target states of memory cells neighboring the memory cell being verified.

7. The method as in claim 5, wherein the predetermined verify level on the word line of the memory cell being verified is a decreasing function of the amount of perturbation from neighboring memory cells.

8. The method as in claim 6, wherein the predetermined verify level on the word line of the memory cell being verified is a decreasing function of the amount of perturbation from neighboring memory cells.

9. In a nonvolatile memory having an array of memory cells accessible by word lines and bit lines, a method of programming a group of memory cells in parallel with reduced error due to perturbing electric fields from neighboring memory cells, comprising:
   (a) designating a group of memory cells to be programmed in parallel to a given target state;
   (b) applying a dose of programming waveform voltage to the group of memory cells in parallel to increase a threshold voltage of each memory cell under programming;
   (c) applying a predetermined verify voltage level to a word line accessing the group of memory cells, the predetermined verify voltage level being a first function of the given target state;
   (d) applying a predetermined bias voltage level to an adjacent word line, the predetermined bias voltage being a second function of target states of memory cells adjacent the memory cell being verified;
   (e) sensing to verify the group of memory cells under programming;
   (f) inhibiting from further programming memory cells in the group that have been verified to have been programmed to the given target state; and
   repeating (b) to (f) until the memory cells of the group have all been verified to be in the given target state.

10. The method as in claim 9, wherein the second function yields a predetermined bias level for verifying so that the programming results in the correct target state being read from a programmed memory cell of the group even when the neighboring memory cells are programmed subsequently.

11. The method as in claim 9, wherein the neighboring memory cells include ones sharing a common word line as the memory cell being verified.

12. The method as in claim 9, wherein the neighboring memory cells include ones sharing a common bit line as the memory cell being verified.

13. The method as in claim 12, wherein the second function is a decreasing function of the amount of perturbation from neighboring memory cells.

14. In a nonvolatile memory having an array of memory cells accessible by word lines and bit lines, a method of erasing a group of memory cells in parallel with reduced error due to perturbing electric fields from neighboring memory cells, comprising:
   (a) erasing a group of memory cells substantially beyond a predetermined threshold level demarcating an erased state;

(b) applying a dose of programming waveform voltage to the group of erased memory cells in parallel to increase a threshold voltage of each memory cell under programming;

(c) applying the predetermined threshold level voltage to the word line accessing the group of memory cells;

(d) applying a first predetermined bias voltage level to a first adjacent word line, the first predetermined bias voltage being a second function of the target state of a first neighboring memory cell adjacent the memory cell being verified, the first neighboring memory cell being accessible by the first adjacent word line;

(e) applying a second predetermined bias voltage level to a second adjacent word line, the second predetermined bias voltage being a second function of the target state of a second neighboring memory cell adjacent the memory cell being verified, the second neighboring memory cell being accessible by the second adjacent word line;

(f) sensing to verify the group of erased memory cells that has been programmed relative to the predetermined threshold level;

(g) inhibiting from further programming memory cells in the group that have been verified; and repeating (b) to (g) until the memory cells of the group have all been verified.

15. A method as in claim 14, wherein the second function yields a predetermined bias level for verifying so that the programming results in the correct target state being read from a memory cell of the group even when the neighboring memory cells are programmed after the memory cell.

16. A method as in claim 14, wherein the neighboring memory cells include ones sharing a common word line as the memory cell being verified.

17. A method as in claim 14, wherein the neighboring memory cells include ones sharing a common bit line as the memory cell being verified.

18. A method as in claim 17, wherein the second function is a decreasing function of the amount of perturbation from neighboring memory cells.

* * * * *